(12) United States Patent
Kakushima et al.

(10) Patent No.: US 12,342,547 B2
(45) Date of Patent: Jun. 24, 2025

(54) NON-VOLATILE FERROELECTRIC STORAGE ELEMENT AND DEVICES COMPRISING THEM

(71) Applicant: Tokyo Institute of Technology, Tokyo (JP)

(72) Inventors: Kuniyuki Kakushima, Tokyo (JP); Hiroshi Funakubo, Tokyo (JP); Shun-Ichiro Ohmi, Tokyo (JP); Joel Molina Reyes, Tokyo (JP); Ichiro Fujiwara, Tokyo (JP); Atsushi Hori, Tokyo (JP); Takao Shimizu, Tokyo (JP); Yoshiko Nakamura, Tokyo (JP); Takanori Mimura, Tokyo (JP)

(73) Assignee: Tokyo Institute of Technology, Tokyo (JP)

( * ) Notice: Subject to any disclaimer, the term of this patent is extended or adjusted under 35 U.S.C. 154(b) by 442 days.

(21) Appl. No.: 17/781,803

(22) PCT Filed: Dec. 4, 2020

(86) PCT No.: PCT/JP2020/045325
§ 371 (c)(1),
(2) Date: Jun. 2, 2022

(87) PCT Pub. No.: WO2021/112247
PCT Pub. Date: Jun. 10, 2021

(65) Prior Publication Data
US 2023/0012093 A1    Jan. 12, 2023

(30) Foreign Application Priority Data
Dec. 4, 2019    (JP) ................................ 2019-219966

(51) Int. Cl.
*H10B 53/00* (2023.01)
*G11C 11/22* (2006.01)
(Continued)

(52) U.S. Cl.
CPC .............. *H10B 53/00* (2023.02); *G11C 11/22* (2013.01); *H10B 10/00* (2023.02); *H10B 41/35* (2023.02); *H10B 51/00* (2023.02)

(58) Field of Classification Search
CPC ........ H10B 53/00; H10B 10/00; H10B 41/35; H10B 51/00; G11C 11/22
(Continued)

(56) References Cited

U.S. PATENT DOCUMENTS

2014/0084410 A1    3/2014    Okigawa
2016/0079164 A1    3/2016    Fukuzumi et al.
(Continued)

FOREIGN PATENT DOCUMENTS

JP    2000-022107 A    1/2000
JP    2006-261329 A    9/2006
(Continued)

OTHER PUBLICATIONS

Böscke et al., "Ferroelectricity in hafnium oxide thin films," Appl. Phys. Lett., 2011, 99:102903, 4 pages.
(Continued)

*Primary Examiner* — Quoc D Hoang
(74) *Attorney, Agent, or Firm* — Foley & Lardner LLP

(57) ABSTRACT

The invention provides a non-volatile storage element and non-volatile storage device employing a ferroelectric material with low power consumption, excellent high reliability, and especially write/erase endurance, which can be mixed with advanced CMOS logic. The non-volatile storage element has at least a first conductive layer, a second conductive layer, and a ferroelectric layer composed of a metal oxide between both conductive layers, with a buffer layer having oxygen ion conductivity situated between the ferroelectric layer and the first conductive layer and/or second conductive layer. An interface layer composed of a single-
(Continued)

layer film or a multilayer film may be also provided between the first conductive layer and the ferroelectric layer, the interface layer as a whole having higher dielectric constant than silicon oxide, and when the buffer layer is present between the first conductive layer and the ferroelectric layer, the interface layer is situated between the first conductive layer and the buffer layer. The non-volatile storage device comprises at least a memory cell array comprising low-power-consumption ferroelectric memory elements formed in a two-dimensional or three-dimensional configuration, and a control circuit. The ferroelectric layer is scalable to 10 nm or smaller and is fabricated at a low temperature of ≤400° C., and is subjected to low temperature thermal annealing treatment at ≤400° C. after the buffer layer has been formed, to provide high reliability.

15 Claims, 29 Drawing Sheets

(51) Int. Cl.
*H10B 10/00* (2023.01)
*H10B 41/35* (2023.01)
*H10B 51/00* (2023.01)

(58) Field of Classification Search
USPC .......................................................... 257/295
See application file for complete search history.

(56) References Cited

U.S. PATENT DOCUMENTS

| 2016/0365133 A1 | 12/2016 | Ino et al. |
| 2019/0088664 A1* | 3/2019 | Kabuyanagi ........... H10B 63/80 |
| 2019/0207009 A1 | 7/2019 | Yamaguchi |
| 2019/0252488 A1 | 8/2019 | Koyanagi et al. |

FOREIGN PATENT DOCUMENTS

| JP | 2016-062901 A | 4/2016 |
| JP | 2019-121633 A | 7/2019 |
| JP | 2019-145790 A | 8/2019 |
| WO | WO-2012/165255 A1 | 12/2012 |
| WO | WO-2015/141625 A1 | 9/2015 |

OTHER PUBLICATIONS

Yamaguchi et al., "Highly Reliable Ferroelectric Hf0.5Zr0.5)s Film with Al Nanoclusters Embedded by Novel Sub-Monolayer Doping Technique," 2018 IEEE (IEDM18-165-168), 4 pages.

* cited by examiner

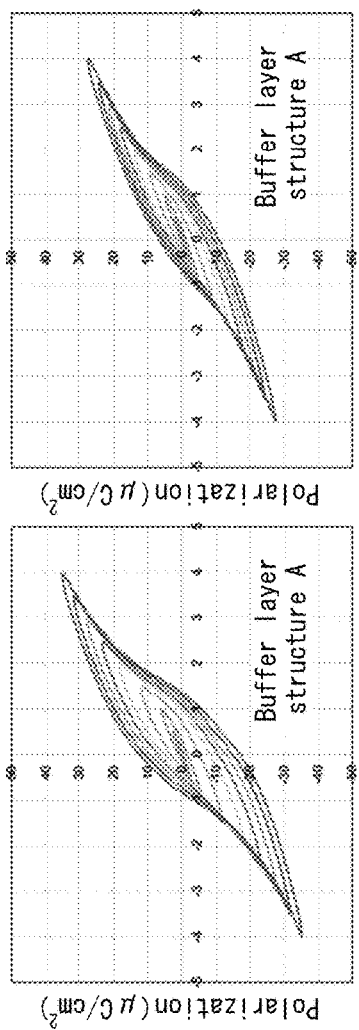
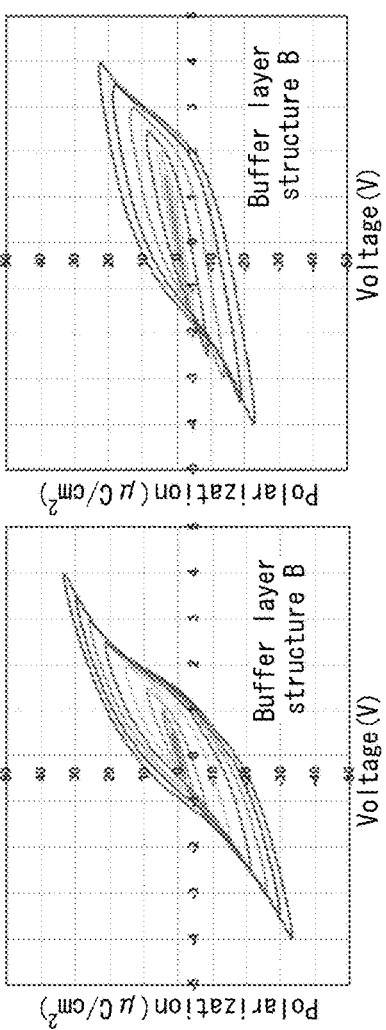
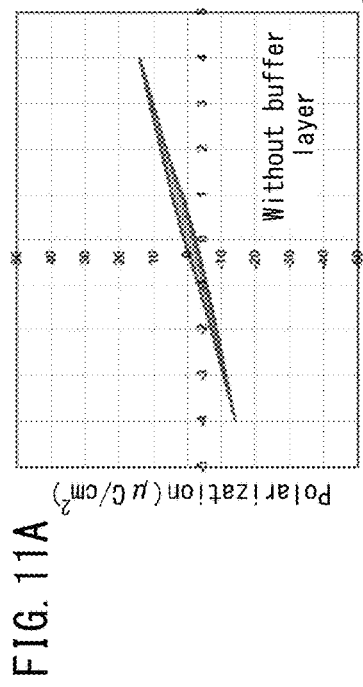
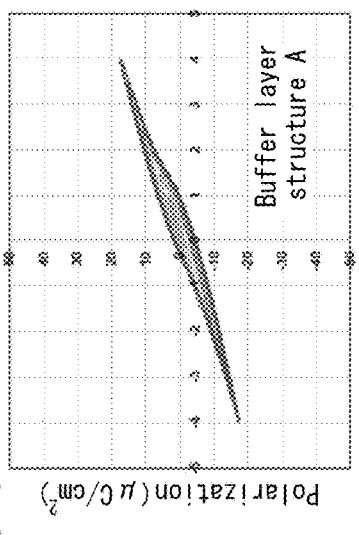
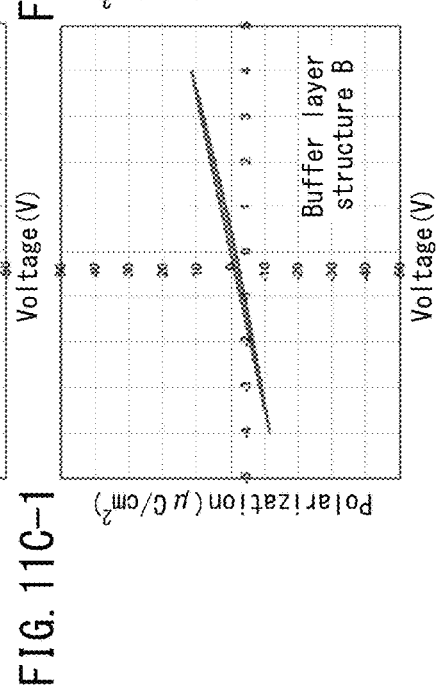

FeRAM write operation        FeRAM read operation

FIG. 33
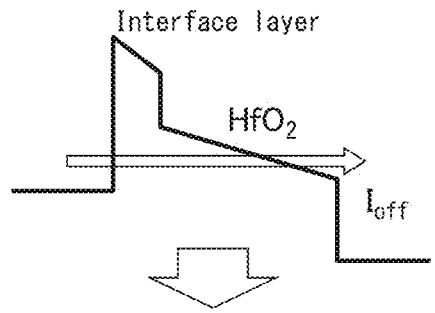
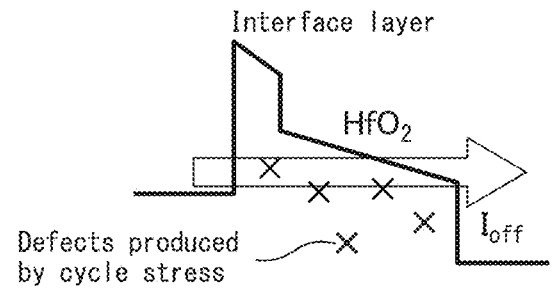
FIG. 34
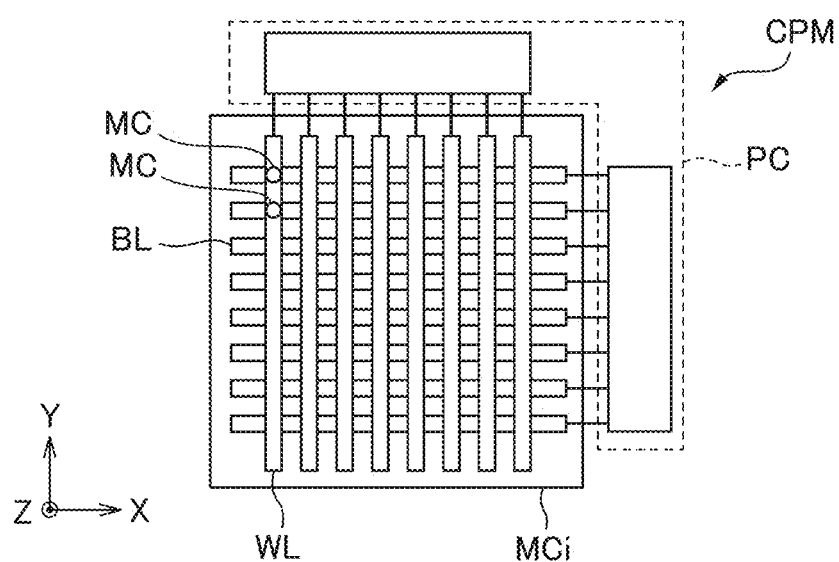

NON-VOLATILE FERROELECTRIC STORAGE ELEMENT AND DEVICES COMPRISING THEM

CROSS-REFERENCE TO RELATED APPLICATIONS

This application is the U.S. National Stage of PCT/JP2020/045325, filed Dec. 4, 2020, which claims priority to JP 2019-219966, filed Dec. 4, 2019.

FIELD

The present invention relates to a non-volatile storage device, and particularly to a non-volatile ferroelectric storage device and a non-volatile ferroelectric storage element, and to a method for their production.

BACKGROUND

Research and development are actively being pursued for IoT/AI edge devices in cloud edge area, in order to deal with future exponential increases in information processing volumes and storage capacities expected in the course of progress toward a "smart society". In light of this situation there is a high demand for non-volatile storage devices with high speed, large volume, low power consumption and high reliability, and particularly for non-volatile memories and non-volatile working memories with low power consumption and high reliability.

Continued scaling of transistors has led to the problem of increased power consumption due to greater leakage current when existing volatile memories such as DRAM and SRAM are in a standby state. In order to reduce the standby power consumption of volatile memories, active efforts are being made in research and development toward replacing volatile memories with non-volatile memories that allow transistor leakage current in the standby state to be minimized.

For embedded non-volatile memories, in particular, in addition to conventional FG (Floating Gate) or MONOS (Metal/Oxide/Nitride/Oxide/Silicon) flash memories, worldwide research is also being carried out using ReRAM (Resistive Random Access Memory), PCRAM (Phase Change Random Access Memory) and MRAM (Magnetic Random Access Memory) as new types of non-volatile memories which merely employ novel materials and have superior levels of scaling based on different operating principles from flash memories.

While in principle the standby current is zero and standby power can be reduced to zero with such novel non-volatile memories, their relatively high operating power for writing of data has arisen as a problem. FeRAM (Ferroelectric Random Access Memory) has also been investigated as a type of non-volatile memory that is expected to exhibit low operating power consumption with voltage driving, even compared to the aforementioned novel non-volatile memories. Ferroelectric memories (FeRAM), which use existing materials such as PZT which make use of ferroelectric material polarization reversal as the operating principle of memory, have been implemented as non-volatile memories with high speed and low power consumption in nodes of 130 nm and greater. However, because of problems comprising difficult handleability of materials such as lead, or difficulty of forming thin films of 100 nm or smaller due to the size effect for exhibiting ferroelectricity, it has been difficult to achieve scaling for generations of 90 nm or smaller. They have therefore been limited in their implementation to small-scale, low-power consumption applications using small-scale memories such as RFID (Radio Frequency Identification) cards.

In light of this situation, a hafnium oxide ($HfO_2$) film has been reported as a ferroelectric material that allows micronized scaling to 90 nm and smaller without containing lead as in PZT materials, and that is able to provide low-voltage operation and low power consumption (NPL 1). Ferroelectric memories using ferroelectric hafnium oxide films were reported in 2011 and researched and developed extensively since then It has been reported that ferroelectricity similar to hafnium oxides is exhibited, with small film thicknesses, by ferroelectric substances and ferroelectric thin-films of, as fluorite-type orthorhombic metal oxides similar to hafnium oxide ferroelectric substances, metal oxides comprising hafnium or zirconium or both, or of such hafnium oxide-type metal oxides which further contain one or more metal elements selected from among aluminum, silicon, strontium, barium and rare earth elements.

Research and development have also been conducted on STTMRAMs as non-volatile working memories to replace volatile memories for lower power consumption of volatile working memories, but these have presented the problem of relatively high electric power for writing of data. This has proven to be a particularly serious problem for improving reliability and especially write/erase endurance for use in non-volatile working memories.

Since hafnium oxide-type non-volatile ferroelectric memories thus exhibit ferroelectricity even as thin-films, they are scalable and are promising as non-volatile ferroelectric memories that are mixable with backends such as CMOS, and yet an issue that remains is how to achieve increased reliability and especially write/erase endurance in order to realize non-volatile working memories with low power consumption that can substitute for existing SRAMs. $Hf_{0.5}Zr_{0.5}O_2$ ferroelectric substance films with Al nanoclusters embedded using sub-single layer doping techniques have been reported as highly reliable hafnium oxide-type ferroelectric memories (NPL 2). However, the write/erase endurance of the ferroelectric substance film described in NPL 1 is on the order of $10^4$ to $10^5$ cycle, and therefore it is still unsatisfactory compared to existing DRAM and SRAM volatile memories.

CITATION LIST

Non Patent Literature

[NPL 1] T. S. Boscke, et al., Appl. Phys. Lett. 99, 112904 (2011)
[NPL 2] T. Yamaguchi et al., "Highly Reliable Ferroelectric $Hf_{0.5}Zr_{0.5}O_2$ Film with Al Nanoclusters Embedded by Novel Sub-Monolayer Doping Technique" 2018 IEEE (IEDM18-165-168)

SUMMARY

Technical Problem

It is an object of the present invention to provide a voltage-driven, non-volatile ferroelectric memory with low-power-consumption, having reliability and especially write/erase endurance allowing it to substitute for existing SRAM and DRAM volatile memories, as well as a method for producing it, and also to provide a non-volatile ferroelectric memory that can be produced even at process temperatures of 400° C. or below, in order to combine with an advanced CMOS, and that has adequate heat resistance at advanced CMOS process temperatures, as well as a low-cost non-volatile ferroelectric memory capable of high-speed operation and a method for producing the same.

Solution to Problem

The present invention provides, in a voltage-driven, non-volatile ferroelectric storage, especially a hafnium oxide-type ferroelectric storage that is scalable and can exhibit ferroelectricity even as a thin-film, a non-volatile memory element and non-volatile memory device that improve the important property of reliability and especially write/erase endurance, as well as a method for fabricating the same.

(Aspect 1)

A non-volatile storage element comprising at least:
a first conductive layer, and
a second conductive layer,
with a ferroelectric layer composed of a metal oxide between the first conductive layer and the second conductive layer,
wherein the non-volatile storage element has between the ferroelectric layer and the first conductive layer and/or second conductive layer a buffer layer of a metal oxide having oxygen ion conductivity and containing a metal with a multiple valency.

(Aspect 2)

The non-volatile storage element according to aspect 1, which has an interface layer composed of a single-layer film or a multilayer film between the first conductive layer and the ferroelectric layer, the interface layer as a whole having a higher dielectric constant than silicon oxide, and when the buffer layer is present between the first conductive layer and the ferroelectric layer, the interface layer is present between the first conductive layer and the buffer layer.

(Aspect 3)

The non-volatile storage element according to aspect 1 or 2, wherein the chemical potential of the oxygen in the buffer layer is greater than the chemical potential of the oxygen in the ferroelectric layer.

(Aspect 4)

The non-volatile storage element according to any one of aspects 1 to 3, wherein the oxygen vacancy defect density of the buffer layer is lower than the oxygen vacancy defect density of the ferroelectric layer.

(Aspect 5)

The non-volatile storage element according to any one of aspects 1 to 4, wherein the buffer layer comprises cerium oxide, zirconium oxide, titanium oxide, yttria-stabilized zirconia or a rare earth element oxide.

(Aspect 6)

The non-volatile storage element according to aspect 5, wherein the buffer layer comprises cerium oxide.

(Aspect 7)

The non-volatile storage element according to any one of aspects 1 to 6, wherein the thickness of the buffer layer is 0.1 nm or greater and preferably 10 nm or smaller.

(Aspect 8)

The non-volatile storage element according to any one of aspects 2 to 7, wherein the interface layer has the function of inhibiting movement of oxygen from the ferroelectric layer to the first conductive layer side.

(Aspect 9)

The non-volatile storage element according to any one of aspects 2 to 8, wherein the interface layer comprises an oxide, metal oxide or silicate, especially yttrium oxide or yttrium silicate, having higher dielectric constant than the dielectric constant of silicon nitride.

(Aspect 10)

The non-volatile storage element according to any one of aspects 1 to 9, wherein the metal of the metal oxide composing the ferroelectric layer, either comprises hafnium (Hf) or zirconium (Zr) or both metals, or comprises hafnium (Hf) or zirconium (Zr) or both metals and one or more metal elements selected from the group consisting of aluminum (Al), silicon (Si), strontium (Sr), barium (Ba) and rare earth elements (Sc, Y, La, Ce, Pr, Nd, Sm, Eu, Gd, Tb, Dy, Ho, Er, Tm, Yb and Lu).

(Aspect 11)

The non-volatile storage element according to any one of aspects 1 to 10, wherein the first conductive layer is a metal silicide or metal disilicide having a fluorite structure, or a metal nitride, or impurity-containing Si or Ge, or an SOI (Silicon on Insulator).

(Aspect 12)

The non-volatile storage element according to any one of aspects 1 to 11, wherein the second conductive layer has a two-layer structure of a barrier metal and a metal nitride, particularly W and TiN, that contacts the buffer layer and inhibits movement of oxygen.

(Aspect 13)

A non-volatile storage device provided with at least:
i) an array in which non-volatile storage elements each comprising at least a first conductive layer, a second conductive layer and a ferroelectric layer composed of a metal oxide between the first conductive layer and the second conductive layer, are arranged in a two-dimensional or three-dimensional manner, and
ii) a control circuit,
wherein the non-volatile storage elements comprise a buffer layer of a metal oxide having oxygen ion conductivity and containing a metal with a multiple valency between the ferroelectric layer and the first conductive layer and/or second conductive layer.

(Aspect 14)

The non-volatile storage device according to aspect 13, which the non-volatile storage elements comprise an interface layer composed of a single-layer film or a multilayer film between the first conductive layer and the ferroelectric layer, the interface layer as a whole having a higher dielectric constant than silicon oxide, and when the buffer layer is present between the first conductive layer and the ferroelectric layer, the interface layer is present between the first conductive layer and the buffer layer.

(Aspect 15)

The non-volatile storage device according to aspect 13 or 14, wherein the buffer layer comprises cerium oxide, zirconium oxide, titanium oxide, yttria-stabilized zirconia or a rare earth element oxide.

(Aspect 16)

The non-volatile storage device according to aspect 15, wherein the buffer layer comprises a cerium oxide film.

(Aspect 17)

The non-volatile storage device according to any one of aspects 14 to 16, wherein the interface layer has the function of inhibiting movement of oxygen from the ferroelectric layer to the first conductive layer side.

(Aspect 18)

The non-volatile storage device according to any one of aspects 14 to 17, wherein the interface layer comprises an oxide, metal oxide or silicate, especially yttrium oxide or yttrium silicate, having higher dielectric constant than the dielectric constant of silicon nitride.

(Aspect 19)

The non-volatile storage device according to any one of aspects 13 to 18, wherein the metal of the metal oxide composing the ferroelectric layer either comprises hafnium (Hf) or zirconium (Zr) or both metals, or comprises hafnium (Hf) or zirconium (Zr) or both metals and one or more metal elements selected from the group consisting of aluminum (Al), silicon (Si), strontium (Sr), barium (Ba) and rare earth elements (Sc, Y, La, Ce, Pr, Nd, Sm, Eu, Gd, Tb, Dy, Ho, Er, Tm, Yb and Lu).

(Aspect 20)

The non-volatile storage device according to any one of aspects 13 to 19, wherein the first conductive layer is a metal silicide or metal disilicide having a fluorite structure, or a metal nitride, or impurity-containing Si or Ge, or an SOI (Silicon on Insulator).

(Aspect 21)

The non-volatile storage device according to any one of aspects 13 to 20, wherein the array is composed of ferroelectric storage cells comprising at least the non-volatile storage element, the ferroelectric storage cells comprising a 1-transistor type, 1-transistor 1-capacitor type, 2-transistor 2-capacitor type, 2-transistor 1-capacitor type, 1-transistor 2-capacitor type or ferroelectric tunnel junction (FTJ) type structure.

(Aspect 22)

The non-volatile storage device according to any one of aspects 13 to 21, wherein the array is composed of a NOR type array, two-dimensional NAND type array, three-dimensional NAND type array or cross-point type array.

(Aspect 23)

The non-volatile storage device according to any one of aspects 13 to 22, wherein the non-volatile storage element is configured as a ferroelectric element unit or array in a backend wiring region situated above a logic circuit, and is connected to part of the logic circuit.

(Aspect 24)

The non-volatile storage device according to aspect 23, wherein a select element is situated in the connection wiring between the non-volatile storage element and logic circuit where the non-volatile storage element and logic circuit are connected.

(Aspect 25)

A method for producing a non-volatile storage element comprising at least:
  a first conductive layer, and
  a second conductive layer,
  with a ferroelectric layer composed of a metal oxide between the first conductive layer and the second conductive layer,
  wherein a buffer layer of a metal oxide having oxygen ion conductivity and comprising a metal with a multiple valency is formed between the ferroelectric layer and the first conductive layer and/or second conductive layer, and
  the ferroelectric layer is formed over the first conductive layer at a temperature of 400° C. or lower, and the ferroelectric layer exhibits ferroelectricity before the second conductive layer is formed over the ferroelectric layer.

(Aspect 26)

The method for producing a non-volatile storage element according to aspect 25, wherein the ferroelectric layer already exhibiting ferroelectricity is subjected to thermal annealing treatment in an inert gas atmosphere at 400° C. or lower.

(Aspect 27)

The method for producing a non-volatile storage element according to aspect 25 or 26, wherein the interface layer, the ferroelectric layer and the buffer layer are continuously formed on the first conductive layer in the same chamber, wherein the buffer layer may be present over and/or below the ferroelectric layer.

(Aspect 28)

The method for producing a non-volatile storage element according to any one of aspects 25 to 27, wherein the ferroelectric layer is formed over the first conductive layer as the lower electrode, by atomic layer deposition (ALD), CVD, sputtering or self-assembly.

(Aspect 29)

A method for operating a non-volatile storage element comprising at least:
  a first conductive layer, and
  a second conductive layer,
  with a ferroelectric layer composed of a metal oxide between the first conductive layer and the second conductive layer,
  wherein a buffer layer of a metal oxide having oxygen ion conductivity and comprising a metal with a multiple valency is situated between the ferroelectric layer and the first conductive layer and/or second conductive layer, and
  the ferroelectric layer is composed of polycrystals having multiple polarization orientations, and the operating voltage of the element is the operating voltage at which the crystals whose components perpendicular to the film surface have the largest orientation undergo polarization reversal.

Advantageous Effects of Invention

The effect of the invention is disclosed in the rest of the present specification and in the drawings, and comprises but is not limited to the following. A non-volatile storage element or storage device is provided with a hafnium oxide-type ferroelectric storage composed of a ferroelectric layer formed between a first conductive layer and second conductive layer on a substrate, wherein a buffer layer of a metal oxide that comprises a metal with a multiple valency and is able to supply oxygen ions, such as $CeO_x$, exists between the ferroelectric layer and the first conductive layer and/or second conductive layer.

Low-temperature-forming ferroelectricity thin-film fabrication techniques allowing process temperatures of 400° C. or lower can form advanced CMOS backend wiring layers and allow mounting to fine CMOS patterns of 90 nm and smaller, which has not been possible with existing ferroelectric memories such as PZT.

With a storage element and storage device of the invention, oxygen defects formed in the ferroelectric layer or at its interface with the electrode by electric field stress during write/erase cycle are supplied with oxygen ions through the buffer layer, repairing the oxygen defects in the ferroelectric layer or at the interface and thus improving the leakage current and ferroelectric film quality, and as a result the write/erase endurance is vastly improved, making possible a write/erase endurance of $10^{11}$ cycle or more, or even $10^{12}$ cycle or more.

In addition, employing a first conductive layer with a fluorite structure which is similar to a hafnium-type ferroelectric layer, such as $NiSi_2$, provides a high-quality ferroelectric layer, and by further inserting an interface layer of Y silicate, Hf silicate, Zr silicate, $Y_2O_3$ or the like with relatively higher dielectric constant than a silicon oxide film between the first conductive layer and ferroelectric layer, it is possible to apply a polarization-reversed electric field to the ferroelectric layer at low voltage, and as a result a characteristic effect is exhibited in which the write/erase endurance is vastly improved with low power consumption.

BRIEF DESCRIPTION OF DRAWINGS

FIGS. 11A to 11C-2 are graphs showing a polarization-electric field hysteresis curve for the non-volatile storage elements of Example 1. FIG. 11A shows a polarization-electric field hysteresis curve for a non-volatile storage element without a buffer layer, FIGS. 11B-1 to 11B-3 show the same for buffer structure A, and FIGS. 11C-1 to 11C-3 show the same for buffer structure B.

FIG. 11A shows the orientation of crystal grains in the ferroelectric layer, FIG. 11B is a graph chart showing change in accumulated charge with respect to applied voltage (operating voltage), and FIG. 11C is a graph showing write/erase endurance based on difference in operating method.

FIGS. 23A and 22B are schematic diagrams showing the operating principle of the 1T-type memory cell of FIG. 22.

FIG. 33 is a diagram illustrating problems involved in write/erase cycle with a tunnel junction element.

FIG. 34 is a conceptual drawing of the cross-point memory of Example 5.

FIGS. 43A and 43B are conceptual drawings of the laminated-type, low-power-consumption, non-volatile LSI chip of Example 6, wherein FIG. 43A shows a two-layer laminated-type comprising an image sensor array and low-power-consumption ferroelectric memory mixed device, and FIG. 43B shows a 3-layer laminated-type comprising an image sensor array, ultra-low-power-consumption non-volatile ferroelectric memory and ultra-low-power-consumption logic.

DESCRIPTION OF EMBODIMENTS

Non-limitative Examples and Embodiments of the invention will now be described with reference to the attached drawings.

Example 1: Ferroelectric Storage Element with Buffer Layer

Example 1 of the invention provides a non-volatile storage element comprising at least a first conductive layer and a second conductive layer, with a ferroelectric layer composed of a metal oxide between the first conductive layer and the second conductive layer, wherein the non-volatile storage element has between the ferroelectric layer and the first conductive layer and/or second conductive layer a buffer layer of a metal oxide having oxygen ion conductivity and comprising a metal with a multiple valency.

In the non-volatile storage element of Example 1 of the invention, the presence of a buffer layer with oxygen ion conductivity between the ferroelectric layer and the first conductive layer and/or second conductive layer (hereunder also referred to simply as "conductive layer"), can reduce leakage current and improve the write/erase endurance. Ferroelectric storage elements using polarization of ferroelectric composed of metal oxides for storage, are driven by voltage and therefore have very low writing current, while such storage elements are also non-volatile allowing them to have low power consumption, but breakthrough in leakage current, and especially reliability or write/erase endurance, mainly attributable to defects, has been an issue to be dealt with. Because ferroelectric storage elements store information by reversal of the ferroelectric polarization of metal oxides, oxygen defects are generated within the ferroelectric layer or at the interface between electric conductor layer and ferroelectric layer due to electric field stress during write/erase cycle, and this has been thought to be one reason for the problem of leakage current, and especially reliability or write/erase endurance. Without being constrained by any particular theory, it is thought that in Example 1 of the present invention, the presence of the buffer layer of a metal oxide having oxygen ion conductivity and comprising a metal with a multiple valency between the ferroelectric layer and the conductive layer causes oxygen ions to be supplied from the buffer layer to the ferroelectric layer or the interface between the electric conductor layer and the ferroelectric layer, limiting the amount of oxygen defects and improving the film quality. It is thought that leakage current is prevented and the reliability and write/erase endurance of the ferroelectric storage element are improved as a result.

Figure 1A:
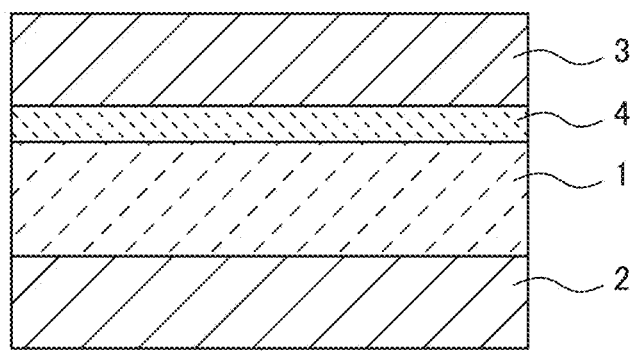
FIGS. 1A, 1B and 1C are cross-sectional diagrams schematically showing examples of the non-volatile storage element of Example 1.
Figure 1B:
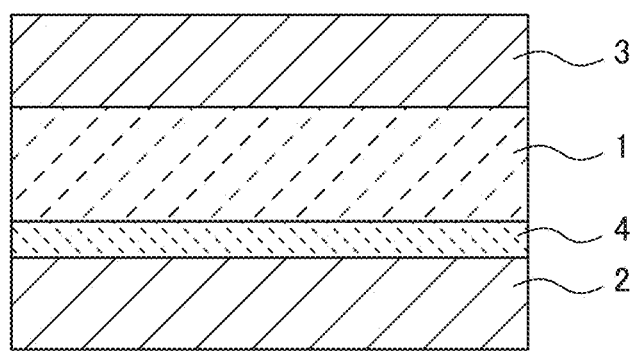
Figure 1C:
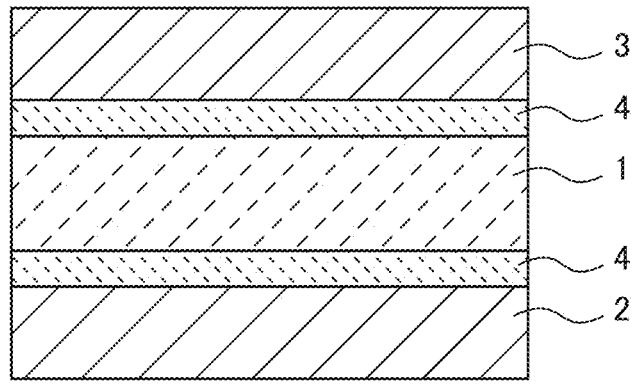

FIGS. 1A, 1B and 1C show schematic cross-sectional diagrams of examples of the non-volatile storage element of Example 1 of the invention. In FIGS. 1A, 1B and 1C, 1 is a ferroelectric layer, 2 is a first conductive layer, 3 is a second conductive layer and 4 is a buffer layer. In FIG. 1A, the buffer layer 4 is between the dielectric layer 1 and the first conductive layer 2, but it may also be between the dielectric layer 1 and second conductive layer 3 as shown in FIG. 1B, or it may be both between the dielectric layer 1 and first conductive layer 2 and between the dielectric layer 1 and second conductive layer 3, as shown in FIG. 1C. In this case, the first conductive layer 2 may be the lower electrode and the second conductive layer 3 may be the upper electrode. However, the first conductive layer 2 may be the upper electrode and the second conductive layer 3 may be the lower electrode instead. The desired function and effect of the invention can be obtained with the location of the buffer layer 4 on either electrode side, and a synergistic effect can be obtained by both.

According to the invention, the ferroelectric layer 1 exhibits ferroelectricity. The ferroelectric substance is a substance wherein the electric dipoles are aligned even without an external electric field, and wherein the orientation of the dipoles can be controlled by an electric field. With a ferroelectric substance, referring to the polarization-electric field hysteresis curve in FIG. 2, applying a voltage +VCC to the electrode as an electric field E produces the positive polarization at point C, and positive polarization A remains (remanent polarization A) even when the electric field E is returned to zero from point C. When a minus electric field E is applied to the ferroelectric substance with remanent polarization A, polarization becomes zero with electric field –B (anti-electric field B), and application of voltage –VCC results in negative polarization at point D. The negative polarization –A remains (remanent polarization A) even after the electric field E has returned to zero from point D. When a positive electric field E is applied to the ferroelectric substance with negative remanent polarization A, polarization becomes zero with positive electric field B (anti-electric field B), and further application of voltage –VCC as electric field E results in positive polarization at point C. Therefore, by applying a larger positive or negative electric field than the anti-electric field B to the ferroelectric substance it is possible to leave a positive and negative polarization (remanent polarization) in the ferroelectric substance even when the electric field has been returned to zero. A ferroelectric substance having positive and negative polarizations exhibits asymmetrical electrical characteristics in the polarization direction, and therefore the alignment orientation of the electric dipoles (positive and negative polarization) can be electrically read out from an external device. When ferroelectricity is used to configure a storage element, the positive and negative polarization are conserved even when no electric field is being applied, thus allowing construction of a non-volatile storage element which allows power consumption to be reduced. It is also a voltage driven type, in which write/erase cycle of the ferroelectric storage element is driven by application of voltage. Consequently, the writing current of a ferroelectric storage element is very low compared to other emerging current-driven memories which are driven using current, and as a result the power consumption during writing operation can be reduced.

According to the invention, the ferroelectric layer 1 is a ferroelectric layer composed of a metal oxide. The ferroelectric layer 1 is preferably composed of a ferroelectric substance composed of a metal oxide of a fluorite-type orthorhombic phase. A metal oxide which comprises hafnium (Hf), zirconium (Zr), cerium (Ce) or two or more thereof, preferably hafnium (Hf), zirconium (Zr) or both, is suitable because it can form a ferroelectric substance exhibiting a fluorite-type orthorhombic phase when either doped or non-doped. Even when non-doped, it is possible to form a ferroelectric substance depending on the conditions of formation or production. More suitable is a metal oxide that comprises hafnium (Hf), zirconium (Zr), cerium (Ce) or two or more thereof, preferably hafnium (Hf), zirconium (Zr) or both, and at least one metal element (additional metal) selected from the group consisting of aluminum (Al), silicon (Si), strontium (Sr), barium (Ba) and rare earth elements (Sc, Y, La, Ce, Pr, Nd, Sm, Eu, Gd, Tb, Dy, Ho, Er, Tm, Yb and Lu). A metal oxide that comprises hafnium, zirconium or cerium and optionally comprises such an additional metal as above is referred to as a "hafnium-type metal oxide" (or hafnium oxide-type metal oxide). Since a hafnium-type metal oxide ferroelectric substance, in particular, exhibits excellent ferroelectric properties even as a thin-film of 10 nm or smaller, it is scalable as a ferroelectric storage element and allows high densification of storage arrays, while also being formable at temperatures of 400° C. or lower and even lower than 300° C., or 200° C. or lower, and with a thermal history, thus providing an effect which allows them to be combined with advanced logic devices such as CMOS.

The main metal oxide in the hafnium-type metal oxide may be a simple oxide such as hafnium oxide, zirconium oxide or cerium oxide, or a solid solution of such metal oxides. When the hafnium-type metal oxide comprises an additional metal, the amount of the additional metal will depend on the type of main metal oxide and additional metal but may be an amount that forms a ferroelectric substance, and generally the number of moles of the additional metal is preferably 10 mol % or lower, more preferably 0.1 to 10% or even 4 to 9 mol %, with 100 mol % as the total of the metals of all of the metal oxides comprising the additional metal. If the amount of additional metal is too low the fluorite structure having a monoclinic phase may be stabilized, while if the amount of additional metal is too high the fluorite structure having a tetragonal phase or cubic phase may be stabilized, potentially resulting in a non-ferroelectric substance. For example, typical hafnium-type ferroelectric materials are Y-doped $HfO_2$, Si-doped $HfO_2$, Al-doped $HfO_2$, La-doped $HfO_2$ and HZO ($Hf_{0.5}Zr_{0.5}O_2$).

It is sufficient if the ferroelectric layer 1 is composed of crystals exhibiting ferroelectricity, and it may be composed of polycrystals or may be a uniaxial oriented crystal thin-film or even an epitaxial film. A uniaxially oriented layer is one in which, when another crystal film is grown on the crystal substrate, growth occurs with essential alignment of one crystal axis by the crystals of the crystal film and crystal substrate, while an epitaxial layer is one in which growth occurs with essential alignment of two crystal axes by the crystals. It is possible to form a "local epitaxial growth" layer in which epitaxial growth occurs with each crystal grains, or a single crystal epitaxial layer in which the epitaxially grown crystal grains have substantial sizes. A "uniaxially oriented crystal layer" originally refers to the orientation of crystals in relation to the crystal base, but "uniaxial orientation" may also refer to the crystal orientation of the crystal layer alone that has separated from the crystal substrate, based on the characteristic crystal orientation of the obtained uniaxially oriented crystal layer.

The film thickness of the ferroelectric layer 1 may be any thickness that is suitable for the intended use of the non-volatile storage element, and it is not particularly restricted but may be 1 nm or greater, 5 nm or greater or 10 nm or greater, for example. There is no particular upper limit, but it may be 5 μm or smaller, 3 μm or smaller or 1 μm or smaller, for example. According to a preferred aspect of the invention, the film thickness of the ferroelectric layer 1 may be 1 nm to 100 nm, more preferably 2 nm to 50 nm, or even 3 nm to 20 nm or 3 nm to 10 nm. The aforementioned hafnium-type metal oxide exhibits more excellent ferroelectricity even as a thin film of 20 nm or smaller, compared to conventional ferroelectric substances such as PZT, and it is therefore suitably scalable as a ferroelectric layer for a non-volatile storage element.

Figure 3:
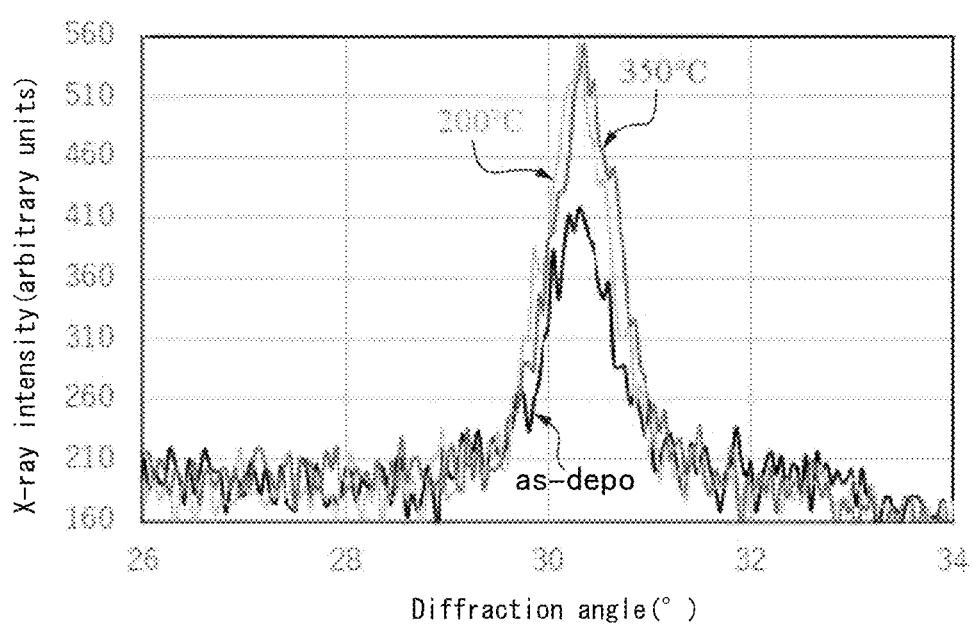
FIG. 3 is an X-ray diffraction analysis chart for a Y7%-$HfO_2$ layer as a ferroelectric layer in the non-volatile storage element of Example 1.

FIG. 3 shows a chart obtained by X-ray diffraction analysis of a Y7%-$HfO_2$ layer, after sputter deposition on a $NiSi_2$ substrate at room temperature, after 200° C. annealing, and after 350° C. annealing, as examples of the ferroelectric layer 1. FIG. 3 confirms that all of the Y7%-$HfO_2$ thin-films had a single diffraction peak observed near 30°, and were fluorite-type orthorhombic crystalline ferroelectric substances (see FIG. 5).

The first conductive layer 2 and second conductive layer 3 function as electrodes for application of voltage to the ferroelectric layer 1, and they may comprise metal, conductive ceramics or conductive semiconductors. The metals may be tungsten, titanium, gold, silver, copper, platinum, aluminum and the like, the conductive ceramics may be conductive silicides such as nickel disilicide ($NiSi_2$), conductive nitrides such as titanium nitride (TiN), conductive oxides such as indium-tin oxide (ITO), and pyrochlore structures such as $Bi_2Ru_2O_7$, $R_2Ru_2O_7$ (where R is a rare earth element), $Bi_2Ir_2O_7$ and rare earth iridium oxides $R_2Ir_2O_7$ (where R is a rare earth element), and the like. Doped or intrinsic silicon semiconductors, and various compound semiconductors, may be mentioned as the conductive semiconductors. The first conductive layer 2 and second conductive layer 3 may be electrically connected to the ferroelectric layer 1. The conductive layer (upper electrode) formed on the ferroelectric layer 1 is preferably a multilayer electrode of tungsten, TiN and TiN/W.

According to a preferred embodiment, the first conductive layer 2 and second conductive layer 3 may have a barrier layer of a conductive material with an oxygen barrier property that inhibits movement of oxygen, such as tungsten (W), formed on the interface side with the ferroelectric layer 1, and particularly on the interface side of the second conductive layer 3 with the ferroelectric layer 1 when the second conductive layer (upper electrode) 3 has been formed on the ferroelectric layer 1. If the first conductive layer 2 and second conductive layer 3 have an oxygen barrier layer, this will provide an effect of inhibiting generation of oxygen defects by diffusion and leakage of oxygen ions from the buffer layer and ferroelectric layer 1, as well as an effect of preventing leakage current and improving the performance of the non-volatile storage element of the invention. The thickness of the barrier layer is preferably 0.1 nm or greater, and even more preferably 0.5 nm or greater, 1 nm or greater or 1.5 nm or greater. The film thickness of the buffer layer 4 is also preferably 10 nm or smaller, and more preferably 6 nm or smaller, 5 nm or smaller, 4 nm or smaller or 3 nm or smaller. The second conductive layer preferably has a two-layer structure of a barrier metal and a metal nitride, particularly W and TiN, that is connected with the buffer layer and inhibits movement of oxygen.

When the first conductive layer 2 is a lower electrode as a substrate on which the ferroelectric layer 1 is deposited, it is preferably a conductive layer with a fluorite structure, for example, a metal silicide or a metal disilicide, such as nickel disilicide ($NiSi_2$). If the first conductive layer to serve as the substrate is a metal silicide or a metal disilicide such as nickel disilicide ($NiSi_2$), the crystal quality of the hafnium-type metal oxide deposited on it will be excellent, thus allowing excellent properties to be exhibited by the ferroelectric layer and ferroelectric layer interface. It may also be a nitride electrode such as TiN in the case of a two-terminal cell such as a capacitor, or a conductive layer of an impurity-doped semiconductor layer of Si or the like in the case of a 1-transistor cell.

In the non-volatile storage element of the invention, a buffer layer of a metal oxide 4 having oxygen ion conductivity and comprising a metal with multiple valency is present between the ferroelectric layer 1 and the first conductive layer 2 and/or second conductive layer 3. Here there is no difference between the first conductive layer 2 and the second conductive layer 3, or in other words, the buffer layer 4 is present between at least one of the two conductive layers and the ferroelectric layer 1. The buffer layer 4 is preferably present in direct contact with the ferroelectric layer 1.

The buffer layer 4 is made of a normal dielectric material (normally dielectric or paraelectric material; insulator material) which is a metal oxide exhibiting oxygen ion conductivity and comprising a metal with multiple valency.

Although the buffer layer 4 is a normal dielectric material (insulator material), it has oxygen ion conductivity. The buffer layer 4 is composed of a metal oxide that comprises a metal with multiple valency. By being composed of a metal oxide exhibiting oxygen ion conductivity and comprising a metal with multiple valency, it can donate and accept, and particularly donate, oxygen to the ferroelectric layer 1, providing a function of preventing or repairing oxygen defects caused by electric field stress during write/erase cycle in the ferroelectric layer 1 or at the interface between the ferroelectric layer 1 and the conductive layer, thereby reducing leakage current and improving the ferroelectric property, making it possible to reduce the anti-electric field and to exhibit an excellent effect of improving the write/erase cycle property. According to the invention, the buffer layer 4 must exhibit oxygen ion conductivity in order to prevent or repair oxygen defects, and if it is a metal oxide comprising a metal with multiple valency it will be able to exhibit excellent oxygen ion conductivity for this purpose.

The chemical potential of the oxygen in the buffer layer 4 is preferably greater than the chemical potential of the oxygen in the ferroelectric layer 1. If the chemical potential of the oxygen in the buffer layer 4 is greater than the chemical potential of the oxygen in the ferroelectric layer 1, then oxygen ions will easily migrate from the buffer layer 4 into the ferroelectric layer 1 by diffusion or drifting, thereby allowing the amount of oxygen defects in the ferroelectric layer 1 or at the interface between the ferroelectric layer 1 and conductive layer to be controlled.

The chemical potential of the oxygen in the buffer layer or ferroelectric layer is dependent on the material, and is either known or can be determined by calculation using a theoretical method such as the molecular orbital method or the first principle. It is established for the purpose of the invention that when the buffer layer has a greater oxygen chemical potential than the ferroelectric layer, oxygen ions can move from the buffer layer to the ferroelectric layer by diffusion, drifting or another principle. In such cases, the valence of the metal element with multiple valency composing the buffer layer changes in the direction in which oxygen ions are supplied.

The oxygen vacancy defect density of the buffer layer 4 is preferably lower than the oxygen vacancy defect density of the ferroelectric layer 1. If the oxygen vacancy defect density of the buffer layer 4 is lower than the oxygen vacancy defect density of the ferroelectric layer 1, then oxygen ions will easily migrate from the buffer layer 4 into the ferroelectric layer 1 by diffusion, drifting or another principle, thereby allowing oxygen defects in the ferroelectric layer 1 or at the interface between the ferroelectric layer 1 and conductive layer to be prevented or repaired.

The oxygen vacancy defect density of the buffer layer or the ferroelectric layer can be measured, for example, by Electron Energy-Loss Spectroscopy (EELS) using an image obtained by Transmission Electron Microscopy (TEM). Since oxygen deficiency causes deviation from the stoichiometric composition commensurate with the degree of oxygen deficiency, the oxygen vacancy defect density can be measured by Glow Discharge Spectroscopy (GDS) in which, for example, a sample surface is subjected to sputtering in the depthwise direction under glow discharge for ionization and then mass spectrometry is conducted for compositional analysis in the depthwise direction. The oxygen vacancy defect density can also be evaluated using a non-Rutherford elasticity resonance scattering method or laser Raman spectroscopy method.

The normal dielectric material (insulator material) of the buffer layer 4, which is a metal oxide that exhibits oxygen ion conductivity and comprises a metal with multiple valency, may be a cerium oxide film ($CeO_x$ ($x=1.5$-$2.0$, preferably 1.6-2.0, more preferably 1.7-2.0 and most preferably 1.8-2.0)), or a zirconium oxide film, titanium oxide film, yttria-stabilized zirconia film or rare earth element oxide film. Particularly when the ferroelectric layer 1 exhibits ferroelectricity as a hafnium oxide film, zirconium oxide film (Zr) or hafnium/zirconium oxide, or any of these doped with aluminum (Al), silicon (Si), yttrium (Y), strontium (Sr), barium (Ba) or the like, the buffer layer 4 is preferably a cerium oxide film ($CeO_x$ ($x=1.5$-$2.0$, preferably 1.6-2.0, more preferably 1.7-2.0 and most preferably 1.8-2.0)). A cerium oxide film as the buffer layer 4 is a normal dielectric material.

The thickness of the buffer layer 4 is preferably 0.1 nm or greater, and even more preferably 0.5 nm or greater, 1 nm or greater or 1.5 nm or greater. The film thickness of the buffer layer 4 is also preferably 10 nm or smaller, and more preferably 6 nm or smaller, 5 nm or smaller, 4 nm or smaller or 3 nm or smaller. The buffer layer 4 may have any layer thickness allowing oxygen ions to be supplied in the ferroelectric layer 1, but the buffer layer 4, being made of an insulator material, preferably has a layer thickness that does not significantly impair the conductivity.

After forming the ferroelectric layer 1 and buffer layer 4, it may be subjected to activation annealing (AA) treatment at 400° C. or lower, which will improve the properties of the ferroelectric layer 1 and non-volatile storage element. The activation annealing treatment after formation of the buffer layer 4 may be either before or after forming an electrode on the formed buffer layer 4, though according to one preferred embodiment it is before forming an electrode on the buffer layer 4, and according to another preferred embodiment it is after an electrode has been formed on the buffer layer 4.

In the non-volatile storage element of Example 1 of the invention, inserting the buffer layer 4 between the ferroelectric layer 1 and the first conductive layer 2 and/or second conductive layer 3 will decrease leakage current, and in particular it has been confirmed that the writing properties (write/erase endurance) of the non-volatile storage element can be improved to $10^{11}$ cycle or more, or even $10^{12}$ cycle or more. The presence of the buffer layer 4 has also been confirmed to exhibit an effect of reducing leakage current, an effect of increasing write/erase endurance and an effect of improving room temperature data retention.

It was found that in the non-volatile storage element of Example 1 of the invention, the ferroelectric layer 1 can have two or more orientations with different orientation angles (orientation I with a small orientation angle and orientation II with a large orientation angle), that not only can both orientation I and orientation II be switched by increasing the applied voltage (operating voltage) but orientation I alone can be switched by lowering the applied voltage (operating voltage), and that switching orientation I alone can improve the write/erase endurance for write/erase cycle compared to switching both orientation I and orientation II. The two orientations I and II represent at least two different orientations, but there may also be 3 or more orientations that are distributed.

The presence of orientation I and orientation II can be confirmed by the presence of two peaks in the curve representing accumulated charge Q for applied voltage (operating voltage) V, and by the ability to resolve the two peaks into two independent peaks in waveform analysis, and the orientation angle of crystal grains in the ferroelectric layer can be estimated from the resolved waveforms for orientation I and orientation II, the orientation angle θ for orientation I which has the peak at low applied voltage (operating voltage) being smaller than the angle for orientation II which has the peak at high applied voltage. The orientation angle θ is defined as the angle of the orientation axis with respect to the direction perpendicular to the film surface of the ferroelectric layer (see FIG. 13A). Orientation I alone can be switched by using a voltage that cannot switch the crystal grains with orientation II but can switch the crystal grains with orientation I. In this case, orientation I and orientation II do not refer to a group of crystal grains having exactly the same orientation angle θ, but rather, as shown in FIG. 13B, refer to an aggregate of a group of crystal grains having a peak distribution (normal distribution) with a peak at a specific orientation angle θ and shoulders on both sides of the orientation angle θ. (Not an aggregate of physically united crystal grains in the ferroelectric layer but rather a theoretical aggregate based on the orientation angle distribution among crystal grains that may be dispersed in the ferroelectric layer).

In a method of operating a ferroelectric capacitor element which switches orientation I alone, therefore, endurance (write/erase endurance) is improved compared to an operating method in which orientation II (and orientation I) are switched. Thus, according to the invention there is provided a method for operating a non-volatile storage element which is a ferroelectric capacitor element having a buffer layer of the invention, wherein when the ferroelectric layer 1 is composed of polycrystals, it has different first and second orientations with different orientation angles, of which only the first orientation having the smaller orientation angle of the ferroelectric layer is switched as operating voltage. Needless to mention, the operating method of the invention can also be applied when the ferroelectric layer 1 is composed of polycrystals having two or more peaks. When three or more different orientation distributions are present, focusing on one orientation having a peak with lower applied voltage (operating voltage) compared to any other orientation, and preferably the orientation having a peak with the lowest applied voltage (operating voltage) (the orientation with the largest component perpendicular to the film surface), if the element is driven with the low applied voltage (operating voltage), then it is possible to improve the write/erase endurance for write/erase cycle, compared to driving all of the orientations.

Figure 4:
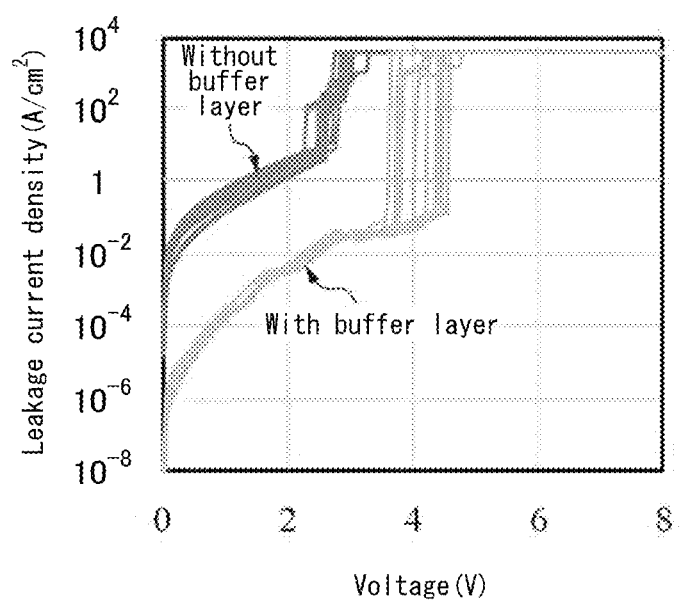
FIG. 4 is a graph showing the current-voltage characteristic of the non-volatile storage element of Example 1.

Examples of the electrical characteristics of the non-volatile storage element of Example 1 of the invention are shown in FIGS. 4 to 9. FIG. 4 shows the current-voltage characteristic for a ferroelectric element (ferroelectric capacitor), evaluating the presence or absence of a buffer layer as the parameter using a microcurrent meter. Inserting a buffer layer reduces the leakage current for the same voltage, and increases the breakdown voltage of the element. Since defective current components flowing through defects in a ferroelectric element contribute significantly to leakage current, inserting a buffer layer is assumed to reduce the defect density before application of data write/erase stress. Increased breakdown voltage of the reliability results in higher withstand voltage of the element, suggesting improved reliability of the element.

Figure 5:
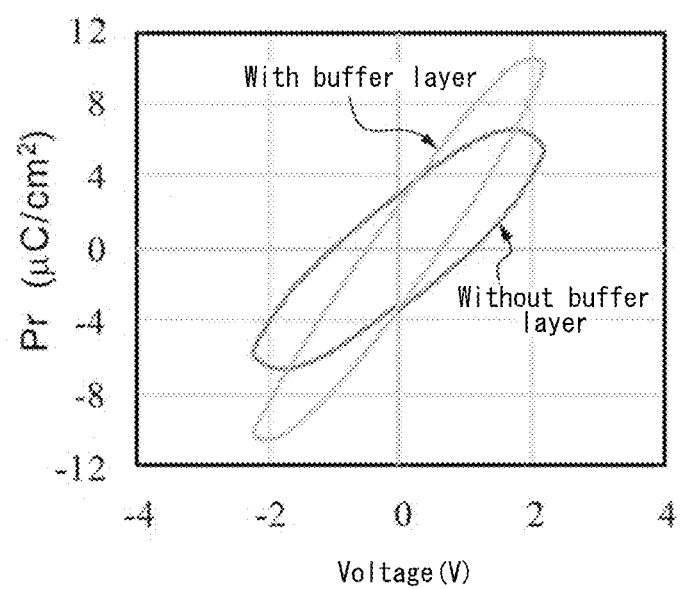
FIG. 5 shows the Y7%-$HfO_2$ layer of Example 1 as a ferroelectric layer.

FIG. 5 shows hysteresis property with the presence or absence of a buffer layer in the ferroelectric element as the parameter. Shown here is the ferroelectricity of a Y7%-HfO$_2$ ferroelectric layer 1. Inserting a buffer layer also improves the ferroelectric property and especially reduces the antielectric field, improving the hysteresis property. In the ferroelectric layer 1 of this Example, a room temperature-forming Y7%-HfO$_2$ layer is used, forming CeO$_x$ (x=1.5 to 2.0) in the next step, forming an upper electrode, and then carrying out annealing treatment (activation annealing).

Figure 6:
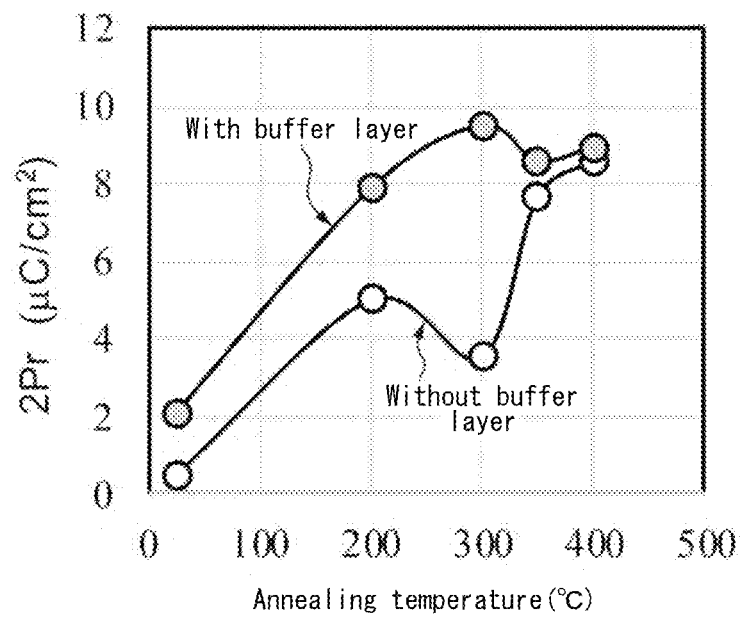
FIG. 6 is a graph showing the annealing temperature-dependence of spontaneous polarization with the non-volatile storage element of Example 1.

FIG. 6 shows temperature dependence of activation annealing in the spontaneous polarization Pr width (2Pr). With low temperature activation annealing treatment at 200 to 350° C., spontaneous polarization increased compared to an as-depo ferroelectric element, indicating the effectiveness of activation annealing treatment (see FIG. 20).

Figure 7:
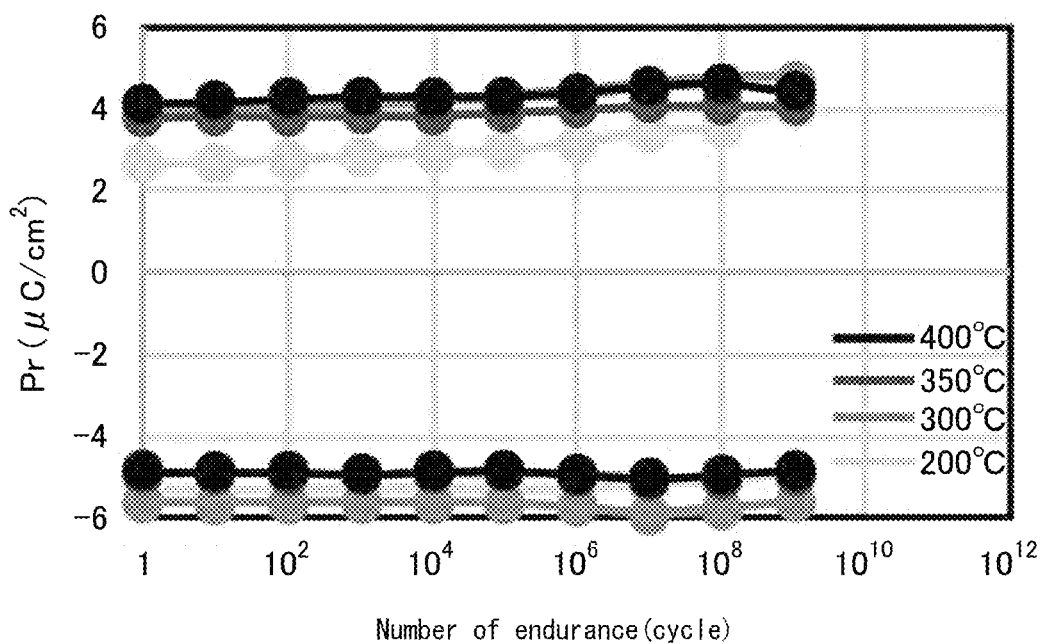
FIG. 7 shows the low-temperature annealing temperature-dependence of write/erase endurance of the non-volatile storage element of Example 1.

FIG. 7 shows activation annealing (AA) temperature dependence of the write/erase cycle property of a ferroelectric capacitor element (write/erase endurance dependence for 2Pr window width), measured with a voltage of 2.5 V, 1 MHz. When the AA temperature was increased from 200° C. to 400° C., the Pr window was mostly constant up to 109 cycle as the write/erase endurance between 300° C. to 400° C. compared to 200° C., indicating stable satisfactory properties with no narrowing.

Figure 8:
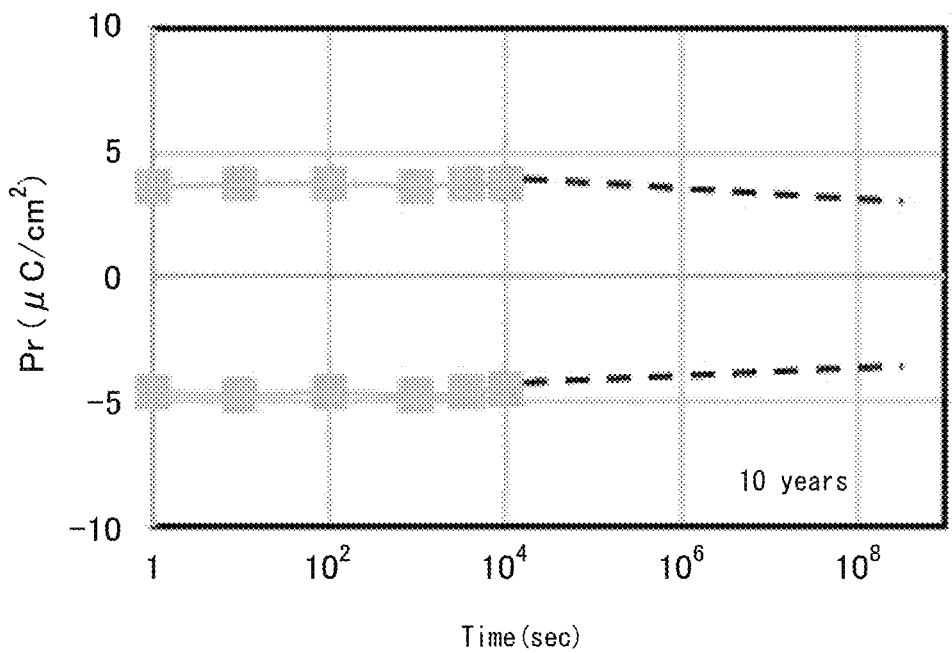
FIG. 8 shows the room-temperature data storage characteristic of the non-volatile storage element of Example 1 after $10^4$ cycle.

FIG. 8 shows the room-temperature data storage characteristic after $10^4$ cycle at a voltage of 2.5 V. The Pr window width was essentially stable with respect to the retention time, and the data retention characteristic was also superior.

Figure 9:
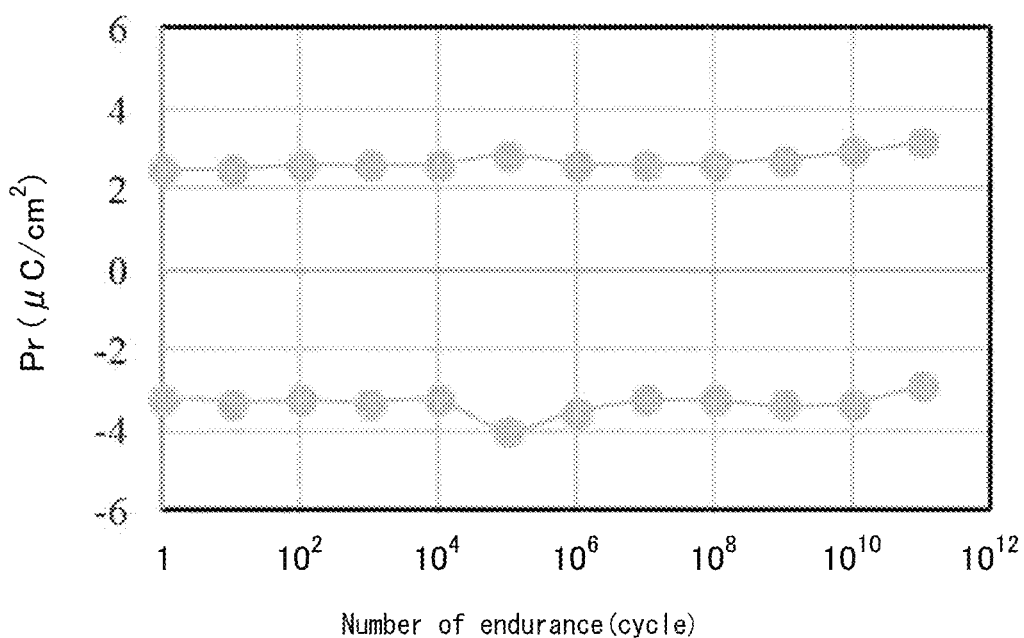
FIG. 9 is a graph showing the write/erase endurance of the non-volatile storage element of Example 1.

FIG. 9 shows write/erase endurance at a voltage of 2.2 V, 2 MHz. No narrowing of the Pr window was observed, and a stable write/erase cycle property was obtained, with write/erase endurance of $\geq 10^{11}$ cycle.

Buffer layer structure A was defined as the presence of a buffer layer between the second conductive layer (upper electrode) and ferroelectric layer, and buffer layer structure B was defined as presence of the same between the first conductive layer (lower electrode) and ferroelectric layer. The present invention was demonstrated to be functionally effective for improving and increasing reliability, and especially write/erase endurance for a ferroelectric non-volatile storage element, both with buffer layer structure A and with buffer layer structure B.

Figure 10A:
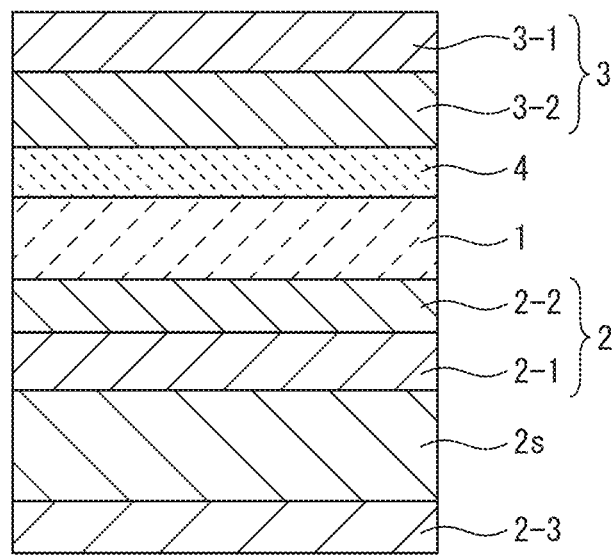
FIGS. 10A and 10B are schematic cross-sectional views showing examples of the non-volatile storage element of Example 1.
Figure 10B:
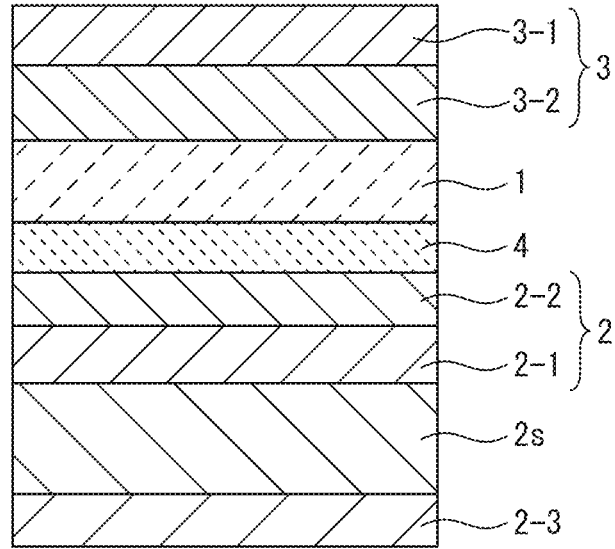

FIGS. 10A and 10B show structural examples of the non-volatile storage element (ferroelectric capacitor element) of Example 1. The buffer layer structure A shown in FIG. 10A is a non-volatile storage element having a buffer layer 4 between the ferroelectric layer 1 and the second conductive layer (upper electrode) 3, and the buffer layer structure B shown in FIG. 10B is a non-volatile storage element having the buffer layer 4 between the first conductive layer (lower electrode) 2 and the ferroelectric layer 1. In both cases, the ferroelectric layer 1 is a layer composed of 5% yttrium, hafnium-doped oxide (Y:HfO$_2$) with a film thickness of 7.5 nm, and the buffer layer 4 is a layer composed of CeO$_x$ with a film thickness of 1 nm. The lower electrode 2 is a multilayer film comprising a titanium (Ti) layer 2-1 with a film thickness of 5 nm and a tungsten (W) layer 2-2 with a film thickness of 10 nm.

The upper electrode 3 is a multilayer film comprising a tungsten (W) layer 3-2 with a film thickness of 30 nm and a titanium nitride (TiN) layer 3-1 with a film thickness of 10 nm. As explained below, the lower electrode 2 and upper electrode 3 can be formed by sputtering, and the ferroelectric layer 1 and buffer layer 4 can be formed by atomic layer deposition (ALD). Electrode formation may be followed by activation annealing. The materials and film thicknesses of each of the layers are merely examples and are not intended to be restrictive.

FIG. 11 shows the voltage-polarization hysteresis property of the non-volatile storage elements of Example 1 having a buffer layer structure A and buffer structure B as shown in FIGS. 10A and 10B, in comparison with the voltage-polarization hysteresis property of a corresponding non-volatile storage element without a buffer layer. The film thickness of the buffer (CeO$_x$) layer 4 was changed to 0.6 nm, 1 nm and 2 nm. FIG. 11A shows the hysteresis property for a non-volatile storage element without a buffer layer (control example), FIGS. 11B-1, 11B-2 and 11B-3 show hysteresis properties for non-volatile storage elements with a buffer (CeO$_x$) layer on the upper electrode side (second conductive layer 3 side in FIG. 1), FIGS. 11C-1, 11C-2 and 11C-3 show hysteresis properties for ferroelectric capacitor elements with a buffer (CeO$_x$) layer on the upper electrode side (first conductive layer 2 side in FIG. 1), and FIGS. 11B-1 and 11C-1, FIGS. 11B-2 and 11C-2 and FIGS. 11B-3 and 11C-3 show hysteresis properties for non-volatile storage elements with buffer (CeO$_x$) layer thickness of 0.6 nm, buffer (CeO$_x$) layer thickness of 1 nm and buffer (CeO$_x$) layer thickness of 2 nm, respectively. In all of the examples shown, post annealing was carried out at 500° C. for 1 minute after forming the upper electrode, for activation of the non-volatile storage element. It is seen that the ferroelectric capacitor elements of Example 1 exhibited a satisfactory voltage-polarization hysteresis property as a non-volatile storage element when the film thickness was 1 nm or greater, whether the buffer layer of the metal oxide 4 having oxygen ion conductivity and comprising a metal with a multiple valency was on the second conductive layer 3 side or the first conductive layer 2 side of the ferroelectric layer 1.

Figure 2:
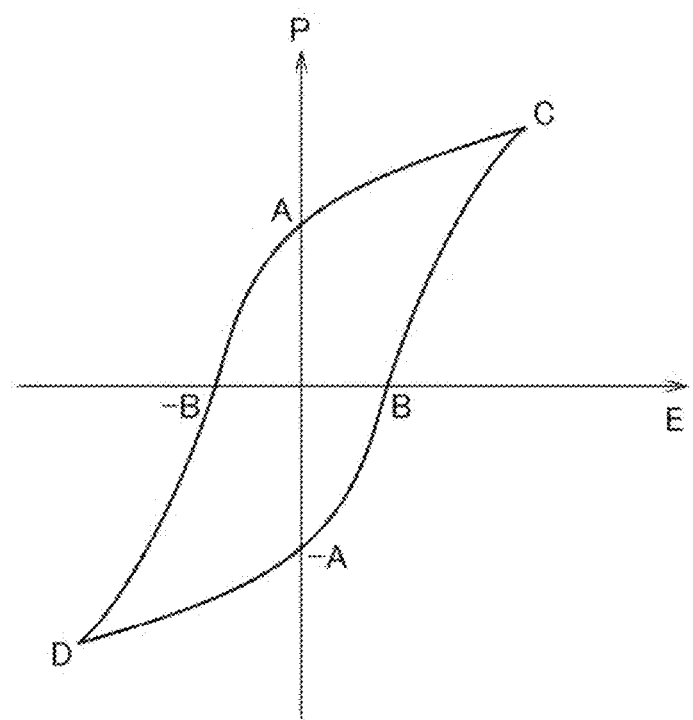
FIG. 2 is a graph showing a polarization-electric field hysteresis curve for the non-volatile storage element of Example 1.
Figure 12:
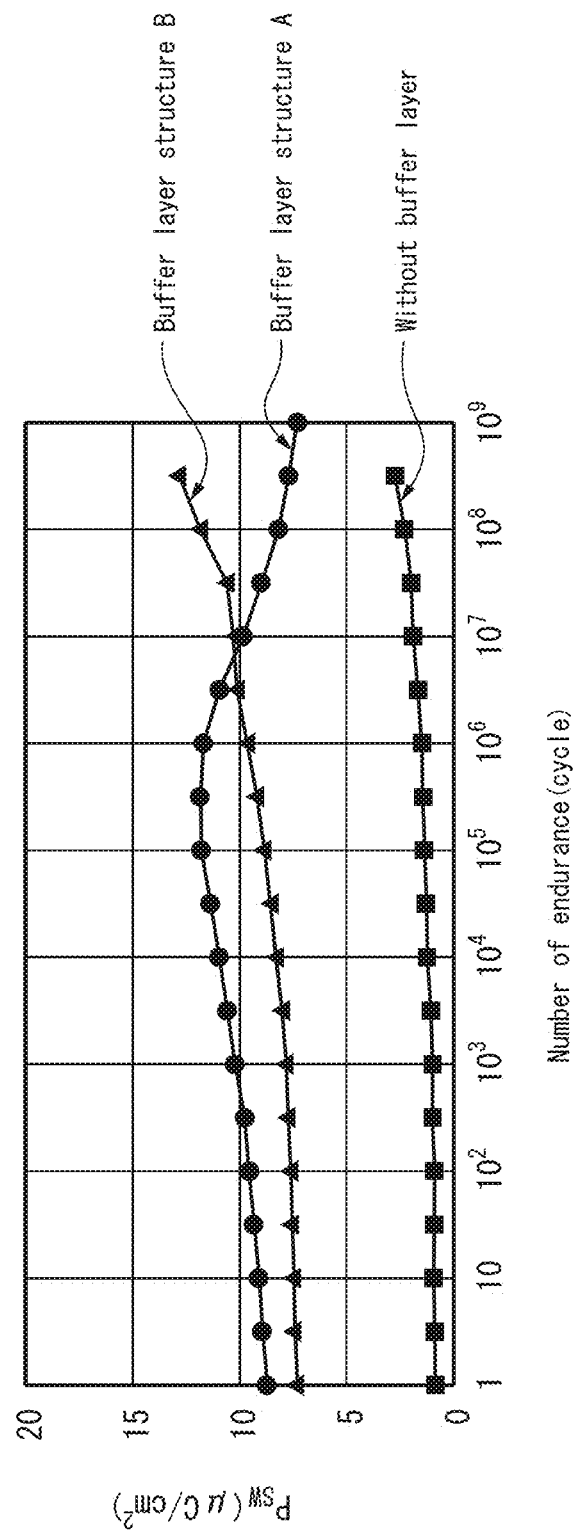
FIG. 12 is a graph showing the write/erase endurance of the non-volatile storage element of Example 1.

FIG. 12 shows write/erase endurance at a voltage of 2.2 V, 2 MHz, for the non-volatile storage element having a buffer (CeO$_x$) layer with a thickness of 1 nm, in FIGS. 11B-2 and 11C-2. With the non-volatile storage elements of Example 1, excellent write/erase endurance was obtained whether the buffer layer 4 was on the second conductive layer 3 side or the first conductive layer 2 side of the ferroelectric layer 1, compared to when no buffer layer was present. It was thus shown that the buffer layer structure A or buffer layer structure B of the invention exhibits a particular effect of improving and increasing the reliability, and especially the write/erase endurance of the ferroelectric non-volatile storage element.

Figure 13A:
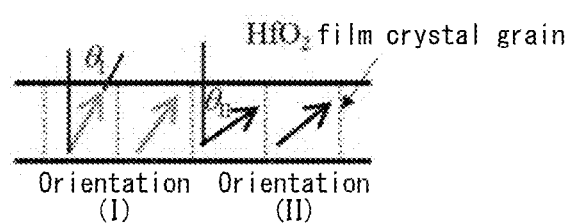
FIGS. 13A, 13B and 13C are diagrams illustrating an operating method based on orientation angle of the ferroelectric layer in the non-volatile storage element of Example 1, where
Figure 13B:
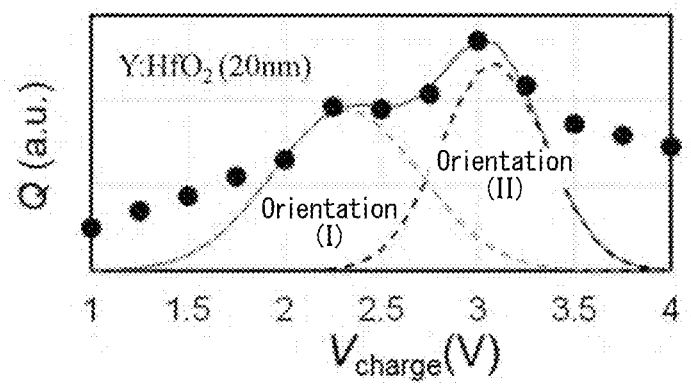
Figure 13C:
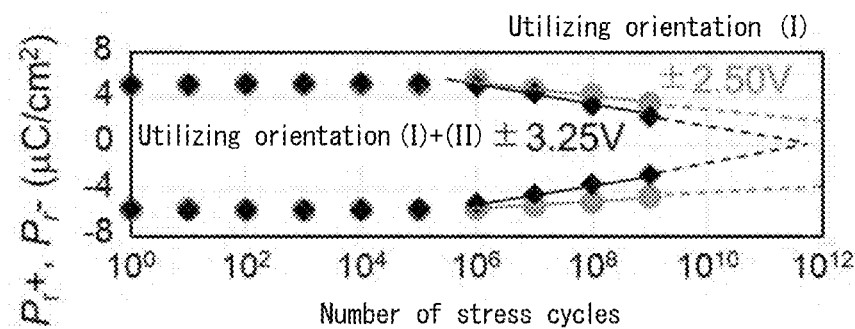

FIGS. 13A, 13B and 13C show a schematic view of orientations of Y:HfO$_2$ crystal grains (FIG. 13A), a diagram representing accumulated charge Q with respect to operating voltage V (FIG. 12B) and a diagram representing write/erase cycle property (FIG. 13C), for a non-volatile storage element comprising a ferroelectric layer composed of 5% yttrium-doped hafnium oxide (Y:HfO$_2$) with a thickness of 2 nm and a buffer layer composed of CeO$_x$, as one instance of Example 1 (see FIG. 1A).

The ferroelectric layer, and preferably hafnium-type ferroelectric layer, of the non-volatile storage element of the invention can have two crystal grain groups with different orientation angles, allowing the write/erase endurance of the non-volatile storage element to be improved by carrying out operation for switching only the crystal grain groups with small orientation angles.

FIG. 13A schematically shows the state of orientations of Y:HfO$_2$ crystal grains with orientation I having orientation angle $\theta_I$ and Y:HfO$_2$ crystal grains with orientation II having orientation angle $\theta_{II}$ ($>\theta_I$) in the ferroelectric layer of this type of non-volatile storage element.

Referring to FIG. 13B, in the non-volatile storage element (ferroelectric capacitor element), the accumulated charge Q has two peaks near 2.3 V and near 3 V, for applied voltage (operating voltage) V.

Upon waveform analysis of the accumulated charge Q, the waveform with orientation I and the waveform with orientation II are confirmed to be synthetic waveforms, corresponding to Y:HfO$_2$ crystal grains having orientation angle $\theta_I$ and $\theta_{II}$, respectively. If an applied voltage (operating voltage) is used that is ±2.50 V of a size that is insufficient to switch orientation II but can switch orientation I, then it is possible to switch only Y:HfO$_2$ crystal grains of orientation I. If a higher applied voltage (operating voltage) of ±3.25 V is used that can switch orientation II, then it is possible to switch Y:HfO$_2$ crystal grains of both orientation I and orientation II.

FIG. 13C shows the write/erase cycle property of a ferroelectric capacitor element with switching at an applied voltage (operating voltage) of ±2.50 V and an applied voltage (operating voltage) of ±3.25 V, demonstrating that using an operating method of switching orientation I alone with an applied voltage (operating voltage) of ±2.50 V results in lower reduction in polarization (accumulated charge) even with increased write/erase endurance, and therefore an improved write/erase cycle property, compared to switching of both the orientation I and orientation II with an applied voltage (operating voltage) of ±3.25 V.

Method for Producing Non-Volatile Storage Element of Example 1

For the non-volatile storage element of Example 1, a first conductive layer 2 is prepared first. The first conductive layer 2 only needs to be conductive, and the conductive layer may be a substrate. For example, it may be a semiconductor layer or semiconductor region having conductivity by doping of an impurity. Alternatively, the first conductive layer 2 may be formed by deposition of a conductive layer on a semiconductor layer or insulating layer. The method of depositing the conductive layer may be a film forming method (deposition method) such as sputtering, vapor deposition, CVD, PLD (Pulsed Laser Deposition), ALD (Atomic Layer Deposition) or plating.

The buffer layer 4 may optionally be formed on the first conductive layer 2. The buffer layer 4 will usually be an oxide, and a normal dielectric material, and may be formed by any of a wide range of film forming methods known for oxides and normal dielectric materials. Sputtering, vapor deposition, CVD, PLD (Pulsed Laser Deposition) or ALD (Atomic Layer Deposition) is preferred. Formation of the buffer layer 4 may be carried out at room temperature or with substrate heating, and preferably under reduced pressure, in an inert atmosphere such as argon. The deposition temperature may be room temperature or a high temperature of 400° C. or above without restrictions, but according to a preferred embodiment it is 400° C. or lower, below 300° C., or 250° C. or lower.

The ferroelectric layer 1 is then formed on the lower electrode if the first conductive layer 2 is a lower electrode, or on the buffer layer 4 if the buffer layer 4 is formed on the first conductive layer 2. Methods for forming ferroelectric layers are known and therefore a known method or the method disclosed in PTL 1 may be used. The ferroelectric layer 1 may be formed by a film forming method (deposition method) such as a sol-gel method, CVD (Chemical Vapor Deposition), pulse CVD, PLD (Pulsed Laser Deposition), ALD (Atomic Layer Deposition) or self-assembly, but it is preferably formed by ALD, sputtering or a hydrothermal method. Sputtering or a hydrothermal method allows formation of a ferroelectric layer at temperatures of below 300° C.

According to a preferred embodiment, the ferroelectric layer 1 composed of a hafnium-type metal oxide is formed by sputtering, as sputtering allows film formation at a temperature of 400° C. or lower and especially below 300° C. A target made of a starting metal oxide or its constituent elements or oxides is sputtered in an inert atmosphere or in an oxidizing atmosphere to deposit the desired metal oxide layer on a substrate having the first conductive layer 2 on its surface. Sputtering allows deposition of a ferroelectric layer on a substrate either at room temperature or heated to a low temperature of below 300° C., but activation annealing treatment may also optionally be carried out at a temperature of 400° C. or lower after deposition.

When the metal oxide layer deposited by sputtering, ALD, CVD or another deposition method is not a ferroelectric substance, the ferroelectric layer may be formed by annealing treatment after deposition. The annealing treatment temperature will usually be 800° C. or lower, and may be 200 to 800° C., for example.

The ferroelectric layer may be formed by forming a monoclinic phase or tetragonal normal dielectric thin-film composed of a hafnium-type metal oxide at a temperature of lower than 300° C., and applying an electric field, greater than an electric field that causes field-induced phase transition, to the normal dielectric thin-film at room temperature or with temperature increase at 800° C. or lower and preferably below 300° C. to convert the normal dielectric thin-film to an orthorhombic ferroelectric thin-film.

When the ferroelectric layer has been deposited at room temperature or the low temperature, it may be subjected to activation annealing treatment after deposition to improve the crystal quality or improve the ferroelectric property. The temperature for activation annealing treatment may be 400° C. or higher, such as 400 to 800° C. or 400 to 700° C., and it may be 400° C. or lower, and according to one embodiment it may be 400° C. or lower and preferably lower than 300° C., or 250° C. or lower.

After the ferroelectric layer 1 has been formed, a buffer layer 4 is optionally formed on the ferroelectric layer 1. According to the invention, the buffer layer 4 is formed either or both on the first conductive layer 2 and on the ferroelectric layer 1. The buffer layer 4 will usually be an oxide and a normal dielectric material, and may be formed by any of a wide range of film forming methods known for oxides and normal dielectric materials. Sputtering, vapor deposition, CVD, PLD (Pulsed Laser Deposition) or ALD (Atomic Layer Deposition) is preferred. Formation of the buffer layer 4 may be carried out by room temperature or with substrate heating, and preferably under reduced pressure, in an inert atmosphere such as argon. The deposition temperature may be room temperature or a high temperature, but is preferably 400° C. or lower, or lower than 300° C.

The ferroelectric layer 1 and buffer layer 4 may be subjected to activation annealing (AA), after the buffer layer 4 has been deposited (optionally after fabricating the element or device), when the buffer layer 4 is formed on the ferroelectric layer 1, or after the ferroelectric layer 1 has been deposited (optionally after fabricating the element or device), when the buffer layer 4 is present only under the ferroelectric layer 1 and is not present on the ferroelectric layer 1. The AA treatment may be carried out in an inert atmosphere such as argon, at a temperature of, for example, 400° C. or higher, or 400° C. or lower, further 200° C. to 300° C., and preferably under reduced pressure. The activation annealing treatment time will depend on the annealing temperature but may be 60 minutes or less and preferably 0.2 to 20 minutes, for example. Activation annealing (AA) treatment after deposition of the buffer layer 4 can improve the crystallinity of the ferroelectric layer 1 and the interface properties of the ferroelectric layer 1 and buffer layer 4, and can also improve the ferroelectric property. Activation annealing treatment at 400° C. or lower is advantageous, especially when a semiconductor device is comprised with the non-volatile storage element (ferroelectric capacitor), because it can be carried out after the semiconductor device comprising the non-volatile storage element has been fabricated, without adversely affecting the other structural members or the impurity-diffused regions or wiring of the semiconductor device.

As an example, the surface of a Si semiconductor base layer formed on a Si semiconductor substrate was cleaned by presputtering for 30 minutes in an argon atmosphere, and then after depositing nickel (Ni) on the Si semiconductor base layer by sputtering, the Si semiconductor substrate was heated at 350° C. in an argon atmosphere for silicidation of the nickel (Ni) on the Si semiconductor base layer, forming a nickel silicide ($NiSi_2$) first conductive layer (lower electrode) 2. Using the method described in PTL 1, a Y7%-$HfO_2$ layer was formed on the semiconductor substrate on which the first conductive layer 2 had been formed. After pressure reduction in a vacuum chamber in the sputtering apparatus, a voltage was applied between the semiconductor substrate and the target (Y7%-$HfO_2$) in an argon atmosphere with an argon flow rate of 100 sccm, an oxygen flow rate of 0 sccm and a pressure of 50 mTorr, with the semiconductor substrate temperature set to room temperature (25° C.), and a Y7%-$HfO_2$ layer 1 was formed to a thickness of 10 nm on the first conductive layer 2 of the semiconductor substrate, with electric power of 50 W. The Y7%-$HfO_2$ layer deposited at room temperature was annealed for 10 minutes at a temperature of 200 to 350° C.

FIG. 3 shows a chart obtained by X-ray diffraction analysis of Y7%-$HfO_2$ layer 1 after depositing and annealing, respectively. FIG. 3 confirms that all of the Y7%-$HfO_2$ thin-films had a single diffraction peak observed near 30°, and were fluorite-type orthorhombic crystalline ferroelectric substances.

On the Y7%-$HfO_2$ layer 1, $CeO_x$ (x=1.5-2.0) was vapor deposited using a 50 W electron beam at room temperature (25° C.) in an argon atmosphere with argon at 100 sccm, oxygen at 0 sccm and a pressure of 50 mTorr for 30 minutes, to form a buffer layer 4 to a thickness of 2 nm.

A TiN layer (upper electrode) 3 was deposited on the buffer layer 4 by sputtering. For comparison, an example (Comparative Example) without formation of a buffer layer 4 was prepared and a TiN layer (upper electrode) 3 was deposited over it. AA treatment was carried out at 200 to 400° C. on some of the obtained elements. For comparison, the same Comparative Example was prepared without formation of the buffer layer 4. The electrical characteristics of the obtained ferroelectric storage elements are shown in FIGS. 4 to 9.

The embodiments described above for the method for producing a non-volatile storage element of Example 1 apply for all of the storage elements and storage device production methods of the Examples of the invention, assuming they employ the non-volatile storage element of Example 1. The non-volatile storage element of Example 1 provides an effect in which, in a non-volatile storage element using a ferroelectric layer composed of a metal oxide, the presence of a buffer layer of a metal oxide having oxygen ion conductivity and comprising a metal with a multiple valency prevents leakage current and improves the ferroelectric storage element reliability, and in particular improves the prior art problem of write/erase endurance. In addition, if a ferroelectric layer composed of a hafnium-type metal oxide is formed at a temperature of 400° C. or lower and preferably lower than 300° C., and the deposited ferroelectric layer is then subjected to activation annealing at a temperature of 400° C. or lower, then it is not only possible to improve the properties of the ferroelectric layer and ferroelectric storage element, but activation annealing (AA) can also be carried out at a temperature of 400° C. or lower, thereby allowing it to be carried out after fabrication of a storage element and storage device, in particular, for application to advanced CMOS backend mixed memories (FeRAM). It is especially suitable when the storage element and storage device comprise copper wiring or impurity-diffused semiconductor regions. However, production of an advanced CMOS backend mixed memory (FeRAM) according to the present invention is not limited to the range of 400° C. and lower.

Continuous deposition of a ferroelectric layer 1 and buffer layer 4 by atomic layer deposition (ALD) allows excellent commercial productivity to be achieved. This example, however, is not limited to a non-volatile storage element and method for producing it, and needless to mention the types of materials, layer thicknesses and film-forming conditions may be appropriately modified.

Example 2: Ferroelectric Storage Element with Advanced Buffer Layer Structure

Example 2 of the invention provides a non-volatile storage element comprising at least a first conductive layer, a second conductive layer, and a ferroelectric layer composed of a metal oxide between the first conductive layer and the second conductive layer, wherein the non-volatile storage element has between the ferroelectric layer and the first conductive layer and/or second conductive layer a buffer layer of a metal oxide 4 having oxygen ion conductivity and comprising a metal with a multiple valency, with an interface layer composed of a single-layer film or multilayer film between the ferroelectric layer and first conductive layer, the interface layer as a whole having higher dielectric constant than silicon oxide, and when a buffer layer is present between the first conductive layer and the ferroelectric layer, the interface layer is present between the first conductive layer and the buffer layer.

Even with the non-volatile storage element of Example 2 of the invention, since a buffer layer of a metal oxide having oxygen ion conductivity and comprising a metal with a multiple valency is present between the ferroelectric layer and the first conductive layer 2 and/or second conductive layer, leakage current is prevented, and the reliability and write/erase endurance of the ferroelectric storage element are improved. Since generation of oxygen defects in the ferroelectric layer or at the interface between the ferroelectric layer and conductor layer by electric field stress during write/erase cycle is a possible cause of leakage current, and especially impaired reliability and write/erase endurance, supply of oxygen ions from the buffer layer to the ferroelectric layer or the ferroelectric layer interface compensates for the oxygen defects and improves the film quality and interface.

Figure 14A:
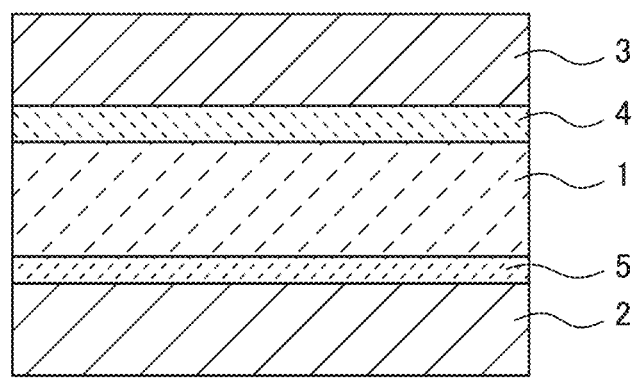
FIGS. 14A and 14B are cross-sectional diagrams schematically showing examples of a non-volatile storage element according to the first embodiment of Example 2.
Figure 14B:
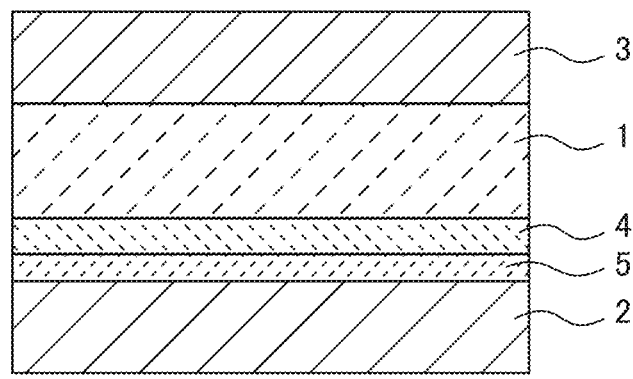

FIGS. 14A and 14B show schematic cross-sectional diagrams of examples of the non-volatile storage element of Example 2 of the invention. In FIGS. 14A and 14B, 1 is a ferroelectric layer, 2 is a first conductive layer (lower electrode), 3 is a second conductive layer (upper electrode), 4 is a buffer layer and 5 is an interface layer. In FIG. 14A, the buffer layer 4 is between the ferroelectric layer 1 and the second conductive layer (upper electrode) 3, while the interface layer 5 is between the ferroelectric layer 1 and the first conductive layer (lower electrode) 2. In FIG. 14B, the buffer layer 4 is between the ferroelectric layer 1 and the first conductive layer (lower electrode) 2, while the interface layer 5 is between the first conductive layer (lower electrode) 2 and the buffer layer 4. Though not shown, the buffer layer 4 may be provided both between the ferroelectric layer 1 and the second conductive layer (upper electrode) 3 and between the ferroelectric layer 1 and first conductive layer (lower electrode) 2, in which case the interface layer 5 is between the buffer layer 4 and first conductive layer (lower electrode) 2, below the ferroelectric layer 1. It is sufficient if the first conductive layer 2 is one of the two electrodes sandwiching the ferroelectric layer 1 of the non-volatile storage element, and when the non-volatile storage element has a conductive layer (electrode) on the semiconductor substrate (silicon substrate), the first conductive layer 2 is preferably present as a lower electrode on the semiconductor substrate (silicon substrate) side.

The non-volatile storage element of Example 2 of the invention also has an interface layer 5 composed of a single-layer film or multilayer film between the ferroelectric layer 1 and first conductive layer 2, in addition to the buffer layer 4, the interface layer as a whole having higher dielectric constant than silicon oxide. Particularly when the first conductive layer 2 is a silicon substrate, the presence of the interface layer 5 having higher dielectric constant than silicon oxide between the ferroelectric layer 1 and first conductive layer 2, serving also to inhibit formation of a silicon oxide film between the silicon substrate and ferroelectric layer 1, allows sufficient voltage to be applied to the ferroelectric layer 1 with lower external voltage since higher partial voltage is applied to the ferroelectric layer 1 of the voltages applied between the first and second conductive layers 2 and 3 during write/erase cycle, compared to when no interface layer 5 is present. The interface layer 5 improves the ferroelectric property with low voltage operation as described above, and when the non-volatile storage element is FeFET (see FIG. 22B), tunnel current of electrons injected through the FeFET channels during writing is inhibited by relative thickening of the interface layer (tunnel insulating film), resulting in improvement in deterioration of write/erase endurance.

The interface layer 5 has higher dielectric constant than the dielectric constant of a silicon oxide film (relative dielectric constant of about 3.9). An oxide film or silicate film having a dielectric constant of greater than the dielectric constant of a silicon nitride film (relative dielectric constant of about 7.8) is preferred. The ratio of the voltages diffused in the ferroelectric layer 1 and interface layer 5, of the voltages applied between the first and second conductive layers 2 and 3, depends on the ratio of the dielectric constants of the ferroelectric layer 1 and interface layer 5, with a higher dielectric constant being preferred for the interface layer 5 since a higher partial voltage is applied to the ferroelectric layer 1. The dielectric constant of the interface layer 5 is preferably higher than about 3.9 as the relative dielectric constant, and more preferably it is about 5 or higher, about 7.8 or higher, about 15 or higher or about 20 or higher.

Such an interface layer 5 may be a high dielectric constant insulator (normal dielectric material), but preferably it is an oxide of the metal in the metal oxide of the ferroelectric layer. For example, when the ferroelectric layer 1 is a yttrium-doped hafnium-type metal oxide (Y—HfO$_2$; relative dielectric constant: 25), yttrium silicate (YSiO), hafnium silicate (HfSiO), yttrium oxide ($Y_2O_3$) or the like is preferred. Hafnium aluminate (HfAlO), yttrium aluminate ($YAlO_3$) (relative dielectric constant: 16), lanthanum aluminate ($LaAlO_3$) (relative dielectric constant: 25) and yttrium-stabilized zirconia (YSZ) (relative dielectric constant: 27) are also preferred.

The thickness of the interface layer 5 is not restricted but is preferably 4 nm or smaller, 2 nm or smaller, 1.5 nm or smaller or 1 nm or smaller. Even a small film thickness of the interface layer 5 is effective if its dielectric constant is higher than silicon, and it may be 0.2 nm or greater, for example. It may also be 0.3 nm or greater or 0.5 nm or greater. Since the interface layer 5 is a layer with high dielectric constant in order to apply sufficient voltage to the ferroelectric layer 1, it is sufficient to be a layer thickness suited for that purpose, and since the interface layer 5 is an insulator material it is preferably a layer thickness that does not significantly impair the conductivity.

The interface layer 5 is preferably in direct contact with the first conductive layer (lower electrode) 2. However, since a very thin surface oxidation film tends to form on the surface of the first conductive layer (lower electrode) 2, the surface oxidation film may be considered part of the interface layer 5. If the surface oxidation film is considered part of the interface layer 5 then the interface layer 5 is composed of not a single-layer film but rather a multilayer film (composite film), but it is sufficient if the portions other than the surface oxidation film have higher dielectric constant than silicon oxide and the composite film as a whole has higher dielectric constant than silicon oxide. Needless to mention the interface layer itself apart from the surface oxidation film may also be a multilayer film.

The interface layer preferably has a function of inhibiting movement of oxygen from the ferroelectric layer to the first conductive layer side. This can provide an effect of inhibiting generation of oxygen defects in the ferroelectric layer.

In addition, regardless of the metal composing the metal oxide of the ferroelectric layer, the metal composing the hafnium-type metal oxide that comprises an additional metal may be an oxide or silicate of a metal such as hafnium (Hf), zirconium (Zr), cerium (Ce), aluminum (Al), silicon (Si), strontium (Sr), barium (Ba) or a rare earth element (Sc, Y, La, Ce, Pr, Nd, Sm, Eu, Gd, Tb, Dy, Ho, Er, Tm, Yb, Lu). The interface layer 5 is a high dielectric material (normal dielectric material) that does not exhibit ferroelectricity, even if it is an oxide of the metal composing the hafnium-type metal oxide. Such an interface layer 5 has chemical similarity with the ferroelectric layer 1 and can exhibit excellent properties for the interface and excellent film quality for the ferroelectric layer as well.

The ferroelectric layer 1 of Example 2 exhibits ferroelectricity. A ferroelectric substance is a substance wherein the electric dipoles are aligned even without an external electric field, and wherein the orientation of the dipoles can be changed by an electric field. When a ferroelectric substance is used to configure a storage element, the polarization is conserved even when no electric field is being applied, thus allowing construction of a non-volatile storage element which allows power consumption to be reduced. Data Write/erase cycle with the ferroelectric storage element is based on voltage, accomplished by application of an electric field, and since writing and erasing current are drastically reduced compared to a current-type, this makes it possible to reduce power consumption.

For Example 2, the ferroelectric layer 1 is a ferroelectric layer composed of a metal oxide. The ferroelectric layer 1 is preferably a ferroelectric substance which is composed of a metal oxide in a fluorite-type orthorhombic phase. A metal oxide which comprises hafnium (Hf), zirconium (Zr), cerium (Ce) or two or more of such elements, and preferably hafnium (Hf), zirconium (Zr) or both, is suitable because it can form a ferroelectric substance exhibiting a fluorite-type orthorhombic phase when either doped or non-doped. Even when non-doped, it is possible to form a ferroelectric substance by oxygen defects. More suitable is a metal oxide that comprises hafnium (Hf), zirconium (Zr), cerium (Ce) or two or more of such elements, and preferably hafnium (Hf), zirconium (Zr) or both elements and at least one metal element (additional metal) selected from the group consisting of aluminum (Al), silicon (Si), strontium (Sr), barium (Ba) and rare earth elements (Sc, Y, La, Ce, Pr, Nd, Sm, Eu, Gd, Tb, Dy, Ho, Er, Tm, Yb and Lu).

The main metal oxide in the hafnium-type metal oxide may be a simple oxide such as hafnium oxide, zirconium oxide or cerium oxide, or a solid solution in such metal oxides. When the hafnium-type metal oxide comprises an additional metal, the amount of the additional metal will depend on the type of main metal oxide and additional metal but may be an amount that forms a ferroelectric substance, and generally the number of moles of the additional metal is preferably 10 mol % or lower, more preferably 0.1 to 10% or even 4 to 9 mol %, with 100 mol % as the total of the metals of all of the metal oxides comprising the additional metal.

For example, typical hafnium-type ferroelectric materials are Y-doped $HfO_2$, Si-doped $HfO_2$, Al-doped $HfO_2$, La-doped $HfO_2$ and HZO ($Hf_{0.5}Zr_{0.5}O_2$).

It is sufficient if the ferroelectric layer 1 is composed of crystals exhibiting ferroelectricity and it may be composed of polycrystals, or may be a uniaxial oriented crystal thin-film or even an epitaxial film.

The film thickness of the ferroelectric layer 1 is a thickness suitable for the intended use of the non-volatile storage element, and it is not particularly restricted but may be 1 nm or greater, 5 nm or greater or 10 nm or greater, for example. There is no particular upper limit, but it may be 5 μm or smaller, 3 μm or smaller or 1 μm or smaller, for example. According to a preferred embodiment of the invention, the film thickness of the ferroelectric layer 1 may be 1 nm to 100 nm, more preferably 1 nm to 50 nm, or even 2 nm to 10 nm or 2 nm to 5 nm. The aforementioned hafnium-type metal oxide exhibits more excellent ferroelectricity even as a thin film of 20 nm or smaller, compared to conventional ferroelectric substances such as PZT, and it is therefore suitably scalable as a ferroelectric layer for a non-volatile storage element.

The first conductive layer 2 and second conductive layer 3 function as electrodes for application of voltage to the ferroelectric layer 1, and they may be composed of metal, conductive ceramics or conductive semiconductors. The metals include tungsten, titanium, gold, silver, copper, platinum and aluminum, the conductive ceramics include conductive nitrides such as titanium nitride (TiN), conductive silicides such as nickel disilicide ($NiSi_2$), conductive oxides such as indium-tin oxide (ITO), and pyrochlore structures such as $Bi_2Ru_2O_7$ and rare earth iridium oxides $R_2Ir_2O_7$ (where R is a rare earth element). Doped or intrinsic silicon semiconductors, and various compound semiconductors, may be mentioned as the conductive semiconductors. The first conductive layer 2 and second conductive layer 3 may be electrically connected to the ferroelectric layer 1. The conductive layer (upper electrode) formed on the ferroelectric layer 1 is preferably a multilayer electrode of tungsten, TiN and TiN/W.

The first conductive layer composing a substrate on which the ferroelectric layer 1 is deposited is preferably a metal silicide or metal disilicide having a fluorite structure, or a metal nitride, or impurity-containing Si or Ge, or an SOI (Silicon on Insulator). The (first) conductive layer as the substrate is preferably nickel disilicide ($NiSi_2$) with a fluorite structure, as this will make it possible to obtain excellent quality for the hafnium-type metal oxide crystals accumulated over it.

According to a preferred embodiment, the first conductive layer 2 and second conductive layer 3 may have a barrier layer of a conductive material with an oxygen barrier property that inhibits movement of oxygen, such as tungsten (W), formed on the interface side with the ferroelectric layer 1, and particularly on the interface side of the second conductive layer 3 with the ferroelectric layer 1, when the second conductive layer (upper electrode) 3 has been formed on the ferroelectric layer 1. If the first conductive layer 2 and second conductive layer 3 have an oxygen barrier layer, this will provide an effect of inhibiting generation of oxygen defects by leakage of oxygen ions from the ferroelectric layer 1, as well as an effect of preventing leakage current and improving the performance of the non-volatile storage element of the invention. The thickness of the barrier layer is preferably 0.1 nm or greater, and even more preferably 0.5 nm or greater, 1 nm or greater or 1.5 nm or greater. The film thickness of the buffer layer 4 is also preferably 10 nm or smaller, and more preferably 6 nm or smaller, 5 nm or smaller, 4 nm or smaller or 3 nm or smaller.

In the non-volatile storage element of the invention, a buffer layer 4 with oxygen ion conductivity is present between the ferroelectric layer 1 and second conductive layer 3. The buffer layer 4 is made of a normal dielectric material (insulator material) which is a metal oxide exhibiting oxygen ion conductivity and comprising a metal with multiple valency. By being an insulator material of a metal oxide exhibiting oxygen ion conductivity and comprising a metal with multiple valency, the buffer layer 4 can donate and accept, and particularly donate, oxygen ions to the ferroelectric layer 1, providing a function of preventing or repairing oxygen defects caused by electric field stress during write/erase cycle in the ferroelectric layer 1 or at the interface between the ferroelectric layer 1 and the conductive layer, thereby reducing leakage current and improving the ferroelectric property, and making it possible to reduce the anti-electric field and to exhibit an effect of improving the write/erase cycle properties.

The chemical potential of the oxygen in the buffer layer 4 is preferably greater than the chemical potential of the oxygen in the ferroelectric layer 1. The oxygen vacancy defect density of the buffer layer 4 is preferably lower than the oxygen vacancy defect density of the ferroelectric layer 1. If the chemical potential of the oxygen in the buffer layer 4 is greater than the chemical potential of the oxygen in the ferroelectric layer 1, or the oxygen vacancy defect density of the buffer layer 4 is lower than the oxygen vacancy defect density of the ferroelectric layer 1, then oxygen ions will easily migrate from the buffer layer 4 into the ferroelectric layer 1, thereby allowing the amount of oxygen defects in the ferroelectric layer 1 or at the interface between the ferroelectric layer 1 and conductive layer to be controlled.

The normal dielectric material (insulator material) in the buffer layer 4, as a metal oxide that exhibits oxygen ion conductivity and comprises a metal with multiple valency, may be a cerium oxide film ($CeO_x$) (x=1.5-2.0, preferably 1.6-2.0, more preferably 1.7-2.0 and most preferably 1.8-2.0), or a zirconium oxide film, titanium oxide film, yttria-stabilized zirconia film or rare earth element oxide film.

The thickness of the buffer layer 4 is preferably 0.1 nm or greater, and even more preferably 0.5 nm or greater, 1 nm or greater or 1.5 nm or greater. The film thickness of the buffer layer 4 is also preferably 10 nm or smaller, and more preferably 6 nm or smaller, 5 nm or smaller, 4 nm or smaller or 3 nm or smaller.

The electrical characteristics of the non-volatile storage element of Example 2 of the invention can be seen in FIGS. 4 to 9 for Example 1 in terms of the effect of the buffer layer 4, but FIGS. 15 to 20 show additional electrical characteristics for the non-volatile storage element of Example 2 (TiN/$CeO_2$ (4 nm)/Y—$HfO_2$ (9 nm)/IL ($Y_2O_3$; 2 nm)/$NiSi_2$, activation annealed at 350° C. after deposition). The upper electrode is effective even in the case of a TiN/W multilayer electrode.

Figure 15:
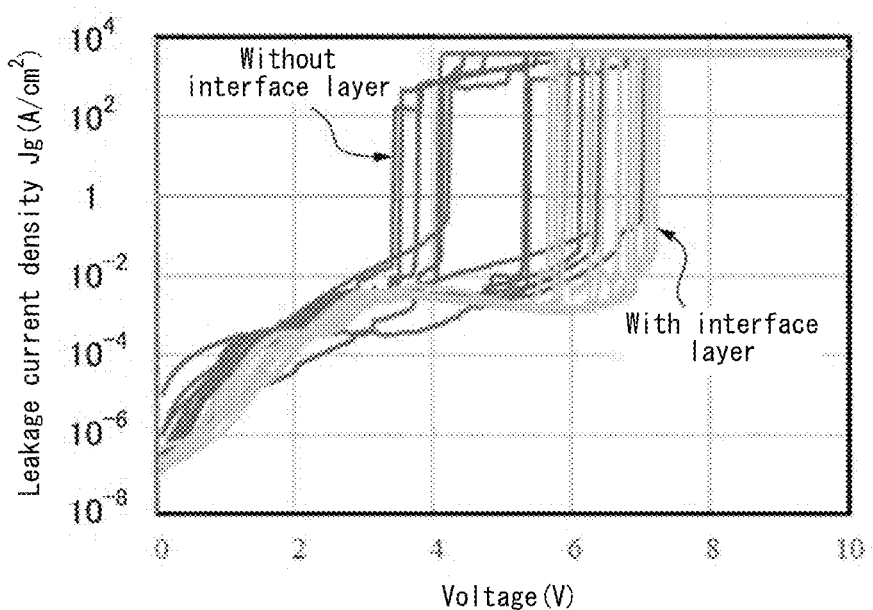
FIG. 15 is a graph showing the current-voltage characteristic of the non-volatile storage element of Example 2.

FIG. 15 shows the current-voltage characteristic of a ferroelectric capacitor element evaluated with a microcurrent meter, indicating that insertion of an interface layer decreased the leakage current even on the high voltage side, and increased the breakdown voltage of the element, compared to the control example (Example 1) without an interface layer.

Figure 16:
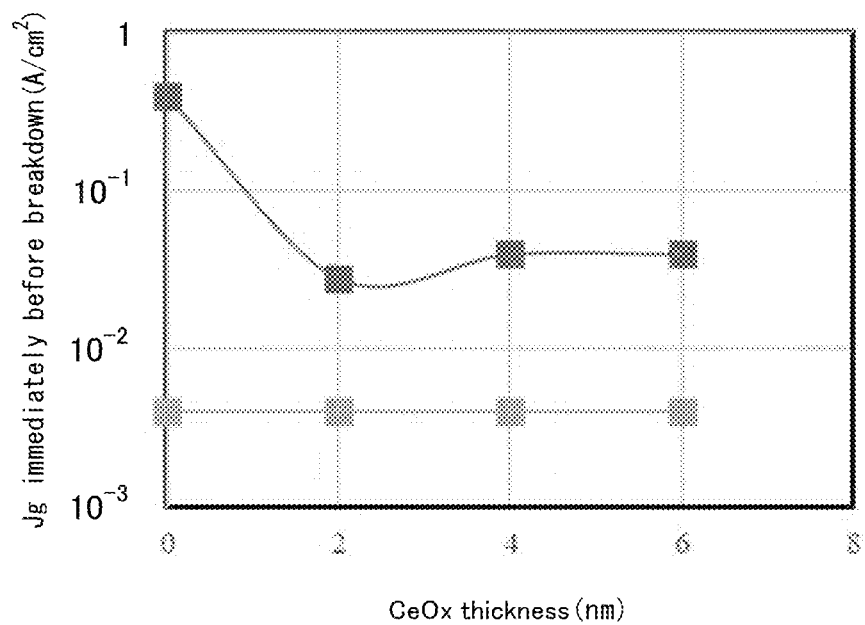
FIG. 16 shows dependence of leakage current of the non-volatile storage element of Example 2, with respect to thickness of the $CeO_2$ layer in the buffer layer.

FIG. 16 shows the dependence of leakage current measured under the same conditions, on layer thickness of the buffer layer $CeO_x$ (x=1.5-2.0), showing that leakage current was reduced with all $CeO_x$ (x=1.5-2.0) layer thicknesses compared to the control example (Example 1), and thus indicating the effectiveness of the interface layer in the buffer layer structure.

Figure 17:
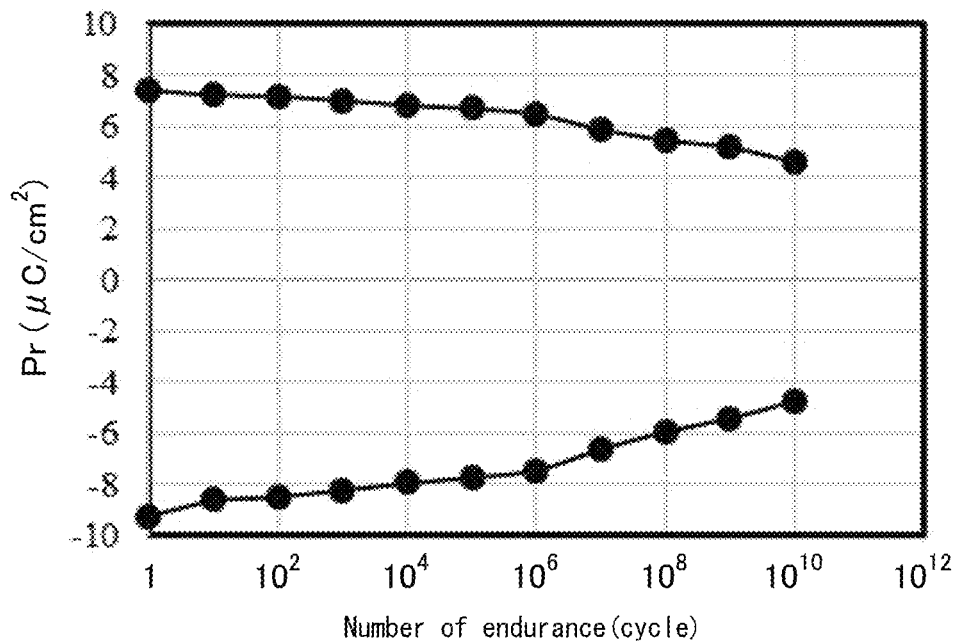
FIG. 17 is a graph showing the write/erase endurance of the non-volatile storage element of Example 2.

FIG. 17 shows the write/erase cycle property of a ferroelectric capacitor element measured with a voltage of 4.5 V, 1 MHz. Activation annealing was carried out at 350° C. The remanent polarization width 2Pr after 1010 cycle was confirmed to be increased compared to the control example (Example 1).

Figure 18:
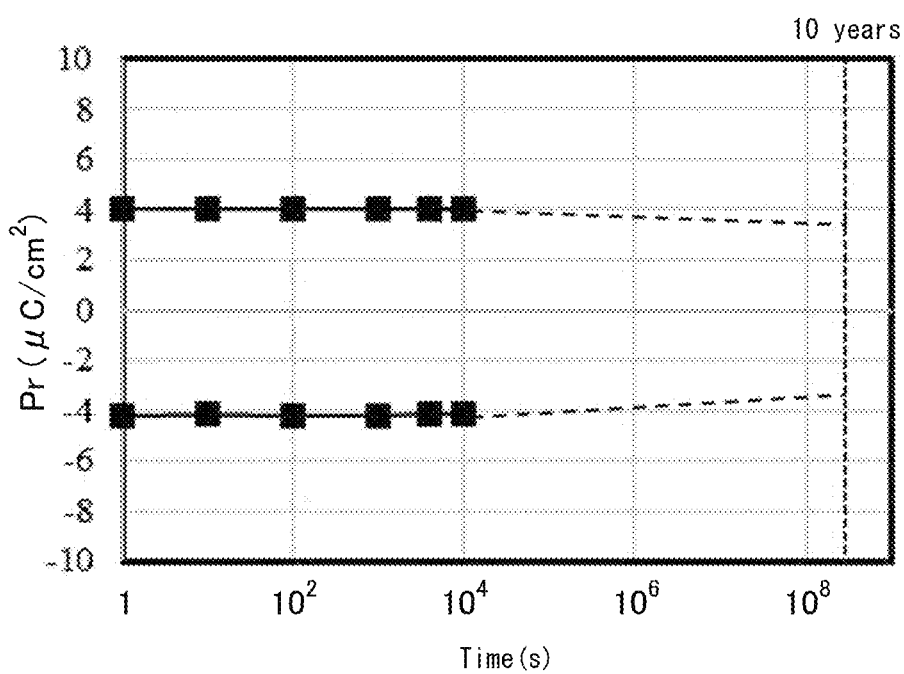
FIG. 18 is a graph showing the data retention characteristic of the non-volatile storage element of Example 2.

FIG. 18 shows the room-temperature data storage characteristic after 1010 cycle with the ferroelectric element. The spontaneous polarization Pr window width is within the measuring time but remained essentially constant with time, indicating that a satisfactory data retention characteristic had been obtained. As a result of extrapolation for room temperature it was estimated that adequate spontaneous polarization window width even after 10 years had been obtained, maintaining a readable level of written data even after 10 years, and therefore the data retention time is expected to be 10 years.

Figure 19:
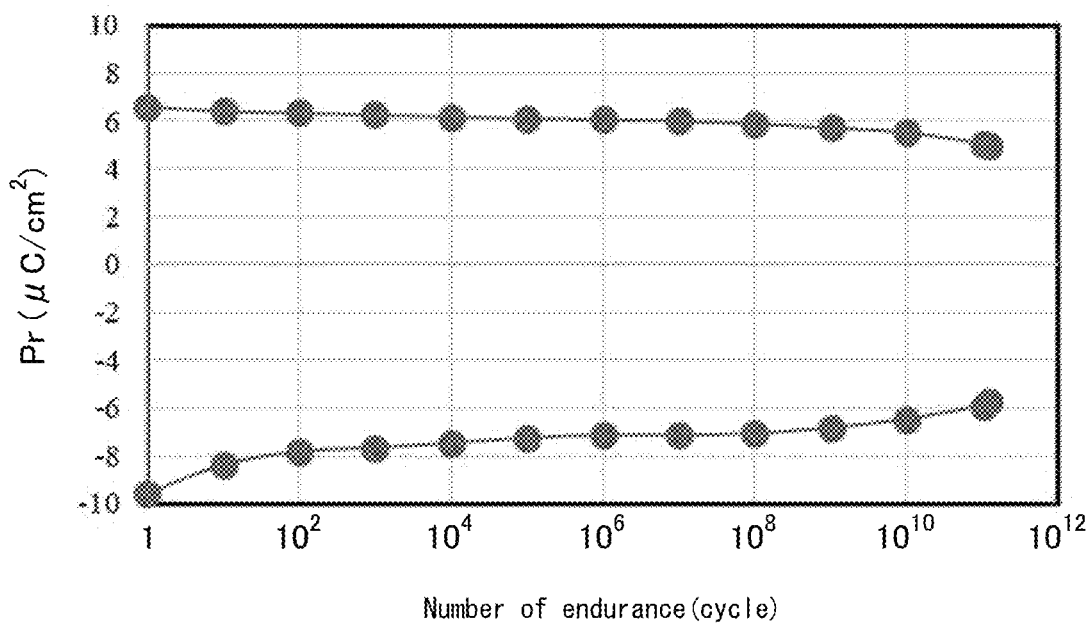
FIG. 19 is a graph showing the write/erase endurance of the non-volatile storage element of Example 2.

FIG. 19 shows write/erase endurance measured under conditions with a voltage of 4.5 V, 1 MHz, indicating that $10^{11}$ cycle were achieved with remanent polarization width 2Pr=11 µC/cm2 or greater.

Figure 20:
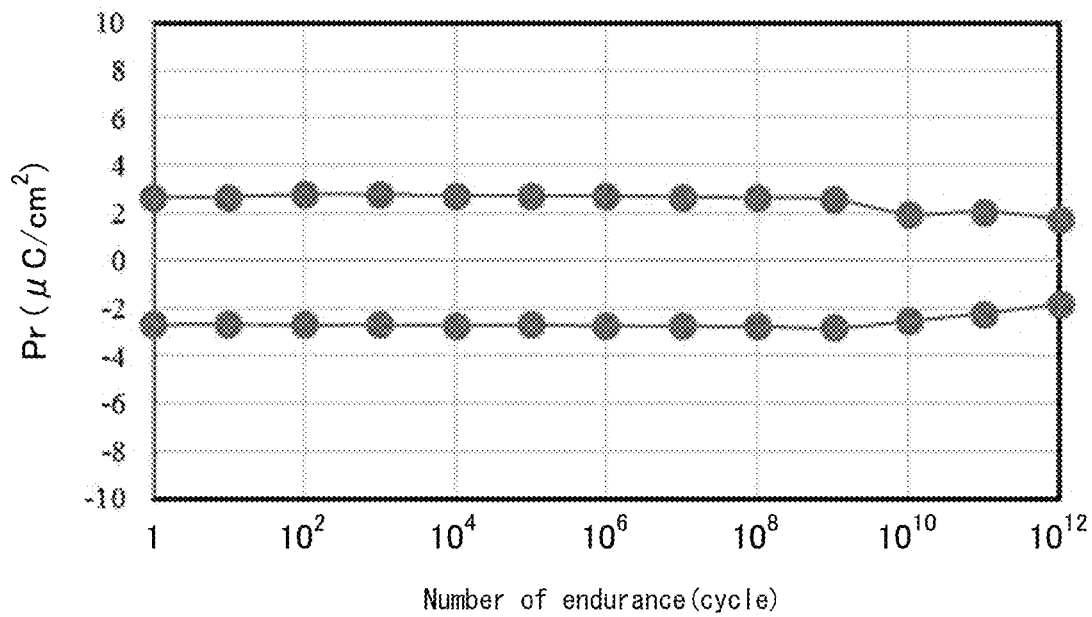
FIG. 20 is a graph showing the write/erase endurance of the non-volatile storage element of Example 2.

FIG. 20 shows write/erase endurance measured with voltage conditions using an electric field of 2 MV/cm, at 2 MHz. In FIG. 20, the Pr window width was essentially constant with respect to the number of write/erase cycle, with minimal narrowing and achieving a write/erase endurance of $10^{12}$ cycle or greater.

The embodiments for the non-volatile storage element of Example 2 also apply for the other storage elements and storage devices of the other Examples of the invention, assuming that the non-volatile storage element comprises an interface layer.

(Method for Producing Non-Volatile Storage Element of Example 2)

In the non-volatile storage element of Example 2, the configuration other than the interface layer 5, and the production method, are the same as for the non-volatile storage element of Example 1. Since the interface layer 5 is a normal dielectric material (insulator) and particularly an oxide, it can be formed by a common method of deposition for normal dielectric materials and oxides, such as sputtering, vapor deposition, CVD, PLD (Pulsed Laser Deposition) or ALD (Atomic Layer Deposition).

As an example for the non-volatile storage element of Example 2, the surface of a Si semiconductor base layer formed on a Si semiconductor substrate surface was cleaned by presputtering for 30 minutes in an argon atmosphere, and then after depositing nickel (Ni) on the Si semiconductor base layer by sputtering, the Si semiconductor substrate was heated at 350° C. in an argon atmosphere for silicidation of the nickel (Ni) on the Si semiconductor base layer, forming a nickel disilicide (NiSi$_2$) first conductive layer (lower electrode) 2. Yttrium oxide (Y$_2$O$_3$) was then deposited on the first conductive layer 2 by sputtering to a layer thickness of 2 nm as an interface layer 5, in an argon atmosphere.

Using the method described in PTL 1, a Y7%-HfO$_2$ layer was formed on the semiconductor substrate on which the interface layer 5 had been formed. After pressure reduction in a vacuum chamber in the sputtering apparatus, a voltage was applied between the semiconductor substrate and the target (Y7%-HfO$_2$) in an argon atmosphere with an argon flow rate of 100 sccm, an oxygen flow rate of 0 sccm and a pressure of 50 mTorr, with the semiconductor substrate temperature set to room temperature (25° C.), and a Y7%-HfO$_2$ layer 1 was formed to a thickness of 10 nm on the first conductive layer 2 of the semiconductor substrate, with electric power of 50 W. After deposition, each Y7%-HfO$_2$ layer 1 was subjected to X-ray diffraction analysis, and it was confirmed that all of the Y7%-HfO$_2$ thin-films were polycrystalline, fluorite-type orthorhombic crystals, and were ferroelectric substances.

The Y7%-HfO$_2$ layer 1 was vapor deposited with a CeO$_x$ (x=1.5-2.0) film using an electron beam to a thickness of 2 to 6 nm, to form a buffer layer 4. A TiN layer (upper electrode) 3 was then deposited on the buffer layer 4 by sputtering. Activation annealing treatment (AA treatment) was carried out at 200° C. to 400° C. The other electrical characteristics of the obtained ferroelectric storage elements are shown in FIGS. 15 to 20. The control example shown in FIGS. 15 to 20 is Example 1.

A preferred example of the method for producing a non-volatile storage element of Example 2 will now be explained with reference to FIG. 21. Continuous deposition of a ferroelectric capacitor interface layer 5, ferroelectric layer 1 and buffer layer 4 by atomic layer deposition (ALD) for this example allows excellent commercial productivity to be achieved. The example of FIG. 21, however, is not limited to the method for producing a non-volatile storage element of Example 2, and the types of materials, layer thicknesses and film-forming conditions may be appropriately modified.

Figure 21:
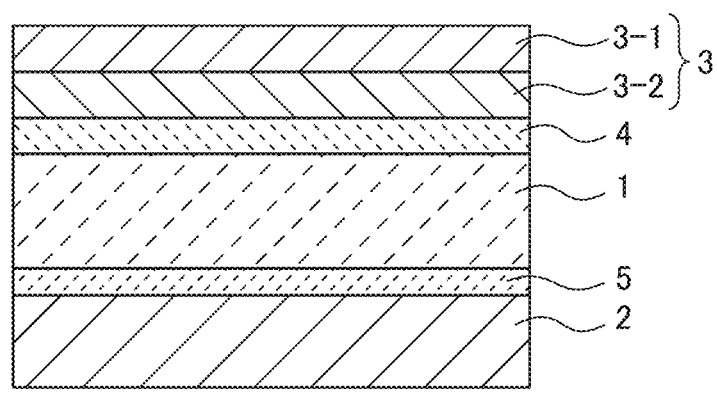
FIG. 21 is a schematic cross-sectional view showing an example of the non-volatile storage element of Example 2.

Referring to FIG. 21, a lower electrode 2 made of titanium nitride (TiN) is used as the substrate, either by itself or formed over another substrate, and atomic layer deposition (ALD) is carried out, first adsorption of (iPrCp)$_3$Y as the yttrium source by several irradiations onto a Si semiconductor substrate surface, then followed by oxidation with an oxygen/argon mixed gas in plasma form, to deposit yttrium oxide (Y$_2$O$_3$). This cycle is repeated several times to deposit an interface layer 5 to 1 nm. ALD is then carried out, adsorption of TDMAH as the hafnium source onto the Y$_2$O$_3$ film of the interface layer 5, followed by oxidation with an oxygen/argon mixed gas in plasma form, and this cycle is repeated to deposit a hafnium oxide film. During the procedure, a yttrium oxide film is inserted by adsorption of yttrium atoms by several irradiations using (iPrCp)$_3$Y as the yttrium source and oxidation by irradiation of an oxygen/argon mixed gas in plasma form, thus depositing a ferroelectric substance 1 composed of a 5% yttrium, hafnium-doped oxide (Y5%-HfO$_2$) to 7.5 nm. By further ALD, the cycle of adsorption using (iEtCp)$_3$Ce as the cerium source onto a 5% yttrium-doped hafnium oxide film, and oxidation with an oxygen/argon mixed gas in plasma form, is repeated to deposit a buffer layer 4 made of cerium oxide (CeO$_x$; x=1.6 to 1.9) to 1 nm. A tungsten layer 3-2 is deposited to 5 nm and a titanium nitride (TiN) layer 3-1 is deposited to 30 nm on the buffer layer 4 by sputtering, to obtain a multilayer second conductive layer 3 composed of TiN/W.

The embodiments for production of the non-volatile storage element of Example 2 also apply for production of the storage elements and storage devices of the other Examples of the invention, assuming that the non-volatile storage element comprises an interface layer. Particularly if a ferroelectric layer composed of a hafnium-type metal oxide is formed at a temperature of 400° C. or lower and preferably lower than 300° C., and the deposited ferroelectric layer is then subjected to activation annealing at a temperature of 400° C. or lower, then it is possible to improve the properties of the ferroelectric layer and ferroelectric storage element, and activation annealing in particular is preferred as it can be carried out at a temperature of 400° C. or lower, thereby allowing it to be carried out after fabrication of a storage element and storage device. It is especially suitable when the storage element and storage device comprise copper wiring or impurity-diffused semiconductor regions.

Example 3: Memory Cell and Memory Cell Array

Example 3 of the invention provides a semiconductor storage device comprising a memory cell having a ferroelectric memory element in combination with a transistor. This includes, for example, a 1-transistor type memory cell (1T-type FeRAM) FeFET, a 1-transistor 1-memory cell (1T1C-type FeRAM), a 2-transistor 2-memory cell (2T2C-type FeRAM), and a memory cell array having such memory cells configured two-dimensionally or three-dimensionally, such as a NOR type memory cell array. It may also comprise a peripheral circuit such as a control circuit that controls the memory cell array.

First Embodiment: 1T-Type Memory Cell

The semiconductor storage device of the first embodiment of Example 3 is a 1-transistor memory cell (1T-type FeRAM) FeFET. The semiconductor storage device (1-transistor memory cell) has at least a semiconductor layer (first conductive layer), an upper electrode (second conductive layer), and a ferroelectric layer composed of a metal oxide between the semiconductor layer as the first conductive layer and the upper electrode as the second conductive layer, has a buffer layer of a metal oxide having oxygen ion conductivity and comprising a metal with a multiple valency present between the ferroelectric layer and the upper electrode, and preferably has an interface layer composed of a single-layer film or multilayer film between the ferroelectric layer and semiconductor layer, the interface layer having a higher dielectric constant than silicon oxide for the interface layer as a whole, the semiconductor layer being present below the ferroelectric layer and the interface layer when the interface layer is present, has the upper electrode as the gate electrode, has the ferroelectric layer and the interface layer when the interface layer is present as the gate insulating film, and has a channel below the gate insulating film of the semiconductor layer, and a source (region) and drain (region) on both sides of the channel. In this semiconductor storage device, the source region or drain region of the semiconductor layer is the first conductive layer, but the source region or drain region may be connected to the source electrode or drain electrode, in which case the source electrode or drain electrode may be referred to as the lower electrode.

Figure 22A:
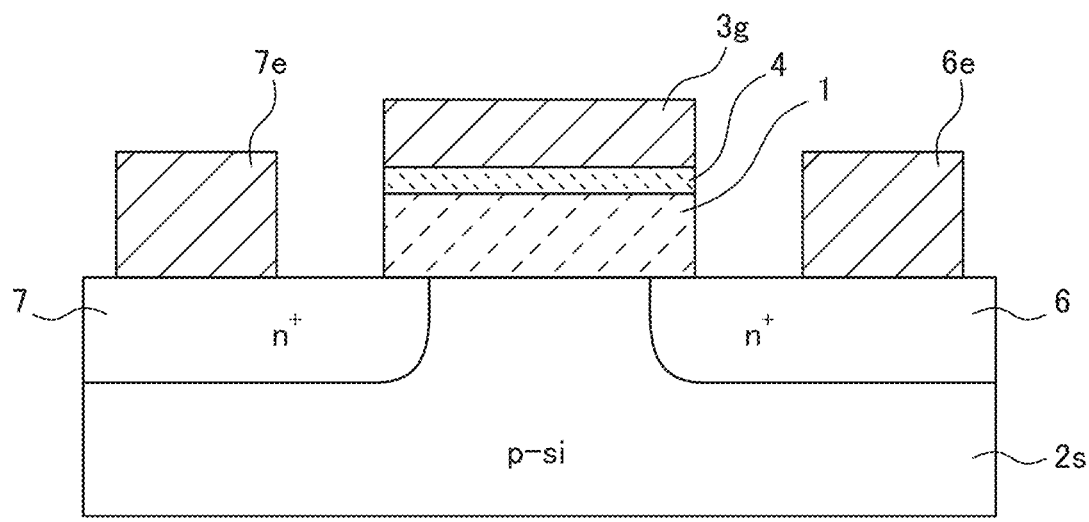
FIGS. 22A and 22B are cross-sectional diagrams schematically showing examples of the 1T-type memory cell of Example 3.
Figure 22B:
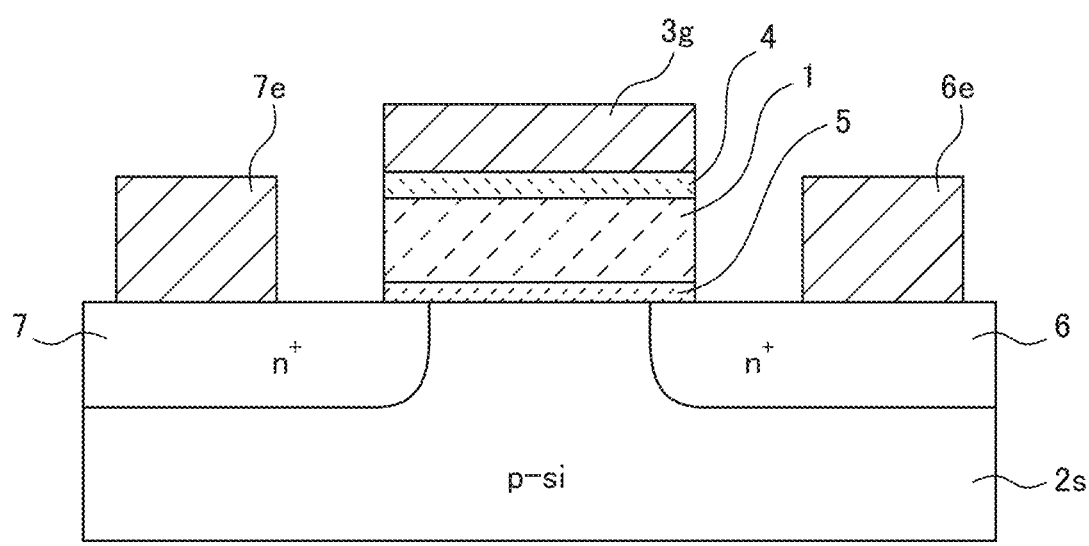
Figure 23A:
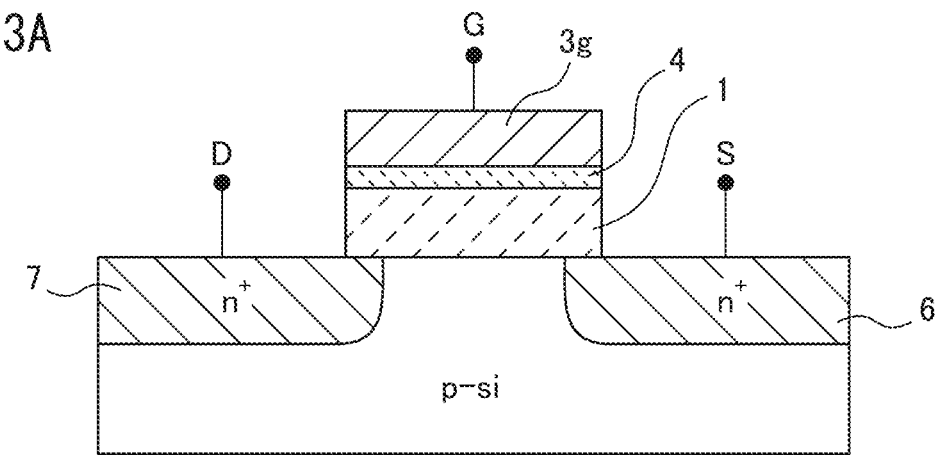
Figure 23B:
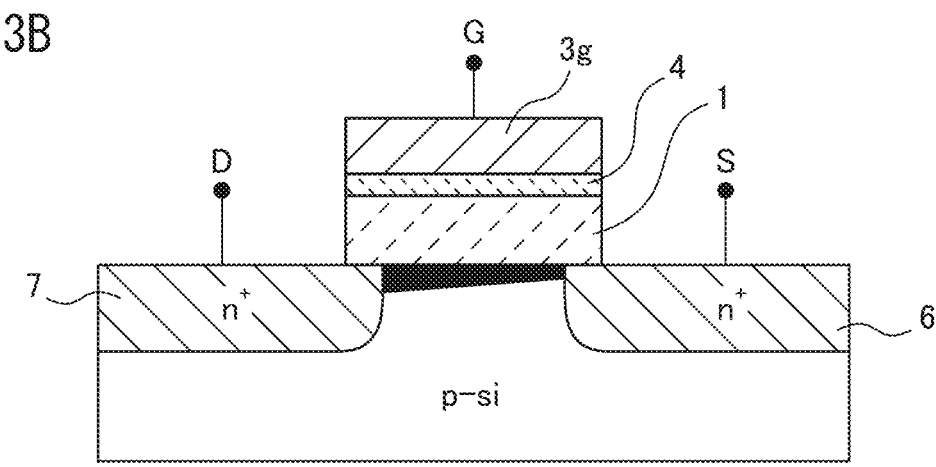

FIGS. 22A and 22B are cross-sectional diagrams schematically showing an example of a 1-transistor memory cell. FIG. 22A is an example without the interface layer 5, and FIG. 22B is an example with the interface layer 5. In FIGS. 22A and 23B, 1 is a ferroelectric layer, 2s is a semiconductor layer (first conductive layer), 3g is a gate electrode (second conductive layer), 4 is a buffer layer, 5 is an interface layer, 6 is a source (region) and 7 is a drain (region). The source (region) 6 and drain (region) 7 of the semiconductor layer 2s may have a source electrode 6e and drain electrode 7e over them, respectively. In FIG. 22B, the buffer layer 4 is between the ferroelectric layer 1 and the gate electrode (second conductive layer) 3g, but it may instead be between the interface layer 5 and the ferroelectric layer 1, or both. The following explanation basically assumes a 1-transistor memory cell in which the buffer layer 4 is between the ferroelectric layer 1 and gate electrode (second conductive layer) 3g, but appropriate modification may be made when the buffer layer 4 is between the interface layer 5 and the ferroelectric layer 1.

Figure 23C:
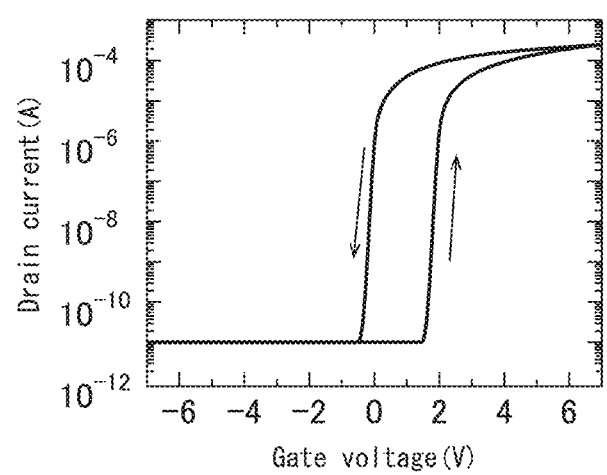
FIG. 23C is a graph showing the drain current-gate voltage characteristic of the transistor.

This 1-transistor memory cell is a field-effect transistor (FET) using a ferroelectric layer as the gate insulating film, wherein the conductance of the FET channel is controlled by the orientation of polarization of the ferroelectric layer, and the state of the threshold (Vth) of the FET is stored by controlling remanent polarization of the ferroelectric substance. The operating principle on which this works is illustrated in FIGS. 23A and 22B. After a positive or negative pulse voltage has been applied to the gate, the polarization direction of the ferroelectric layer forming the gate insulating film can be polarized in one direction, with the orientation of the polarization differing depending on whether the voltage applied to the gate is positive or negative. With the orientation of polarization shown in FIG. 23A, the negative charge at the gate insulating film/semiconductor interface causes the Vth of the FET to relatively shift in the positive direction (Vth1). With the orientation of polarization shown in FIG. 23B, on the other hand, the positive charge at the gate insulating film/semiconductor interface causes the Vth of the FET to relatively shift in the negative direction (Vth2). When the read voltage (Vr) is set to an intermediate voltage between Vth1 and Vth2, since Vth2<Vthr<Vth1, a channel is formed resulting in flow of FET current in the Vth2 state, whereas no current flows in the Vth1 state. Therefore, the threshold voltage of the FeFET varies depending on the orientation of polarization in FIGS. 23A and 23B. Thus, an ON state or OFF state of the FET can be realized by the orientation of polarization of the ferroelectric substance gate insulating film at a same gate voltage, thus allowing storage of information. The drain current-gate voltage characteristic of this transistor can be represented by the hysteresis property shown in FIG. 23C. The hysteresis property indicates change in the threshold voltage of the transistor by ferroelectric polarization. The degree of shift of the threshold voltage (the width of hysteresis for the drain current-gate voltage characteristic) is known as the "memory window", and at least two drain current values can be obtained for the voltage in the memory window.

This 1-transistor memory cell element can reduce power consumption since it is a ferroelectric storage element and allows non-volatile storage by electric field application. The ferroelectric layer 1 is preferably a ferroelectric layer composed of a metal oxide of a fluorite-type orthorhombic crystal. The metal oxide of the ferroelectric layer 1 is preferably a metal oxide comprising hafnium (Hf), zirconium (Zr), cerium (Ce) or two or more of such elements, especially hafnium (Hf), zirconium (Zr) or both. More suitable is a metal oxide that comprises hafnium (Hf), zirconium (Zr), cerium (Ce) or two or more of such elements, in particular hafnium (Hf), zirconium (Zr) or both elements, and at least one metal element (additional element) selected from the group consisting of aluminum (Al), silicon (Si), strontium (Sr), barium (Ba) and rare earth elements (Sc, Y, La, Ce, Pr, Nd, Sm, Eu, Gd, Tb, Dy, Ho, Er, Tm, Yb and Lu).

When the hafnium-type metal oxide comprises an additional metal, the amount of the additional metal may be an amount that forms a ferroelectric substance, and generally the number of moles of the additional metal is preferably 10 mol % or lower, more preferably 0.1 to 10% or even 4 to 9 mol %, with 100 mol % as the total of the metals of all of the metal oxides comprising the additional metal.

The film thickness of the ferroelectric layer 1 is not particularly restricted since the desirable film thickness depends on the intended purpose of the non-volatile storage element, but according to a preferred embodiment the film thickness of the ferroelectric layer 1 may be 1 nm to 100 nm, more preferably 2 nm to 50 nm and even more preferably 2 nm to 20 nm or 2 nm to 5 nm. The hafnium-type metal oxide exhibits more excellent ferroelectricity even as a thin film of 10 nm or smaller, compared to conventional ferroelectric substances such as PZT, and it is therefore suitably scalable as a ferroelectric layer for a non-volatile storage element.

The second conductive layer 3 functions as an electrode for application of voltage to the ferroelectric layer 1, and it may be composed of metal, a conductive ceramics or a conductive semiconductor. The metals may be tungsten, titanium, gold, silver, copper, platinum, aluminum and the like, the conductive ceramics may be conductive nitrides such as titanium nitride (TiN), conductive silicides such as nickel disilicide (NiSi$_2$), and conductive oxides such as indium-tin oxide (ITO). The conductive layer (semiconductor layer 2s) on the opposite side from the second conductive layer 3 may be a doped or intrinsic semiconductor, such as silicon or a compound semiconductor.

In the semiconductor storage device, a buffer layer 4 with oxygen ion conductivity is present between the ferroelectric layer 1 and gate electrode 3g. The buffer layer 4 is made of a normal dielectric material (insulator material) which is a metal oxide exhibiting oxygen ion conductivity and comprising a metal with multiple valency. By being a normal dielectric material (insulator material) of a metal oxide exhibiting oxygen ion conductivity and comprising a metal with multiple valency, the buffer layer 4 provides a function of preventing or repairing oxygen defects caused by electric field stress during write/erase cycle in the ferroelectric layer 1 or at the interface between the ferroelectric layer 1 and the conductive layer, thereby reducing leakage current and improving the ferroelectric property, making it possible to reduce the anti-electric field and to exhibit an effect of improving the write/erase cycle properties.

The chemical potential of the oxygen in the buffer layer 4 is preferably higher than the chemical potential of the oxygen in the ferroelectric layer 1. The oxygen vacancy defect density of the buffer layer 4 is preferably lower than the oxygen vacancy defect density of the ferroelectric layer 1. If the chemical potential of the oxygen in the buffer layer 4 is higher than the chemical potential of the oxygen in the ferroelectric layer 1, or the oxygen vacancy defect density of the buffer layer 4 is lower than the oxygen vacancy defect density of the ferroelectric layer 1, then oxygen ions will easily migrate from the buffer layer 4 into the ferroelectric layer 1, thereby allowing the oxygen defects in the ferroelectric layer 1 or at the interface between the ferroelectric layer 1 and conductive layer to be prevented or repaired.

The normal dielectric material (insulator material) of the buffer layer 4 that exhibits oxygen ion conductivity and comprises a metal with multiple valency, may be, for example, a cerium oxide film ($CeO_x$) (x=1.5-2.0, preferably 1.6-2.0, more preferably 1.7-2.0 and most preferably 1.8-2.0), or a zirconium oxide film, titanium oxide film, yttria-stabilized zirconia film or rare earth element oxide film.

The thickness of the buffer layer 4 is preferably 0.1 nm or greater, and even more preferably 0.5 nm or greater, 1 nm or greater or 1.5 nm or greater. The film thickness of the buffer layer 4 is also preferably 10 nm or smaller, and more preferably 6 nm or smaller, 5 nm or smaller, 4 nm or smaller or 3 nm or smaller.

According to a preferred embodiment of the semiconductor storage device, it also has an interface layer 5 composed of a single-layer film or multilayer film between the semiconductor layer 2s (first conductive layer: lower electrode) and ferroelectric layer 1, the interface layer 5 as a whole having higher dielectric constant than silicon oxide. However, when the buffer layer 4 is present between the ferroelectric layer 1 and the semiconductor layer 2s (first conductive layer: lower electrode), the interface layer 5 will be present between the semiconductor layer 2s (first conductive layer: lower electrode) and the buffer layer 4. If the interface layer 5 is present between the ferroelectric layer 1 and the semiconductor layer 2s, since a higher partial voltage of the voltage applied between both electrodes (first and second conductive layer) is applied to the ferroelectric layer 1 during write/erase cycle, it is possible to apply sufficient voltage for polarization reversal to the ferroelectric layer 1 with a smaller voltage between the electrodes, compared to when the interface layer 5 is not present.

The interface layer 5 is preferably composed of a high dielectric material and has higher dielectric constant than the dielectric constant of a silicon oxide film (relative dielectric constant: about 3.9), and most preferably it is a high dielectric material with a dielectric constant of greater than the dielectric constant of a silicon nitride film (relative dielectric constant: about 7.8). It is most preferably an oxide film or silicate film. The dielectric constant of the interface layer 5 is preferably higher than about 3.9 as the relative dielectric constant, and more preferably it is about 5 or higher or about 7.8 or higher.

The interface layer 5 is preferably in direct contact with the first conductive layer (lower electrode) 2. However, since a very thin surface oxidation film tends to form on the surface of the first conductive layer (lower electrode) 2, the surface oxidation film may be considered part of the interface layer 5. If the surface oxidation film is considered part of the interface layer 5 then the interface layer 5 is composed of not a single-layer film but rather a multilayer film (composite film), but it is sufficient if the portions other than the surface oxidation film have higher dielectric constant than silicon oxide and the composite film as a whole has higher dielectric constant than silicon oxide. Needless to mention the interface layer itself apart from the surface oxidation film may also be a multilayer film.

The interface layer 5 preferably has a function of inhibiting movement of oxygen from the ferroelectric layer 1 to the first conductive layer 2 side. This can provide an effect of inhibiting generation of oxygen defects in the ferroelectric layer 1.

The interface layer 5 is preferably an oxide of the metal composing the metal oxide of the ferroelectric layer. For example, when the ferroelectric layer 1 is a yttrium-doped hafnium-type metal oxide (Y—$HfO_2$), yttrium silicate (YSiO), hafnium silicate (HfSiO), yttrium oxide ($Y_2O_3$) or the like is preferred. In addition, regardless of the metal composing the metal oxide of the ferroelectric layer, the metal composing the hafnium-type metal oxide that comprises an additional metal may be an oxide or silicate of a metal such as hafnium (Hf), zirconium (Zr), cerium (Ce), aluminum (Al), silicon (Si), strontium (Sr), barium (Ba) or a rare earth element (Sc, Y, La, Ce, Pr, Nd, Sm, Eu, Gd, Tb, Dy, Ho, Er, Tm, Yb, Lu). Such an interface layer 5 has chemical similarity with the ferroelectric layer 1 and can exhibit excellent properties for the interface and excellent film quality for the ferroelectric layer as well.

The semiconductor layer 2s, source (region) 6 and drain (region) 7 may all have the respective constructions used in conventional gate insulating film-type transistors. For example, the semiconductor layer 2s may be a p-type silicon semiconductor doped with P or As, and the source (region) 6 and drain (region) 7 may be $n^+$-type doped regions highly doped with B.

The present invention has a characteristic effect making it possible to reduce leakage current and improve and increase the reliability and especially write/erase endurance of a 1-transistor memory cell in a ferroelectric memory. In addition, by optimizing the interface layer thickness and interface properties, the invention also provides an effect of reducing the phenomenon whereby electrons are injected into defects in the ferroelectric layer or interface from the channel region of the memory transistor when a positive voltage has been applied to the gate electrode for operation in a direction to lower the threshold voltage (Vth), which is one of the particular issues for reliability of 1-transistor memory cells. The memory transistor was explained above using an nMOS transistor as the example, but needless to mention the invention can also be applied for a pMOS memory transistor, to obtain an effect of improving reliability, and especially write/erase endurance, similar to an nMOS transistor.

A preferred example of the memory cell of Example 3 will now be described with reference to FIG. 22B. Continuous deposition of the interface layer 5, ferroelectric layer 1 and buffer layer 4 by atomic layer deposition (ALD) for this example allows excellent commercial productivity to be achieved. This example, however, is not limited to the non-volatile storage element and method for producing it according to Example 3, and the types of materials, layer thicknesses and film-forming conditions may be appropriately modified.

This example has a 3-layer element structure comprising the buffer layer/ferroelectric layer/interface layer structure shown in FIG. 22B, and specifically, it is a transistor-type memory cell (FeFET) having a construction comprising a lower electrode 2 as the source region 6 and drain region 7 in a TiN/W multilayer structure gate electrode (upper electrode) 3g/CeO$_x$ buffer layer 4/Y5%-HfO$_2$ ferroelectric substance 1/Y-silicate (Y$_2$Si$_2$O$_7$) interface layer 5/Si semiconductor substrate 2s.

Using the Si semiconductor substrate 2s with the source region 6 and drain region 7 formed by a CMOS process as the substrate, atomic layer deposition (ALD) is carried out, i.e., adsorption by several irradiations of (iPrCp)$_3$Y as the yttrium source on a Si semiconductor substrate surface followed by oxidation with an oxygen/argon mixed gas in plasma form, to deposit yttrium oxide (Y$_2$O$_3$). This cycle is repeated several times to deposit an interface layer 5 to 1 nm. ALD is then carried out for adsorption using tetrakis(dimethylamino)hafnium (TDMAH) as the hafnium source onto the Y$_2$O$_3$ film of the interface layer 5, followed by oxidation with an oxygen/argon mixed gas in plasma form, and this cycle is repeated to deposit a hafnium oxide film. During the procedure, a yttrium oxide film is inserted by adsorption of yttrium atoms by several irradiations using (iPrCp)$_3$Y as the yttrium source and oxidation by irradiation of an oxygen/argon mixed gas in plasma form, thus depositing a ferroelectric substance 1 composed of a 5% yttrium, hafnium-doped oxide (Y5%-HfO$_2$) to 7.5 nm. By further ALD, the cycle of adsorption onto a 5% yttrium-doped hafnium oxide film using (iEtCp)$_3$Ce as the cerium source, and oxidation with an oxygen/argon mixed gas in plasma form, is repeated to deposit a buffer layer 4 made of cerium oxide (CeO$_x$; x=1.6 to 1.9) to 1 nm. A tungsten layer 3-2 was deposited to 5 nm and a titanium nitride (TiN) layer 3-1 was deposited to 30 nm on the buffer layer 4 by sputtering, to obtain a multilayer second conductive layer 3 composed of TiN/W.

Next, the interface layer 5 multilayer structure: TiN/W multilayer structure gate electrode (upper electrode) 3g/CeO$_x$ buffer layer 4/Y5%-HfO$_2$ ferroelectric substance 1/Y-Silicate(Y2Si$_2$O$_7$), formed on the Si semiconductor substrate 2s, is patterned by reactive ion etching to form a gate electrode on the channel region between the source region 6 and drain region 7 formed on the Si semiconductor substrate 2s. In addition, a source-drain electrode material is formed on the Si semiconductor substrate 2s and patterned by reactive ion etching to form a source electrode 6e and drain electrode 7e.

After the source electrode 6e and drain electrode 7e have been formed, post annealing is carried out at 500° C. for 1 minute in the forming gas atmosphere for activation of the ferroelectric substance 1. Activation annealing of the ferroelectric substance 1 may also be carried out immediately after deposition of the ferroelectric substance 1, but it can be carried out after formation of the buffer layer 4 or after formation of the gate electrode 3g in order to improve the quality of the layered structure of the interface layer 5, ferroelectric substance 1 and buffer layer 4.

The matters described in the method for producing a non-volatile storage element in Example 1 and Example 2 also apply for production of a semiconductor storage device according to the first embodiment of Example 3. A ferroelectric memory transistor is particularly effective for formation at the backend instead of the frontend. If a ferroelectric layer composed of a hafnium-type metal oxide is formed at a temperature of 400° C. or lower and preferably lower than 300° C., and the deposited ferroelectric layer is then subjected to activation annealing (AA) at a temperature of 400° C. or lower, then it is possible to improve the properties of the ferroelectric layer and ferroelectric storage element, and AA in particular is preferred as it can be carried out at a temperature of 400° C. or lower, thereby allowing it to be carried out after fabrication of a storage element and storage device. It is suitable when the storage device comprises copper wiring or impurity-diffused semiconductor regions. For the first embodiment of Example 3, however, activation annealing for phase transition to a ferroelectricity-exhibiting ferroelectric layer composed of a hafnium-type metal oxide is not limited to being carried out at 400° C. or lower, and it may be carried out at a temperature of higher than 400° C. Particularly when a transistor-type memory cell (FeFET) is formed at a frontend, the temperature for activation annealing for phase transition of the metal oxide film to a ferroelectric layer may be 400° C. or higher.

Second Embodiment: 1T1C-Type Memory Cell

The semiconductor memory device according to the second embodiment of Example 3 is a 1-transistor 1-capacitor memory cell (1T1C-type FeRAM) FeFET, as a memory cell comprising one ferroelectric capacitor (ferroelectric memory element) and one select transistor, wherein the ferroelectric capacitor has at least a first conductive layer, a ferroelectric layer composed of a metal oxide, a second conductive layer, and a buffer layer of a metal oxide situated between the first conductive layer and/or second conductive layer, having oxygen ion conductivity and comprising a metal with multiple valency, and preferably has an interface layer composed of a single-layer film or multilayer film between the ferroelectric layer and first conductive layer, the interface layer as a whole having higher dielectric constant than silicon oxide, and when a buffer layer is present between the first conductive layer and the ferroelectric layer, the interface layer being present between the first conductive layer and the buffer layer, while the select transistor is a transistor comprising a source, drain and gate, or a bipolar diode.

Figure 24A:
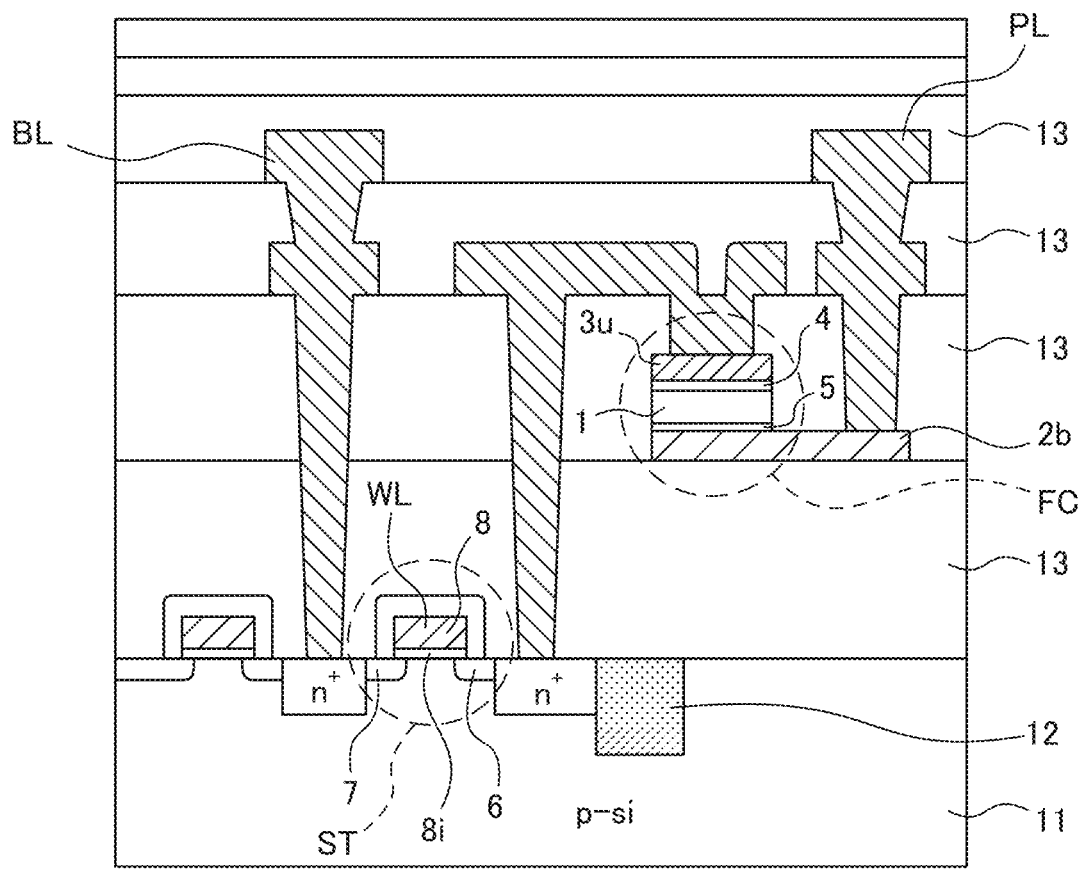
FIGS. 24A and 24B are a cross-sectional diagram and a circuit diagram, respectively, which schematically show an example of the 1T1C-type memory cell of Example 3.

FIG. 24A is a cross-sectional diagram schematically showing an example of a 1-transistor 1-capacitor memory cell. In FIG. 24A, 1 is a ferroelectric layer, 2b is a lower electrode (first conductive layer), 3u is an upper electrode (second conductive layer), 4 is a buffer layer and 5 is an optional interface layer (the interface layer may be omitted), a ferroelectric capacitor FC being composed of these, 6 is a source region, 7 is a drain region, 8 is a gate electrode, 8i is a gate insulating film, a select transistor ST being composed of these, and the first conductive layer 2 (or second conductive layer 3) of the ferroelectric capacitor FC and the source region 6 (or drain region 7) of the select transistor ST being electrically connected by wiring. Also, 11 is a semiconductor layer, 12 is a device isolation film (Shallow Trench Isolation) and 13 is an interlayer insulation film. Device isolation may of course be done by LOCOS isolation or other device isolation techniques. The structure of the plug and ferroelectric capacitor on the drain diffusion layer is a structure without the ferroelectric capacitor configuration directly on the plug (off-plug structure), but it may also be an on-plug structure with the ferroelectric capacitor configuration directly on the plug. In FIG. 24A, the buffer layer 4 of the ferroelectric capacitor FC may be between the ferroelectric layer 1 and upper electrode 3u, between the ferroelectric layer 1 and interface layer 5, or both. The following explanation basically assumes a 1-transistor 1-capacitor memory cell with a ferroelectric capacitor FC in which the buffer layer 4 is between the ferroelectric layer 1 and upper electrode 3u, but appropriate modification may be made when the buffer layer 4 is between the interface layer 5 and the ferroelectric layer 1.

Referring to FIG. 24A, a device isolation film 12 is formed by selective oxidation of the p-type semiconductor layer 11, and in the element region within the device isolation film 12, an n$^+$-type source region 6 and n$^+$-type drain region 7 are formed by selective doping across the gate region. A gate insulating film 8$i$ is formed on the surface of the semiconductor layer 11 in the channel-forming region between the n$^+$-type source region 6 and n$^+$-type drain region 7, and a gate electrode 8 is formed over it, forming an MIS gate transistor. The nature of the present invention is the same even if the source and drain regions have an LDD structure with a low concentration extension region, or a halo structure to inhibit the punch-through effect as a FET short channel effect. The area around the gate insulating film 8$i$ and gate electrode 10 is insulated by covering with an insulating film such as a nitride. The interlayer insulation film 13 is formed on the semiconductor layer 11 and gate section, but the n$^+$-type source region 6 and n$^+$-type drain region 7 of the semiconductor layer 11 are connected with a bit line BL provided above by a via formed in the interlayer insulation film 13, and the ferroelectric capacitor FC, respectively, through an n$^+$-type source pick-up region and an n$^+$-type drain pick-up region, respectively. The ferroelectric capacitor FC is formed by lamination on the interlayer insulation film 13, and it is composed of a lower electrode 2$b$, interface layer 5, ferroelectric layer 1, buffer layer 4 and upper electrode 3$u$. The interface layer 5 is optional and may be omitted. The construction of the ferroelectric capacitor FC may be the same as in the non-volatile storage element of the Example 1. The ferroelectric capacitor FC is insulated by covering with a second interlayer insulation film 13. Above the second interlayer insulation film 13, the lower electrode 2$b$ is connected to an earth (plate wire) PL through a via. In FIG. 24A, the source region 6 is connected to the upper electrode 3$u$, but it may instead be connected to the lower electrode 2$b$, with the upper electrode 3$u$ connected to an earth (plate wire) PL. In regard to the gate electrode 10, the gate electrodes 10 of multiple select transistors ST are connected together by word lines WL.

Figure 24B:
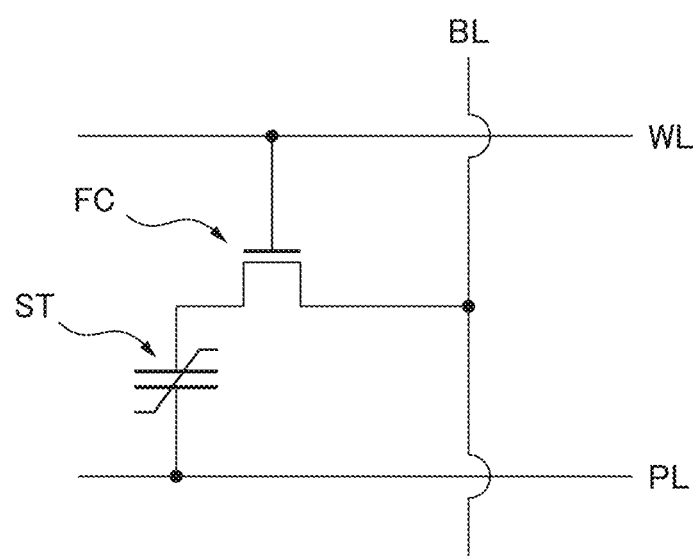

Referring to the 1-transistor 1-capacitor memory cell circuit diagram in FIG. 24B, the lower electrode 2$w$ of the ferroelectric capacitor FC is connected with the source region 6 (or drain region 7) of the select transistor ST by wiring, while the upper electrode 3$u$ of the ferroelectric capacitor FC is connected with the plate wire PL. The drain region 7 (or source region 6) of the select transistor ST is connected with the bit line BL, and the gate electrode 8 of the select transistor ST is connected with the word line WL.

In this 1-transistor 1-capacitor memory cell, voltage is applied to the ferroelectric capacitor FC to cause polarization of the ferroelectric substance, but the voltage applied to the gate electrode 3$g$ of the select transistor ST is also controlled to turn current on and off between the source/drain, while also changing the relative polarity of the voltage on the ferroelectric capacitor FC to allow reversal of the orientation of ferroelectric polarization, so that information can be written. Reading out of data is accomplished by converting the level of electrical charge released when a voltage pulse has been applied to the ferroelectric capacitor, into voltage by the capacity of the bit line, and detecting it. It is therefore possible to carry out writing, erasing and reading of data by controlling the orientation of polarization of the ferroelectric layer in the ferroelectric memory cell with applied voltage. Since the orientation of polarization of the ferroelectric layer is conserved even during standby, the memory cell operates as a voltage-driven, non-volatile memory cell. Since the orientation of polarization of the ferroelectric layer is also conserved even when no current is flowing, the memory cell is a voltage-driven, non-volatile memory cell. A plurality of 1-transistor 1-capacitor memory cells may be arranged vertical and horizontally and connected together with plate wires PL, bit lines BL and word lines WL, to allow writing, erasing and reading of data for each bit line BL, for each word line WL or for each select transistor ST selected by bit line BL and word line WL.

In this 1-transistor 1-capacitor memory cell as well, the ferroelectric capacitor FC is voltage-driven and is a non-volatile memory element, allowing the memory cell to have low power consumption. In the ferroelectric memory element of the invention, a metal oxide having oxygen ion conductivity and comprising a metal with multiple valency is provided between the ferroelectric layer and the electrode (conductive layer). By providing a buffer layer, the write/erase cycle property can be improved to $10^{11}$ cycle or more, for example, thus allowing it to substitute even for conventional volatile memories such as DRAM or SRAM.

The buffer layer is made of a normal dielectric material (insulator material) which is a metal oxide exhibiting oxygen ion conductivity and comprising a metal with multiple valency. By being a normal dielectric material (insulator material) of a metal oxide exhibiting oxygen ion conductivity and comprising a metal with multiple valency, the buffer layer provides a function of controlling the number of oxygen defects caused by electric field stress during write/erase cycle in the ferroelectric layer or at the interface between the ferroelectric layer and the conductive layer, to inhibit or repair oxygen defects, thereby reducing leakage current and improving the ferroelectric property, making it possible to reduce the anti-electric field and to exhibit an excellent effect of improving the write/erase cycle property. The chemical potential of the oxygen in the buffer layer is preferably greater than the chemical potential of the oxygen in the ferroelectric layer. The oxygen vacancy defect density of the buffer layer is preferably lower than the oxygen vacancy defect density of the ferroelectric layer. If the chemical potential of the oxygen in the buffer layer is greater than the chemical potential of the oxygen in the ferroelectric layer, or the oxygen vacancy defect density of the buffer layer is lower than the oxygen vacancy defect density of the ferroelectric layer, then oxygen ions will easily migrate from the buffer layer into the ferroelectric layer, thereby allowing generation of oxygen defects in the ferroelectric layer or at the interface between the ferroelectric layer and conductive layer 3 to be inhibited or repaired. With the ferroelectric storage element of the invention, providing a buffer layer with oxygen ion conductivity between the ferroelectric layer and electrode (conductive layer) can improve the write/erase cycle property to $10^{11}$ cycle or more, for example, thus allowing it to be used as a non-volatile storage with low power consumption that can substitute for some of the functions of a conventional volatile memory such as DRAM or SRAM.

The normal dielectric material (insulator material) in the buffer layer, as a metal oxide that exhibits oxygen ion conductivity and comprises a metal with multiple valency, may be, for example, a cerium oxide film (CeO$_x$) (x=1.5-2.0, preferably 1.6-2.0, more preferably 1.7-2.0 and most preferably 1.8-2.0), or a zirconium oxide film, a titanium oxide film, a yttria-stabilized zirconia film or a rare earth element oxide film.

The ferroelectric layer is a ferroelectric layer composed of a metal oxide. The ferroelectric layer is preferably a metal oxide comprising hafnium (Hf), zirconium (Zr), cerium (Ce) or two or more of such elements, and especially hafnium (Hf), zirconium (Zr) or both. More suitable is a metal oxide that comprises hafnium (Hf), zirconium (Zr), cerium (Ce) or two or more of such elements, especially hafnium (Hf), zirconium (Zr) or both elements, and at least one metal element (additional metal) selected from the group consisting of aluminum (Al), silicon (Si), strontium (Sr), barium (Ba) and rare earth elements (Sc, Y, La, Ce, Pr, Nd, Sm, Eu, Gd, Tb, Dy, Ho, Er, Tm, Yb and Lu).

When the hafnium-type metal oxide comprises an additional element, the amount of the additional element may be an amount that forms a ferroelectric substance, and generally the number of moles of the additional metal element is preferably 10 mol % or lower, more preferably 0.1 to 10% or even 4 to 9 mol %, with 100 mol % as the total of the metals of all of the metal oxides comprising the additional metal.

The film thickness of the ferroelectric layer is not particularly restricted since the desirable film thickness depends on the intended purpose of the non-volatile storage element, but according to a preferred embodiment the film thickness of the ferroelectric layer 1 may be 1 nm to 100 nm, more preferably 2 nm to 50 nm and even more preferably 2 nm to 20 nm or 2 nm to 10 nm. The hafnium-type metal oxide exhibits more excellent ferroelectricity even as a thin film of 10 nm or smaller, compared to conventional ferroelectric substances such as PZT, and it is therefore suitably scalable as a ferroelectric layer for a non-volatile storage element.

The interface layer is composed of a single-layer film or multilayer film, the interface layer as a whole having higher dielectric constant than silicon oxide, but preferably the interface layer is composed of a normal dielectric material and has higher dielectric constant than the dielectric constant of a silicon oxide film (relative dielectric constant: about 3.9), and most preferably it is an oxide film or silicate film with higher dielectric constant than the dielectric constant of a silicon nitride film (relative dielectric constant: about 7.8). The interface layer 5 is preferably an oxide of the metal composing the metal oxide of the ferroelectric layer. For example, when the ferroelectric layer 1 is a yttrium-doped hafnium-type metal oxide (Y—$HfO_2$), yttrium silicate (YSiO), hafnium silicate (HfSiO), yttrium oxide ($Y_2O_3$) or the like is preferred. Such an interface layer 5 has chemical similarity with the ferroelectric layer 1 and can exhibit excellent properties for the interface and excellent film quality for the ferroelectric layer as well, while improving the ferroelectric property by low voltage operation. The interface layer inhibits tunnel current of electrons injected through the FeFET channels during writing by relative thickening of the interface layer (tunnel insulating film), resulting in improvement in deterioration of write/erase endurance.

The interface layer is preferably in direct contact with the first conductive layer (lower electrode). However, since a very thin surface oxidation film tends to form on the surface of the first conductive layer (lower electrode), the surface oxidation film may be considered part of the interface layer. If the surface oxidation film is considered part of the interface layer then the interface layer is composed of not a single-layer film but rather a multilayer film (composite film), but it is sufficient if the composite film as a whole has higher dielectric constant than silicon oxide. Needless to mention the interface layer itself apart from the surface oxidation film may also be a multilayer film.

The interface layer preferably has a function of inhibiting movement of oxygen from the ferroelectric layer to the first conductive layer side. This can provide an effect of inhibiting generation of oxygen defects in the ferroelectric layer.

The electrodes (conductive layers) may be composed of metals such as tungsten or titanium, or conductive ceramic or conductive semiconductors, but the lower electrode of the ferroelectric layer in particular is preferably a conductive material, e.g. a conductive silicide such as nickel disilicide ($NiSi_2$), since this will help improve the film quality of the hafnium-type metal oxide that is to be formed on it. It may also be a two-layer structure electrode, such as TiN/W.

The embodiments described in the method for producing a non-volatile storage element in Example 1 and Example 2 also apply for production of a semiconductor storage device according to the second embodiment of Example 3. If a ferroelectric layer composed of a hafnium-type metal oxide is formed at a temperature of 400° C. or lower and preferably lower than 300° C., and the deposited ferroelectric layer is then subjected to activation annealing at a temperature of 400° C. or lower then it is possible to improve the properties of the ferroelectric layer and ferroelectric storage element, and activation annealing in particular is preferred as it can be carried out at a temperature of 400° C. or lower, thereby allowing it to be carried out after fabrication of a storage element and storage device. For the second embodiment of Example 3, however, activation annealing is not limited to being carried out at 400° C. or lower, and it may be carried out at a temperature of higher than 400° C.

Third Embodiment: 2T2C-Type Memory Cell

The semiconductor memory device of the third embodiment of Example 3 is a 2-transistor 2-capacitor memory cell (2T2C-type FeRAM) FeFET, the 2T2C-type memory cell having two 1T1C memory cells paired to store one piece of data.

Figure 25A:
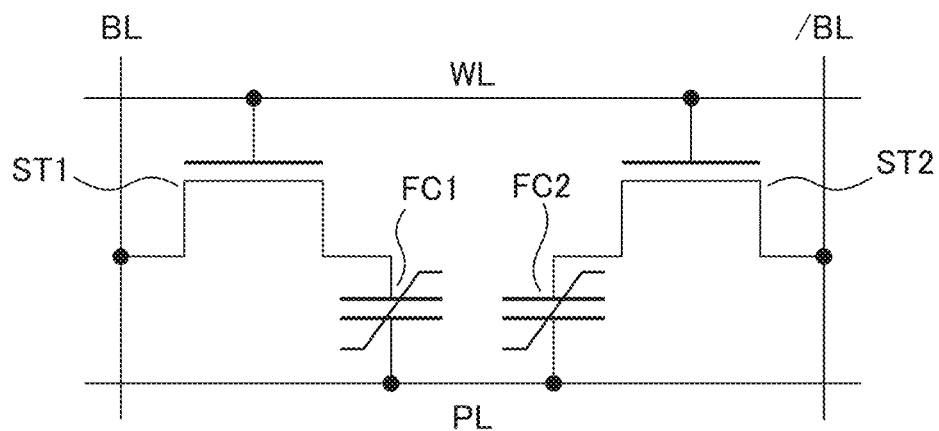
FIG. 25A is a circuit diagram for the 2T2C-type memory cell of Example 3.

Referring to the circuit diagram of FIG. 25A, the 2T2C-type capacitor memory cell (2T2C-type FeRAM) is composed of two 1T1C-type memory cells at left and right, each of the two 1T1C-type memory cells being composed of a select transistor ST and a ferroelectric capacitor FC. The 2-transistor 2-capacitor memory cell has one word line WL and two (a pair of) bit lines BL, with one 1T1C-type memory cell sharing the word line WL linked with one bit line BL and the other 1T1C-type memory cell linked with one bit line/BL.

Data of different polarities are written into the pair of memory cells. For example, when remanent polarization in the "positive" direction has been written in the cell of one bit line BL, remanent polarization in the "negative" direction is written into the cell of the other bit line/BL. Writing of data into the 2T2C-type memory cell increases the voltage in the word line WL. This necessarily causes polarization reversal only in one of the capacitors. As polarization reversal occurs, the voltage increases in either one bit line BL or the other bit line/BL. The exceedingly superior embodiment of the 2T2C-type is that data reading is stabilized and it is resistant to repeated operation (has a long operating life). While a ferroelectric material has the characteristic nature of undergoing "fatigue", or reduced remanent polarization, with repeated polarization reversal, a 2T2C-type is less likely to suffer fatigue.

Figure 25B:
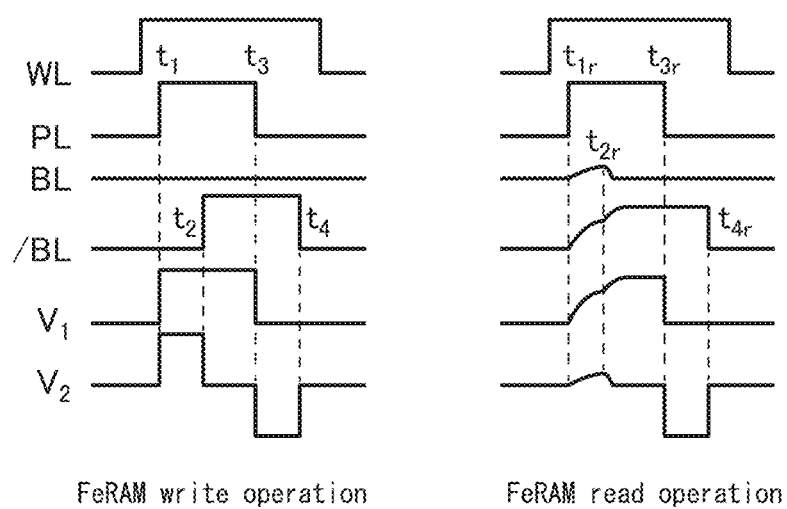
FIG. 25B is a diagram showing write operation and read operation in the 2T2C-type memory cell.

FIG. 25B shows a write operation and read operation in a 2T2C-type FeRAM. In FIG. 25B, voltage is applied to the selected memory cell, at the word line WL, plate wire PL and two bit lines BL,/BL, as shown, where V1 and V2 are the voltages applied to the ferroelectric capacitor FC1 and ferroelectric capacitor FC2, respectively. The designations t1 to t4 are the respective times.

Since the structure of the 2-transistor 2-capacitor memory cell is a structure in which 1-transistor 1-capacitor memory cells are connected to allow complementary operation, the structure of the memory cell itself is as shown in FIG. 23.

Since the structure of the 2-transistor 2-capacitor memory cell is a structure with the 1-transistor 1-capacitor memory cells asymmetrically connected, each of the 1-transistor 1-capacitor memory cells is the same as a memory cell of the second embodiment, with only the manner of connection (wiring) between the memory cells being different, and therefore the structure of the memory cell itself is as shown in FIG. 23.

In this 2-transistor 2-capacitor memory cell as well, the ferroelectric capacitor is voltage-driven and is a non-volatile memory element, allowing the memory cell to have low power consumption. The ferroelectric storage element is a metal oxide having oxygen ion conductivity according to the invention and comprising a metal with multiple valency provided between the ferroelectric layer and the electrode (conductive layer). By providing a buffer layer, the write/erase cycle property can be notably improved, thus allowing it to substitute even for conventional volatile memories such as DRAM or SRAM.

The buffer layer is made of a metal oxide exhibiting oxygen ion conductivity and comprising a metal with multiple valency. By being a metal oxide exhibiting oxygen ion conductivity and comprising a metal with multiple valency, the buffer layer provides a function of preventing or repairing oxygen defects caused by electric field stress during write/erase cycle in the ferroelectric layer or at the interface between the ferroelectric layer and the conductive layer, thereby reducing leakage current and improving the ferroelectric property, making it possible to reduce the anti-electric field and to exhibit an effect of improving the write/erase cycle properties. The chemical potential of the oxygen in the buffer layer is preferably greater than the chemical potential of the oxygen in the ferroelectric layer. The oxygen vacancy defect density of the buffer layer is preferably lower than the oxygen vacancy defect density of the ferroelectric layer. If the chemical potential of the oxygen in the buffer layer is higher than the chemical potential of the oxygen in the ferroelectric layer, or the oxygen vacancy defect density of the buffer layer is lower than the oxygen vacancy defect density of the ferroelectric layer, then oxygen ions will easily migrate from the buffer layer into the ferroelectric layer, thereby allowing oxygen defects in the ferroelectric layer or at the interface between the ferroelectric layer and conductive layer 3 to be prevented or repaired.

The normal dielectric material (insulator material) in the buffer layer, which is a metal oxide that exhibits oxygen ion conductivity and comprises a metal with multiple valency, may be a cerium oxide film ($CeO_x$ (x=1.5-2.0, preferably 1.6-2.0, more preferably 1.7-2.0 and most preferably 1.8-2.0)), or a zirconium oxide film, a titanium oxide film, a yttria-stabilized zirconia film or a rare earth element oxide film.

The ferroelectric layer of the ferroelectric capacitor is a ferroelectric layer composed of a metal oxide. The ferroelectric layer is preferably a metal oxide comprising hafnium (Hf), zirconium (Zr), cerium (Ce) or two or more of such elements, especially hafnium (Hf), zirconium (Zr) or both. More suitable is a metal oxide that comprises hafnium (Hf), zirconium (Zr), cerium (Ce) or two or more of such elements, preferably hafnium (Hf), zirconium (Zr) or both elements, and at least one metal element (additional metal) selected from the group consisting of aluminum (Al), silicon (Si), strontium (Sr), barium (Ba) and rare earth elements (Sc, Y, La, Ce, Pr, Nd, Sm, Eu, Gd, Tb, Dy, Ho, Er, Tm, Yb and Lu).

When the hafnium-type metal oxide comprises an additional metal, the amount of the additional metal may be an amount that forms a ferroelectric substance, and generally the number of moles of the additional metal is preferably 10 mol % or lower, more preferably 0.1 to 10% or even 4 to 9 mol %, with 100 mol % as the total of the metals of all of the metal oxides comprising the additional metal.

The film thickness of the ferroelectric layer is not particularly restricted since the desired film thickness is used depending on the intended purpose of the non-volatile storage element, but according to a preferred embodiment the film thickness of the ferroelectric layer 1 may be 1 nm to 100 nm, more preferably 2 nm to 50 nm and even more preferably 2 nm to 20 nm or 2 nm to 10 nm. The hafnium-type metal oxide exhibits more excellent ferroelectricity even as a thin film of 10 nm or smaller, compared to conventional ferroelectric substances such as PZT, and it is therefore suitably scalable as a ferroelectric layer for a non-volatile storage element.

It is preferably composed of a single-layer film or multilayer film between the ferroelectric layer of the ferroelectric capacitor and the electrode (conductive layer) on the opposite side from the buffer layer, and has an interface layer having higher dielectric constant than silicon oxide as a whole. The interface layer is preferably a high dielectric film, and particularly an oxide film or silicate film, having dielectric constant of higher than the dielectric constant of a silicon nitride film. If the interface layer has high dielectric constant it will be possible to increase the partial voltage applied to the ferroelectric layer from among the applied voltage. Such an interface layer may be any high-dielectric constant insulator, but preferably when the ferroelectric layer is a yttrium-doped hafnium-type metal oxide (Y—$HfO_2$), it is yttrium silicate (YSiO), hafnium silicate (HfSiO) or yttrium oxide ($Y_2O_3$), for example.

The interface layer is preferably in direct contact with the first conductive layer (lower electrode). However, since a very thin surface oxidation film tends to form on the surface of the first conductive layer (lower electrode), the surface oxidation film may be considered part of the interface layer. If the surface oxidation film is considered part of the interface layer then the interface layer is composed of not a single-layer film but rather a multilayer film (composite film), but it is sufficient if the composite film as a whole has higher dielectric constant than silicon oxide. Needless to mention the interface layer itself apart from the surface oxidation film may also be a multilayer film.

The interface layer preferably has a function of inhibiting movement of oxygen from the ferroelectric layer to the first conductive layer side. This can provide an effect of inhibiting generation of oxygen defects in the ferroelectric layer.

The electrodes (conductive layers) may be composed of metals such as tungsten or titanium, or conductive ceramic or conductive semiconductors, but the lower electrode of the ferroelectric layer in particular is preferably a conductive material, e.g. a conductive silicide such as nickel disilicide ($NiSi_2$), since it is more favorable for the film quality of the hafnium-type metal oxide to be formed on it.

The embodiments described in the method for producing a non-volatile storage element in Example 1 and Example 2 also apply for production of a semiconductor storage device according to the third embodiment of Example 3. If a ferroelectric layer composed of a hafnium-type metal oxide is formed at a temperature of 400° C. or lower and preferably lower than 300° C., and the deposited ferroelectric layer is then subjected to activation annealing at a temperature of 400° C. or lower, then it is possible to improve the properties of the ferroelectric layer and ferroelectric storage element, and activation annealing in particular is preferred as it can be carried out at a temperature of 400° C. or lower, thereby allowing it to be carried out after fabrication of a storage element and storage device. For the third embodiment of Example 3, however, activation annealing is not limited to being carried out at 400° C. or lower, and it may be carried out at a temperature of higher than 400° C.

Fourth Embodiment: NOR-Type Memory Cell Array

The semiconductor storage device of the fourth embodiment of Example 3 is an example of a NOR-type memory cell array. Memory cell arrays are largely classified as NOR types and NAND types, which have different access methods, cell areas and uses. A NOR-type cell is capable of random access but has a larger cell area than a NAND type. A NAND cell is not capable of random access, being serially accessed, but it can be made with a very small cell area.

Figure 26:
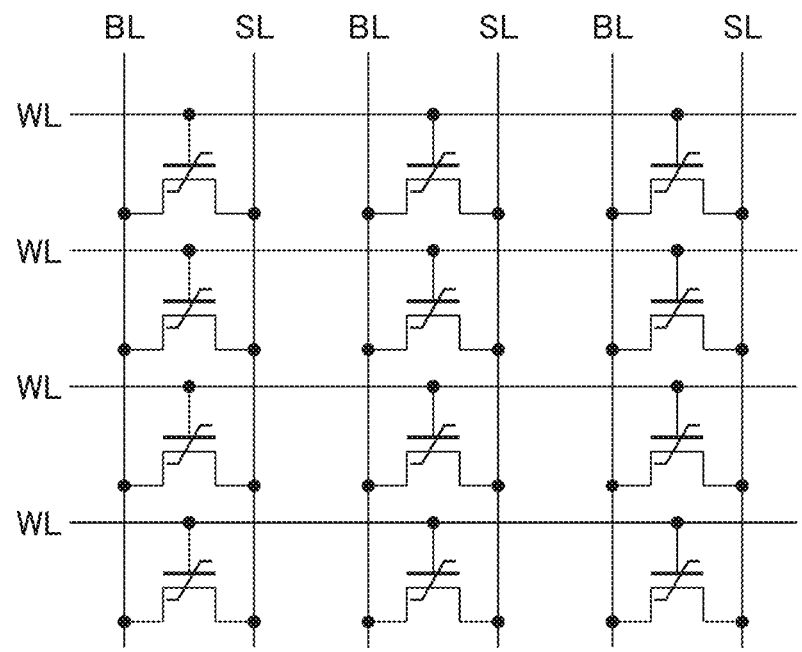
FIG. 26 is a circuit diagram showing an example of the NOR-type memory cell array of Example 3.

FIG. 26 shows the layout of a source-isolated NOR-type cell, assumed to be a 1T cell (FeFET). In the NOR-type cell shown in the drawing, the word lines WL are connected to FeFET gates, while the bit lines BL are connected to drains and the source lines SL are connected to sources. A source-isolated type is characterized in that only the sources of the memory cells are common by the select source lines SL, and the non-select source lines can be independently controlled.

Figure 27:
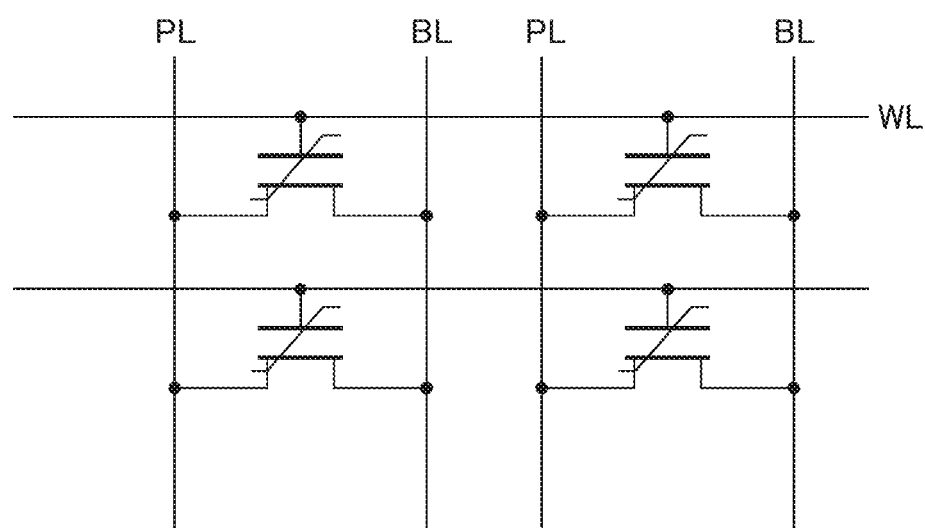
FIG. 27 is a circuit diagram showing a portion of a NOR-type memory cell array.

FIG. 27 shows a NOR-type cell with a plate structure. The plate wires PL are common for the block units, while the bit lines BL are not earths but are capable of applying potential.

In FIG. 26 and FIG. 27, the memory cell is a 1T-type memory cell, but it may instead be a 1T1C-type or 2T2C-type. While NOR types have a lower degree of integration than NAND types, their access speed to memory cells is faster than NAND types, and they are therefore used as code storage in microcontrollers and the like.

Using an FeFET as an example, the orientation of polarization of the ferroelectric layer composing the gate insulating film of the memory cell transistor is controlled by gate voltage application, allowing the threshold (Vth) of the FeFET to be controlled, and thus allowing writing and erasing of data. For reading of data, on the other hand, the voltage applied to the gate, i.e. the read voltage, is compared with the Vth of the FeFET, and a current flows through the FeFET if the read voltage is greater than Vth, while no current flows through the FeFET if it is smaller. Reading of data is possible in this manner.

The ferroelectric memory cell composing the NOR-type memory cell array may be a semiconductor storage device according to any of the first to third embodiments. In a NOR-type memory cell array using the ferroelectric material, therefore, inserting a buffer layer of a metal oxide having oxygen ion conductivity and comprising a metal with multiple valency between the ferroelectric layer and electrode (conductive layer) makes it possible to repair damage to the ferroelectric layer caused by voltage stress during writing, to reduce leakage current and obtain satisfactory device properties and especially reliability.

If a hafnium-type metal oxide is used as the ferroelectric material, excellent ferroelectricity can be exhibited even with a thin film thickness, making it scalable, reducing power consumption and allowing mixing with advanced CMOS logic. By inserting an interface layer of a high dielectric material (the interface layer being composed of a single-layer film or multilayer film, but having higher dielectric constant as a whole than silicon oxide) between the ferroelectric layer and another electrode (conductive layer), the voltage applied to the ferroelectric layer can be relatively higher even with the same voltage applied to the gate, thus allowing the voltage applied to the gate to be relatively reduced, to lower power consumption.

Since the ferroelectric memory cell composing the NOR-type memory cell array may be a semiconductor storage device according to any of the first to third embodiments, the details regarding its structure are as explained for the first to third embodiments. Needless to mention, multi-valued storage storing data of 2 or more bits in a 1-transistor cell is also possible in the NOR-type memory cell of the present invention.

The embodiments described in the method for producing a non-volatile storage element in Example 1 and Example 2 also apply for production of a semiconductor storage device according to the fourth embodiment of Example 3. If a ferroelectric layer composed of a hafnium-type metal oxide is formed at a temperature of 400° C. or lower and preferably lower than 300° C., and the deposited ferroelectric layer is then subjected to activation annealing at a temperature of 400° C. or lower, then it is possible to improve the properties of the ferroelectric layer and ferroelectric storage element, and activation annealing in particular is preferred as it can be carried out at a temperature of 400° C. or lower, thereby allowing it to be carried out after fabrication of a storage element and storage device. For the fourth embodiment of Example 3, however, activation annealing for phase transition to a ferroelectricity-exhibiting ferroelectric layer composed of a hafnium-type metal oxide is not limited to being carried out at 400° C. or lower, and it may be carried out at a temperature of higher than 400° C. Particularly when a transistor-type storage cell (FeFET) is formed at a frontend, the temperature for activation annealing for phase transition of the metal oxide film to a ferroelectric layer may be 400° C. or higher.

Example 4: FeFET and 2D-FeNAND, 3D-FeNAND

The semiconductor storage device of Example 4 will now be explained with reference to the attached drawings (FIG. 22 and FIGS. 28 to 30). The memory cell array configurations of the Example 4 comprise a 1T-type ferroelectric transistor (FeFET) as the memory cell, and a ferroelectric NAND (FeNAND) as the memory cell array.

Figure 28:
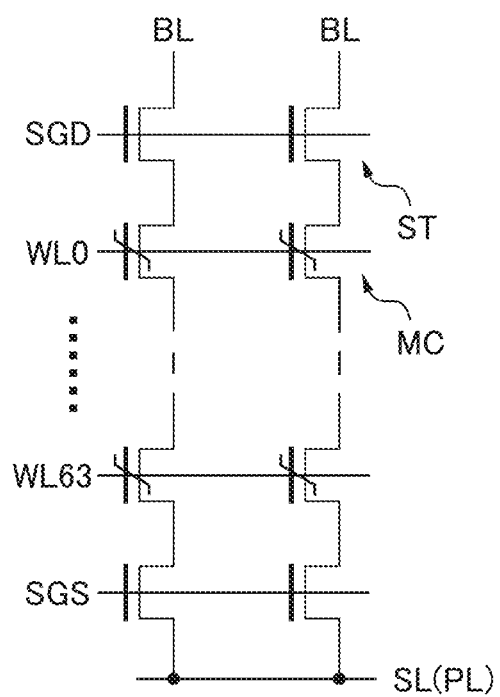
FIG. 28 is a circuit diagram showing the NAND memory cell of Example 4.

FIG. 28 shows a conceptual drawing of a FeNAND memory array. One NAND string is composed of FeFETs connected in series and two select elements arranged at both ends of the string. The select element on the bit line side is indicated as SDG, and the select element on the source line side is indicated as SGS. The drawing shows an example with 64 word lines WL connected in series. The select element uses a normal MOS transistor, but it may also be a select element with the same FeFET structure as the memory cell. In this case, the threshold voltage (Vth) of the FeFET is set for a select element. The NAND memory cell array may be a two-dimensional FeNAND in which the NAND strings are arranged flat or a three-dimensional FeNAND in which the directions of the strings are arranged in the direction perpendicular to the substrate surface, and the nature of the present invention naturally allows it to be applied to either.

An FeNAND memory chip comprises a memory cell array based on NAND strings with FeFETs connected in series, and a peripheral circuit PC built around the memory cell array. The memory cell array comprises a plurality of memory blocks MBi disposed in one direction. The memory blocks each comprise multiple pages. For this embodiment, reading and writing of data are carried out by page, while erasing of data is carried out by memory block. The peripheral circuit PC generates a voltage in response to an externally received command and applies it to the memory cell array, reading out, writing in or erasing data for the indicated page or memory block.

Figure 29:
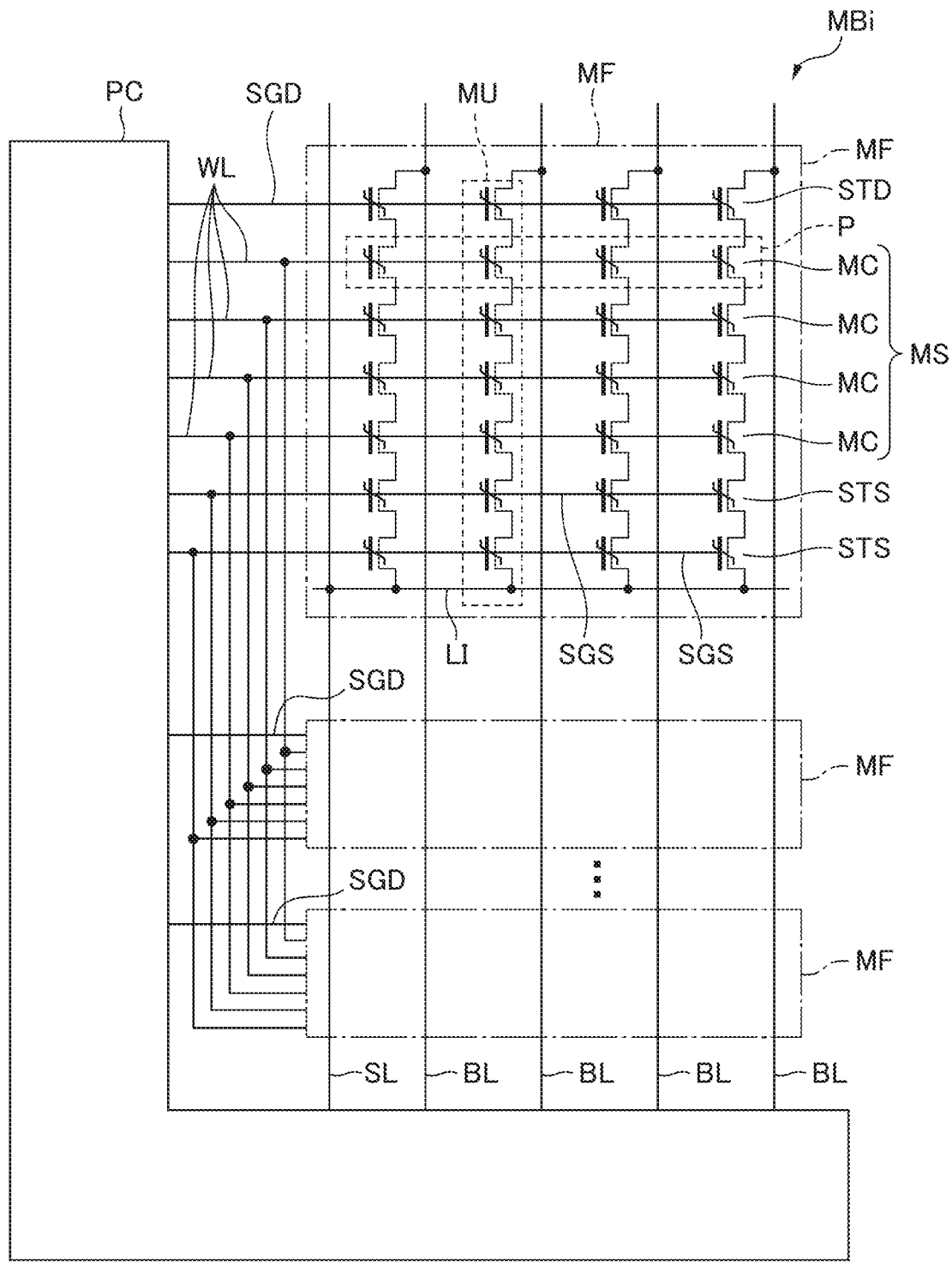
FIG. 29 is a conceptual drawing of the NAND memory cell array of Example 4.
Figure 30:
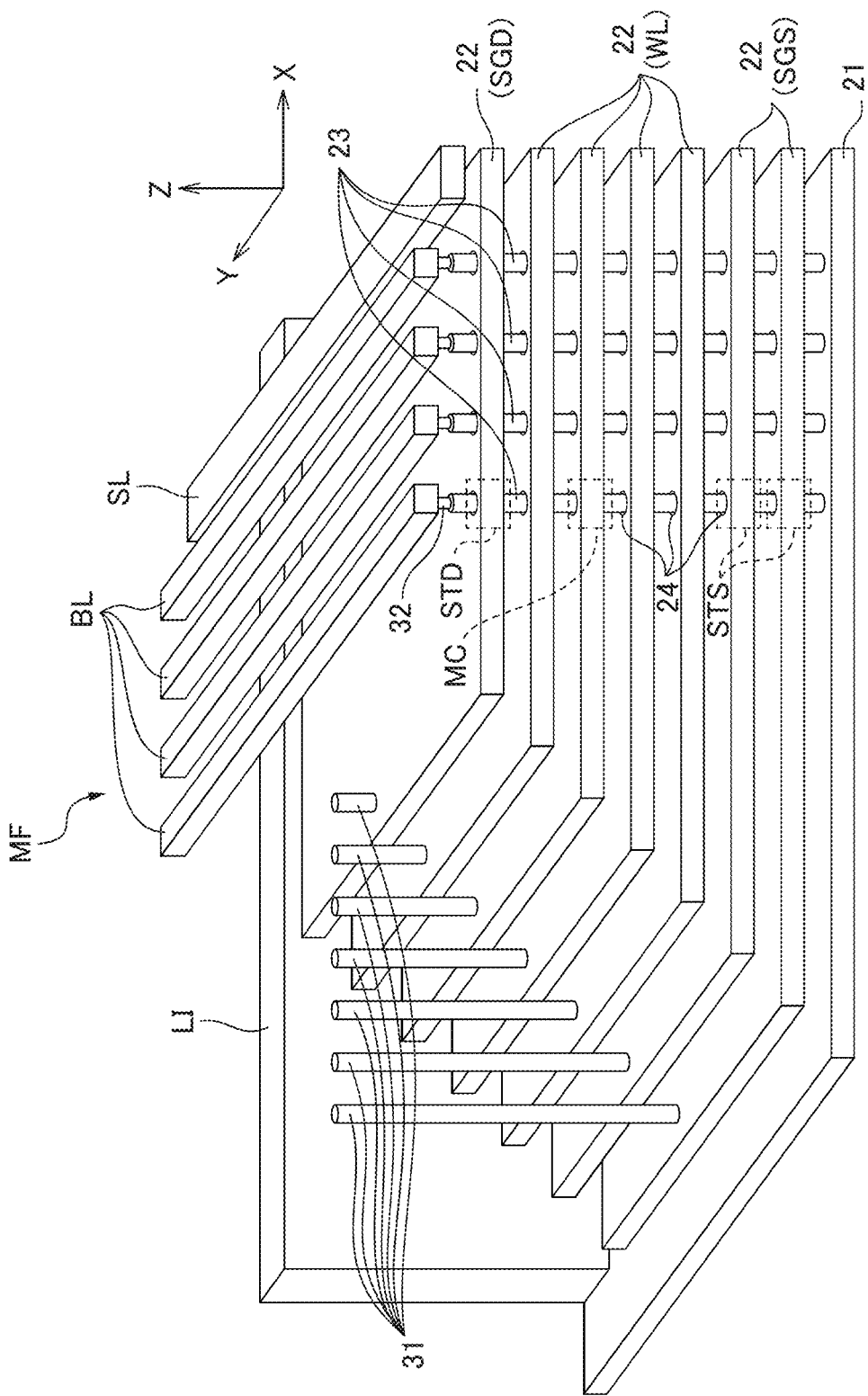
FIG. 30 is a structural diagram of a three-dimensional vertical NAND memory cell array.

This Example applies to a two-dimensional NAND in which a NAND memory cell string and memory string are arranged in parallel within the plane of the substrate (FIG. 28) and to a three-dimensional NAND in which memory cell strings are arranged perpendicular within the plane of the substrate (FIG. 29 and FIG. 30).

In the FeFET memory cell shown in FIG. 22, in write state (write state), the threshold voltage Vth of the transistor is low, voltage Vpp is on the upper electrode and voltage 0 V is on the lower electrode, while in erase state, the threshold voltage Vth of the transistor is high, voltage 0 V is on the upper electrode and voltage Vpp is on the lower electrode. Referring to FIG. 22, the memory cell is a memory transistor FeFET comprising a semiconductor layer 2s functioning as the lower electrode region, a gate insulating film comprising a ferroelectric film 1, and a gate electrode 3g functioning as the upper electrode, and it allows storage of 1-bit (2 value), 2-bit (4 value), 3-bit (8 value) and 4-bit (16 value) data. Vpp stands for the write voltage or erase voltage of the FeFET. In write state, the threshold (Vth) of the memory transistor is low, while in erase state the Vth is relatively high. During reading, a voltage midway between write state and erase state Vth is applied to the gate electrode as the read voltage, allowing reading of data with the FeFET current being OFF for erase state and the FeFET current being ON for write state.

The ferroelectric layer used in the FeFET element is a Y-doped hafnium oxide film, for example, but it may also be a film of another ferroelectric material which is composed mainly of hafnium (Hf) and oxygen (O), with addition of at least one from among silicon (Si), magnesium (Mg), aluminum (Al), barium (Ba), lanthanum (La) and zirconium (Zr), for example. If the process conditions are modified, then a ferroelectric film can also be formed even with a hafnium oxide film that is not doped with an added element.

The buffer layer is an insulating film composed of a metal oxide that has oxygen ion conductivity and comprises a metal with a multiple valency, and for example, it may be composed of a cerium oxide film ($CeO_x$) (x=1.5-2.0), or a zirconium oxide film, titanium oxide film, yttria-stabilized zirconia film or rare earth element oxide film.

The interface layer may also be composed of a single-layer film or multilayer film, but preferably it is a high-dielectric constant oxide film or silicate film having higher dielectric constant overall than silicon oxide, or when the ferroelectric layer is a Y-doped hafnium oxide film, it is preferably a yttrium silicate film (YSiO film), $Y_2O_3$ film or hafnium silicate film (HfSiO film).

The interface layer is preferably in direct contact with the first conductive layer (lower electrode). Since a very thin surface oxidation film tends to form on the surface of the first conductive layer (lower electrode), the surface oxidation film may be considered part of the interface layer, and it is sufficient if the composite film as a whole has higher dielectric constant than silicon oxide. The interface layer itself apart from the surface oxidation film may also be a multilayer film. The interface layer preferably has a function of inhibiting movement of oxygen from the ferroelectric layer to the first conductive layer side.

A problem that is known to occur when evaluating write/erase cycle reliability (write/erase endurance) of a FeFET element, is that write/erase endurance deteriorates with increasing number of write/erase cycle, the threshold voltage (Vth) window width of the FeFET narrowing and deteriorating, making it impossible to read data. The cause of write/erase endurance deterioration is that when the number of writes increases, defects are generated within the ferroelectric film and at the interface layer with the ferroelectric film, or at the interface between the interface layer and the lower electrode (the Si channel-forming region in the case of a FeFET), and the resulting increase in leakage current of the FeFET element results in deterioration of the write/erase endurance. It is also theorized that with operation which lowers Vth of the FeFET for writing, Vth is simultaneously increased by electrons injected into the tunnel from the channel into the ferroelectric layer of the FeFET, causing increase in Vth which has been lowered during writing, and thus resulting in write/erase endurance deterioration.

For this Example, the memory cell is provided with an FeFET element with the advanced buffer layer structure described in Example 2 in order to solve this problem. Referring to FIG. 22B, the lower electrode is a Si substrate 2s, the interface layer 5 is a yttrium silicate film, the ferroelectric film 1 is a Y-hafnium-doped oxide film, the buffer layer 4 is a cerium oxide ($CeO_x$) film and the upper electrode 3g is W/TiN. This Example has the advanced buffer layer structure with the inserted interface layer 5 as shown in Example 2. The interface layer 5 improves the ferroelectric property with low voltage operation as described for Example 2, and tunnel current of electrons injected through the FeFET channel during writing is inhibited by relative thickening of the interface layer (tunnel insulating film), resulting in improvement in deterioration of write/erase endurance. In addition, the buffer layer 4, such as $CeO_x$, compensates for oxygen defects formed in the ferroelectric layer 1 or at the electrode interface by electric field stress during write/erase cycle, which occur with increasing number of write/erase cycle in the ferroelectric layer 1 such as a Y-doped hafnium oxide film, thus reducing the defects and improving the write/erase endurance as a result.

FIG. 28 shows an example of FeNAND memory strings in an FeFET. FIG. 28 shows two memory strings, and each memory string being formed with FeFET memory cells MC as explained for FIG. 22 connected in series, and both ends of the string being composed of a select transistor ST. The Vth of the memory cell MC varies according to the direction of spontaneous polarization of the ferroelectric film. The FeNAND is composed of multiple FeFET memory strings, and while the cell area is small similar to a NAND flash memory which allows cost to be reduced, it is limited to serial access and is not capable of random access.

FIG. 29 shows a conceptual drawing of the main circuit configuration of the FeNAND. FIG. 29 assumes a 3-dimensional FeNAND structure. A word line WL is connected to each gate electrode of the plurality of memory cells in the memory string MU. The word lines WL are connected in common to all of the memory strings MU in a single memory finger MF. In each memory block, the plurality of word lines connected to a single memory finger MF are connected in common with the plurality of word lines connected to the other memory fingers ME. The plurality of memory cells connected in common with one word line WL in each memory finger MF constitute a page.

Select transistors (STD, STS) are field-effect transistors comprising a semiconductor layer functioning as a channel region, a gate insulating film, and a gate electrode. The gate electrodes of the select transistors (STD, STS) are respectively connected to select gate lines (SGD, SGS). The select gate lines (SGD, SGS) are each connected in common to all of the select transistors (STD, STS) in a single memory finger MF. A plurality of drain select lines SGD in the one memory block MBi are also connected to a peripheral circuit PC, independently for each memory finger MF. In each memory block MBi, the source select line SGS connected to one memory finger MF is connected in common to the source select line SGS connected to the other memory fingers MF.

Figure 31:
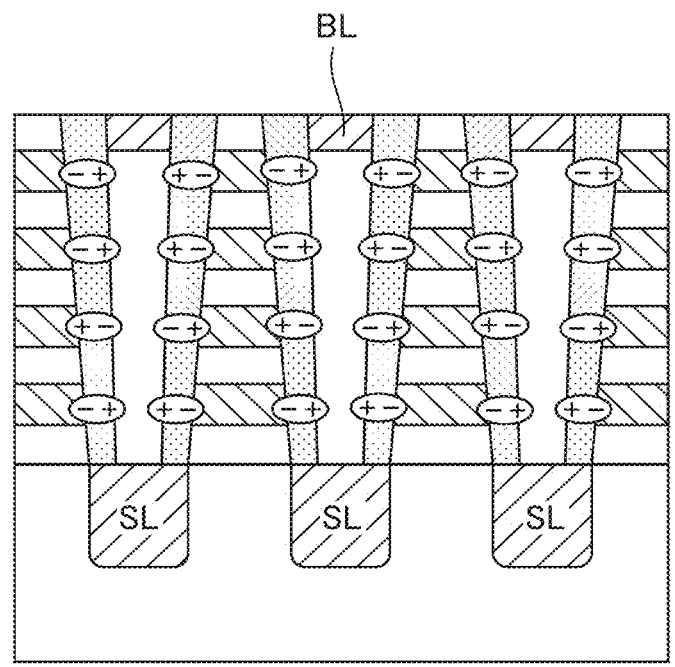
FIG. 31 is a cross-sectional diagram of a three-dimensional vertical NAND memory cell array.

FIG. 30 is a schematic perspective view showing the configuration of a memory finger MF. FIG. 31 shows a cross-sectional structure of the main portion of a three-dimensional FeNAND.

As shown in FIG. 30, the memory finger MF is formed on a substrate 21. The memory finger MF comprises a plurality of conductive layers 22 disposed in the Z direction, semiconductor layers 23 extending in the Z direction and facing the plurality of conductive layers 22, and gate insulating films 24 provided between the conductive layers 22 and semiconductor layers 23. In this configuration, the intersections between the conductive layers 22 and semiconductor layers 23 each function as memory cells MC.

The substrate 21 is a semiconductor substrate comprising a single crystal silicon (Si), for example. The substrate 21 comprises a double well structure with an n-type impurity layer on the top surface of the semiconductor substrate, and a p-type impurity layer in the n-type impurity layer. Each conductive layer 22 is a laminar conductive layer extending in the X-direction, and is composed of a laminated film of titanium nitride (TiN) and tungsten (W), for example. Each conductive layer 22 covers the side walls of the semiconductor layers 23 from the X-direction and Y-direction, functioning as gate electrodes for the word lines WL and memory cells MC and gate electrodes for the select gate lines (SGD, SGS) and select transistors (STD, STS). The conductive layers 22 are each connected to contacts 31, 32 that extend in the Z direction at the ends in the X-direction, and are connected to the peripheral circuit PC via the contacts 31, 32.

The semiconductor layers 23 are essentially cylindrical or tubular semiconductor layers extending in the Z direction, and are made of polysilicon (p-Si), for example. Each semiconductor layer 23 functions as a channel region for the memory cell and select transistors (STD, STS). The top ends of the semiconductor layers 23 are connected to bit lines BL extending in the Y direction via the contacts 22. The bottom ends of the semiconductor layers 23 are connected to the surface of the substrate 21, and to the source line SL extending in the Y-direction via wiring LI extending in the Z direction and X-direction. In the example shown in the drawing, the bottom ends of the semiconductor layers 23 are connected to the wiring LI via the top face of the substrate 21, but they may also be connected via other wiring.

FIG. 31 shows the cross-sectional structure of a three-dimensional FeNAND, with bit lines (BL) at the top and source lines (SL) at the bottom, and a ferroelectric film embedded along the holes, with plus and minus signs conceptually indicating the polarization directions of the ferroelectric material. The FeNAND has drastically reduced write and erase voltage compared to a three-dimensional NAND flash memory, and is thus expected to have lower power consumption.

With a non-volatile storage device of the invention, oxygen defects formed in the ferroelectric layer or at the electrode interface by electric field stress during write/erase cycle are supplied with oxygen ions through the buffer layer, controlling the number of oxygen defects in the ferroelectric layer or at the interface and thus improving the leakage current and ferroelectric layer quality, and as a result the number of write/erase cycle is vastly increased.

In addition, by employing a first conductive layer with a fluorite structure which is similar to a hafnium oxide-type ferroelectric layer, and inserting an interface layer of a high-dielectric constant silicate or high-dielectric constant dielectric film with relatively higher dielectric constant than a silicon oxide film between the lower conductive layer and ferroelectric layer, it is possible to apply a polarization-reversed electric field to the ferroelectric layer at low voltage, and as a result the voltage stress applied to the ferroelectric film is reduced and a characteristic effect is exhibited in which the write/erase endurance is vastly improved with low power consumption.

Example 5: FTJ Element and Cross-Point Memory

Figure 32:
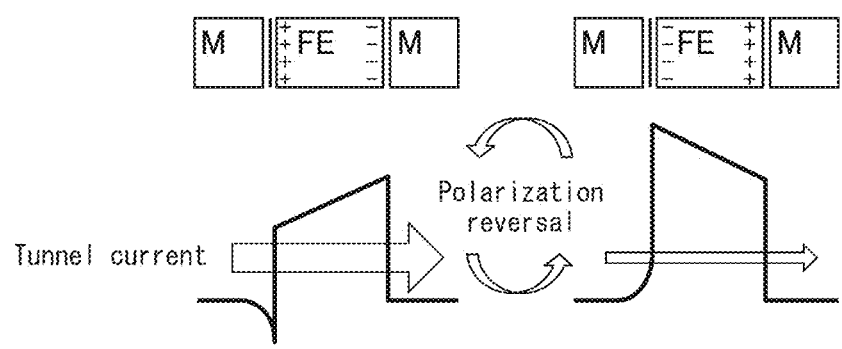
FIG. 32 is a diagram illustrating the principle of the tunnel junction element (FJT) of Example 5.

The semiconductor memory device of Example 5 will now be explained with reference to the attached drawings (FIG. 32). This Example will be explained for an FTJ memory provided with a Ferroelectric Tunnel Junction (FTJ) element as the memory cell, and a cross-point memory cell array, with reference to the attached drawings (FIGS. 33 to 36).

A conceptual drawing of the principle of an FTJ memory is shown in FIG. 32. With a lower electrode/ferroelectric thin-film/upper electrode (M/FE/M) three-layer structure as the basic construction, the ferroelectric thin-film FE was formed as a thin-film of 10 nm or smaller to also function as a tunnel insulating film. The physical phenomenon whereby the potential barrier against tunnel electrons at the interface between the ferroelectric thin-film FE and metal electrode M is modulated by the polarization direction of the ferroelectric film FE, is utilized for non-volatile memory operation. Specifically, writing/erasing of data is accomplished by changing the polarization direction of the ferroelectric film FE by the polarity of the voltage applied to the metal electrode M and reading of data is accomplished using the difference in tunnel current value flowing through the ferroelectric film FE of the element upon application of voltage to the electrode M. In the FTJ element, therefore, the ferroelectric memory is capable of non-destructive reading, providing the FTJ element with an advantage over the destructive reading that occurs with a ferroelectric capacitor in a conventional 1T1C-type or 2T2C-type ferroelectric memory.

In regard to write/erase endurance of the FTJ element, the cause of deteriorated write/erase endurance with increasing number of write/erase cycle is shown schematically in FIG. 33. As shown in FIG. 33, a silicon oxide ($SiO_2$) film is used as the interface layer between the ferroelectric layer and lower electrode in the FTJ element. It has been proposed that with increasing number of write/erase cycle, defects are created in the ferroelectric film due to tunnel electrons, resulting in leakage current being generated in the ferroelectric film through the created defects, and producing deterioration in write/erase endurance.

For this Example, the memory cell is provided with an FTJ element with the advanced buffer layer structure shown in FIG. 14 that was described for Example 2. For example, the lower electrode 2 is an $NiSi_2$ electrode, the interface layer 5 is a yttrium silicate (YSiO silicate) film, the ferroelectric film 1 is a Y-doped hafnium oxide (YHO) film, the buffer layer 4 is a cerium oxide ($CeO_x$) film and the upper electrode 3 is a W/TiN or TiN film. The YHO film 1 of 10 nm or smaller is carefully formed by atomic layer deposition (ALD), sputtering or pulse CVD.

For this Example, the structure is one in which the interface layer 5 of the high dielectric film is inserted in the basic construction of the FTJ element shown in FIG. 14. The interface layer 5 improves the ferroelectricity by low voltage, as explained for Example 2, while the tunnel barrier with a two-layer membrane structure allows the potential barrier of tunnel electrons to be higher, thus making it possible to lower the OFF current during reading and, as a result, to vastly improve the ON/OFF ratio for the reading current of the FTJ element.

FIG. 34 shows a conceptual drawing of a cross-point memory CPM. The cross-point memory CPM has a peripheral circuit PC and a memory cell array MCi, the cell layout of the memory cell array MCi being one with a cross-point structure in which memory cells MC are arranged at crosspoints of bit lines BL and word lines WL laid out perpendicularly in a two-dimensional manner, as one memory cell array structure that can provide a layout with minimum dimensions. In the FTJ element of this Example, the FTJ element exhibits a diode rectification property by insertion of the interface layer, thus allowing an FTJ element to be realized by a memory cell having a self-rectifying characteristic without the use of a select element. It is thereby possible to inhibit leakage current flowing through a nonselect element, as one of the major issues with the cross-point memory illustrated in FIG. 34. While the layout shown in FIG. 34 has a two-dimensional configuration laid out in parallel within a plane, it is also possible to realize a three-dimensional cross-point memory with FTJ elements within the plane layered vertically in the Z direction. The three-dimensional cross-point memory allows the actual cell area to be reduced compared to a two-dimensional cross-point memory cell, providing an effect of further reducing per-bit cost. With this memory cell it is also possible to realize a cross-point memory by a 1S1F-type memory cell separately provided with a rectification element such as a diode in addition to the FTJ element, and to also improve the ON/OFF characteristic of the memory cell to realize a high-capacity cross-point memory.

The ferroelectric layer to be applied in the FTJ memory cell was described above as a Y-doped hafnium oxide film, but it may also be a film composed mainly of hafnium (Hf) and oxygen (O), with addition of at least one from among silicon (Si), magnesium (Mg), aluminum (Al), barium (Ba), lanthanum (La) and zirconium (Zr), such as HZO ($Hf_{0.5}Zr_{0.5}O_2$) or HSO (SiHfO), for example.

The buffer layer is an insulating film of a metal oxide that has oxygen ion conductivity and comprises a metal with multiple valency, and it may be composed of a cerium oxide film ($CeO_x$) (x=1.5-2.0), or a zirconium oxide film, titanium oxide film, yttria-stabilized zirconia film or rare earth element oxide film.

The interface layer may be composed of a single-layer film or multilayer film, but preferably it is a high-dielectric constant oxide film or silicate film having higher dielectric constant overall than silicon oxide, or when the ferroelectric layer is Y-doped hafnium oxide film, it is preferably a yttrium silicate film (YSiO), hafnium silicate film, yttrium-hafnium silicate film (YHSiO) or $Y_2O_3$ film.

The interface layer is preferably in direct contact with the first conductive layer (lower electrode). Since a very thin surface oxidation film tends to form on the surface of the first conductive layer (lower electrode), the surface oxidation film may be considered part of the interface layer, and it is sufficient if the composite film as a whole has higher dielectric constant than silicon oxide. The interface layer itself apart from the surface oxidation film may also be a multilayer film. The interface layer preferably has a function of inhibiting movement of oxygen from the ferroelectric layer to the first conductive layer side.

Figure 35:
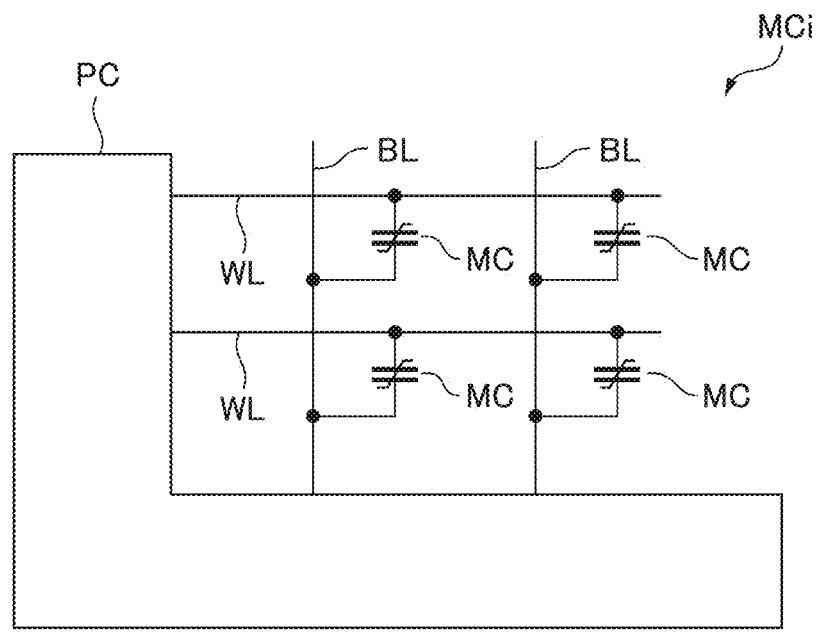
FIG. 35 is a diagram showing the cross-point memory cell array of Example 5.

FIG. 35 shows a cross-point memory device according to this Example. It comprises at least a memory cell array MCi and a peripheral circuit PC around the memory cell array MCi. The memory cell array comprises a plurality of word lines WL, a plurality of bit lines BL crossing with the plurality of word lines WL, and a plurality of memory cells MC connected to the wirings. The plurality of memory cells MC connected to one word line WL constitute a page.

The peripheral circuit PC generates a voltage in response to an externally received command and applies it to the memory cell array MCi, for writing in, reading out, erasing or re-awakening of data for the indicated page.

Figure 36:
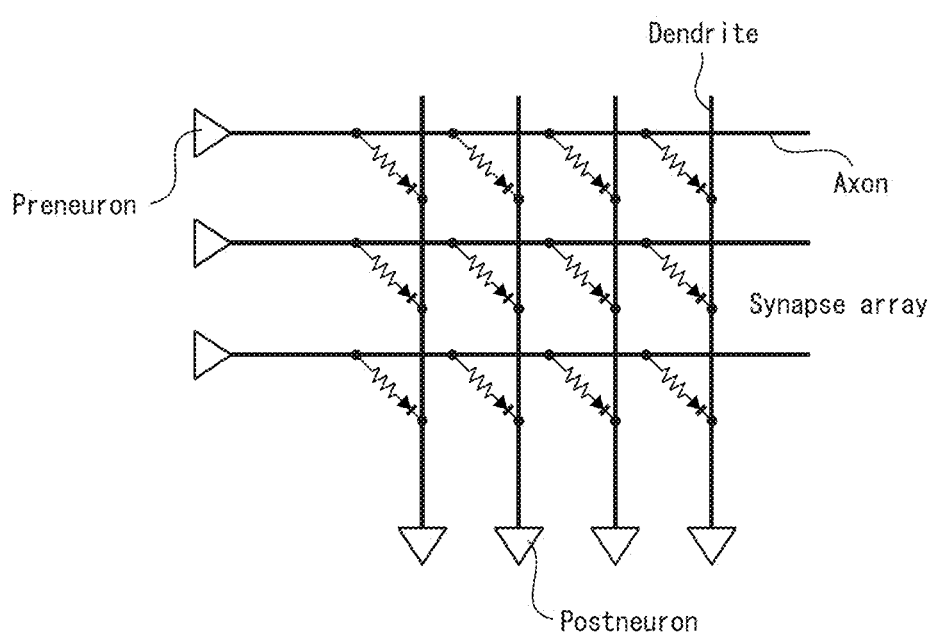
FIG. 36 is a diagram showing a neuromorphic application of the cross-point memory of Example 5.

FIG. 36 shows a conceptual drawing of a specific applied example of a cross-point memory as a neuromorphic memory. With a cross-point memory it is possible to simulate a super low-power-consumption analog computing function to simulate information processing in the human brain. FIG. 36 shows human neuron computing function in analogy with a cross-point memory. The cross-point memory cell array corresponds to one neuron, the word lines correspond to axons and the bit lines correspond to dendrites. The human brain operates as a massively parallel machine. With a normal von Neumann digital memory, however, it is usually difficult to simulate the brain because normally one or several bit lines are outputted for one word line. For neuromorphic operation, therefore, multiple word lines are simultaneously activated and operated, the operation being such that the output current to a bit line is the sum of the currents from all of the FTJ elements connected to the bit line, sensed in analog with a sense amp, and outputted as the input signal to the next neuron.

In this case as well, using an FTJ element provided with an advanced buffer layer structure having the high-dielectric constant interface layer shown in FIG. 14 produces an effect which allows the leakage current and number of write/erase cycle of the cross-point cell array to be increased.

As explained above, with the non-volatile memory device of this Example, oxygen defects formed in the ferroelectric layer or at the electrode interface by electric field stress during write/erase cycle are supplied with oxygen ions from the buffer layer, repairing the oxygen defects in the ferroelectric layer or at the interface by recombination and thus improving the leakage current and ferroelectric layer quality, so that the ON/OFF ratio during reading is higher and the number of write/erase cycle is vastly increased as a result.

In addition, employing an $NiSi_2$ electrode with a fluorite structure which is similar to a hafnium oxide ferroelectric layer, and inserting an interface layer of yttrium silicate (YSiO), hafnium silicate (HfSiO), $Y_2O_3$ or the like with relatively higher dielectric constant than a silicon oxide film between the lower first conductive layer and ferroelectric layer, as the first conductive layer, it is possible to apply a polarization-reversed electric field to the ferroelectric layer at low voltage, and as a result a characteristic effect is exhibited in which stress during write/erase cycle is reduced and the write/erase endurance is vastly improved with low power consumption. In the brain storage application of this Example an FTJ element was used as the ferroelectric element, but needless to mention, the invention is also useful when a ferroelectric capacitor or FeFET having the buffer layer structure disclosed by the present invention, an advanced buffer layer structure, is used as the ferroelectric element for application in a brain storage.

Example 6: Non-Volatile Logic and Non-Volatile Power Gating

The semiconductor storage device of Example 6 will now be explained with reference to the attached drawings (FIGS. 37 to 43). This Example is a case where a ferroelectric element with a buffer layer structure, such as a capacitor, FTJ element or FeFET is applied to non-volatile logic, as a low power consumption logic technique, mainly for non-volatile SRAM, non-volatile latch/flip-flop or non-volatile power gating, and also applied to an ultra-low power consumption microcontroller.

In an SoC (System on Chip) fabricated by advanced CMOS, leakage current during standby of transistors in on-chip working memory SRAM and logic circuits is caused mainly due to increased power consumption of the SoC as a whole. It has therefore been attempted to lower power consumption by turning electric power OFF to logic circuits that are not operating during standby. Cutting electric power in a volatile memory such as an SRAM has been known to cause loss of stored data. Power consumption-lowering technology has therefore been proposed in which the logic electric power supply is cut during standby by storing data from volatile memory to the non-volatile memory element before the electric power supply is cut off, and recalling and restoring the data to SRAM before re-operation.

In order to lower power consumption of the SoC, it is important to mix non-volatile memory with the CMOS to shorten the data transfer distance while simultaneously writing in non-volatile memory by logic, lowering the operating power during erasure. Voltage-operated non-volatile ferroelectric memories are of interest as non-volatile memories with low operating power. For lower operating power it is important to achieve improved reliability and lower operating voltage with hafnium oxide-type ferroelectric memories which allow application of advanced CMOS processes that are difficult to scale with PZT-based materials, and therefore this Example will be explained assuming non-volatile logic using a buffer layer structure ferroelectric capacitor.

This example will be explained assuming hafnium oxide-type ferroelectric capacitors arranged on the backend wiring layer of the upper layer section of a logic transistor formed on the frontend, but the configuration of the capacitors is not limited to the backend.

The high-speed operatable data storage circuit is a latch circuit with cross-connection of the input/output of a pair of inverters. The latch circuit is used in an element circuit composing a flip-flop, or in a storage cell of an SRAM. The latch circuit itself is a volatile data storage circuit, which loses its data when the electric power supply is cut off. A non-volatile data storage circuit is therefore proposed.

Figure 37:
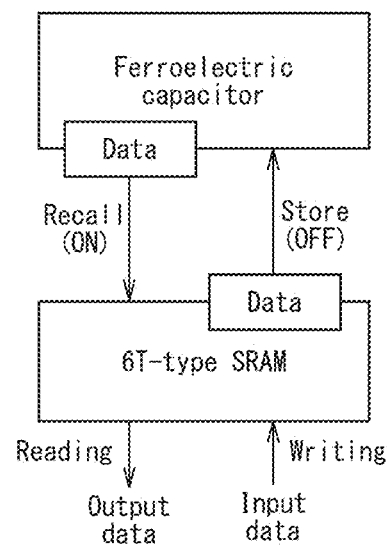
FIG. 37 is a conceptual drawing of the non-volatile SRAM of Example 6.

FIG. 37 shows the basic concept and data flow for a non-volatile SRAM using a ferroelectric capacitor. The non-volatile SRAM cell is composed of a volatile SRAM (6T SRAM) cell section composed of 6 logic transistors, and a non-volatile ferroelectric storage element (e.g. capacitor) section. During normal operation with a power source, data is retained in the SRAM section and READ/WRITE access of the data in the SRAM section is accomplished by the same method as a standard SRAM. Before voltage cut-off to lower power consumption by power gating, the data in the SRAM section is copied to the coupled ferroelectric capacitor by a store operation. When the power source of the SRAM is restored to return to operating mode, the value retained in the ferroelectric element is returned to the SRAM section by a recall operation.

Figure 38:
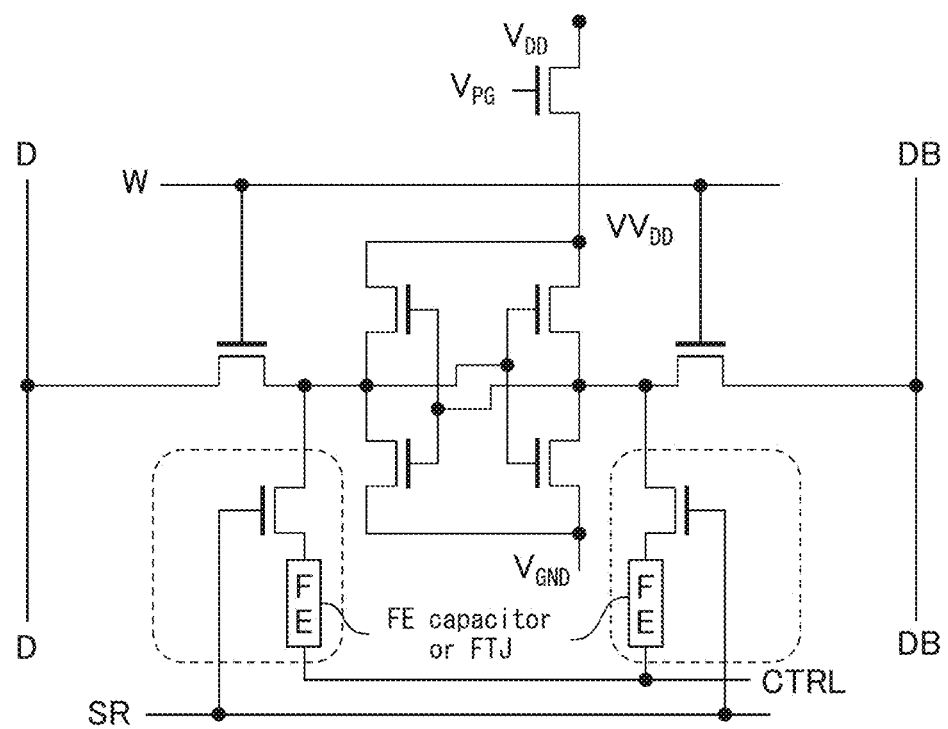
FIG. 38 is a circuit diagram of the non-volatile SRAM of Example 6.

FIG. 38 shows the circuit of the non-volatile SRAM. It is composed of six transistor SRAM cells, two ferroelectric capacitors and two select transistors. When the power source is ON, the two gate-controlled select transistors separate the ferroelectric capacitors from the SRAM section.

Normally, a high-speed operatable storage circuit used in CMOS logic loses storage capacity upon power source cutoff, but adding a non-volatile storage element to a bistable storage circuit allows data to be retained even after power source cutoff. During normal operation of CMOS logic, it operates as a normal bistable storage circuit without using non-volatile storage, employing the non-volatile storage only upon power source cutoff. This allows non-volatile power gating (NVPG) to be carried out so that energy can be efficiently reduced without affecting normal operation.

The ferroelectric substance, e.g. capacitor, used is preferably an advanced buffer layer structure capacitor as shown in Example 2. In that case a Y-doped hafnium oxide film was used, but the ferroelectric layer may also be a film composed mainly of hafnium (Hf) and oxygen (O), with addition of at least one from among lanthanum (La), silicon (Si), magnesium (Mg), aluminum (Al), barium (Ba) and zirconium (Zr), such as HZO ($Hf_{0.5}Zr_{0.5}O_2$) or HSO (SiHfO), for example. It may also be a non-doped hafnium oxide film.

The buffer layer is an insulating film of a metal oxide that has oxygen ion conductivity and comprises a metal with a multiple valency, and for example, it may be a cerium oxide film ($CeO_x$) (x=1.5-2.0, preferably 1.6-2.0, even more preferably 1.7-2.0 and most preferably 1.8-2.0). The interface layer is preferably a high dielectric constant oxide film or silicate film, for example, and when the ferroelectric layer is a Y-doped hafnium oxide oxidation layer it is preferably a Y silicate film, $Y_2O_3$ film or HfSiO silicate film.

The interface layer may be composed of a single-layer film or multilayer film, but preferably it is a high-dielectric constant oxide film or silicate film having higher dielectric constant overall than silicon oxide, or when the ferroelectric layer is Y-doped hafnium oxide film, it is preferably a yttrium silicate film (YSiO), hafnium silicate (HfSiO), yttrium-hafnium silicate film (YHfSiO) or $Y_2O_3$ film. Since a very thin surface oxidation film tends to form on the surface of the first conductive layer (lower electrode), the surface oxidation film may be considered part of the interface layer, and it is sufficient if the composite film as a whole has higher dielectric constant than silicon oxide. The interface layer preferably has a function of inhibiting movement of oxygen from the ferroelectric layer to the first conductive layer side.

In this Example, data of the SRAM volatile memory must be stored in the ferroelectric capacitor during power OFF, and written back into the SRAM during power ON. For this reason it is necessary to have a high number of write/erase cycle (write/erase endurance) for the ferroelectric elements, e.g. capacitors.

However, hafnium oxide-type ferroelectric elements such as capacitors have had limited numbers of write/erase cycle. For this Example, oxygen defects formed in the ferroelectric layer or at the electrode interface by electric field stress during write/erase cycle are supplied with oxygen ions through the buffer layer, controlling the number of oxygen defects in the ferroelectric layer or at the interface and thus improving the leakage current and film quality, and as a result the electric field stress applied to the ferroelectric film is reduced and the number of write/erase cycle of the ferroelectric element, e.g. capacitor, is vastly improved.

In addition, by inserting an interface layer of a yttrium silicate film (YSiO), hafnium silicate film (HfSiO), yttrium-hafnium silicate film (YHfSiO), $Y_2O_3$ film or the like with relatively higher dielectric constant than a silicon oxide film between the ferroelectric layer, it is possible to apply a polarization-reversed electric field to the ferroelectric layer with lower voltage, and as a result a characteristic effect is exhibited in which the write/erase endurance can be improved with low power consumption.

Figure 39:
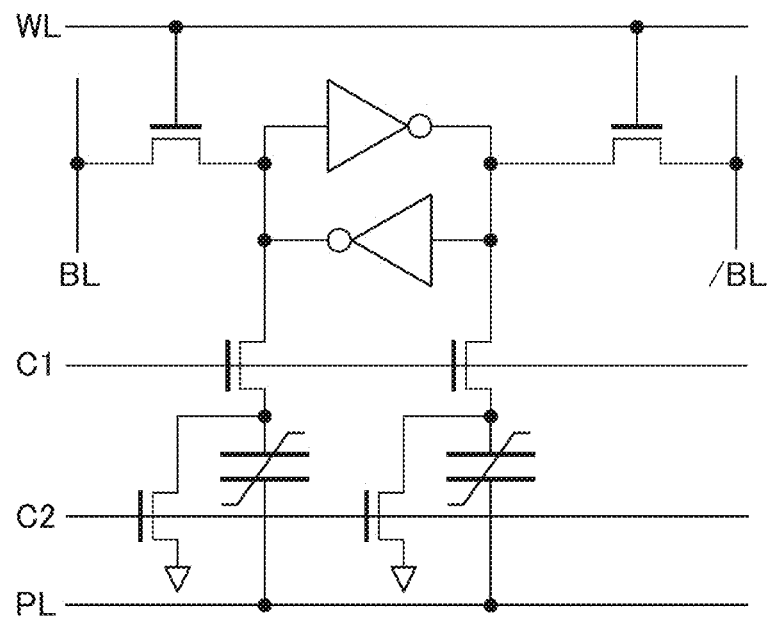
FIG. 39 is a circuit diagram for the non-volatile logic of Example 6.
Figure 40:
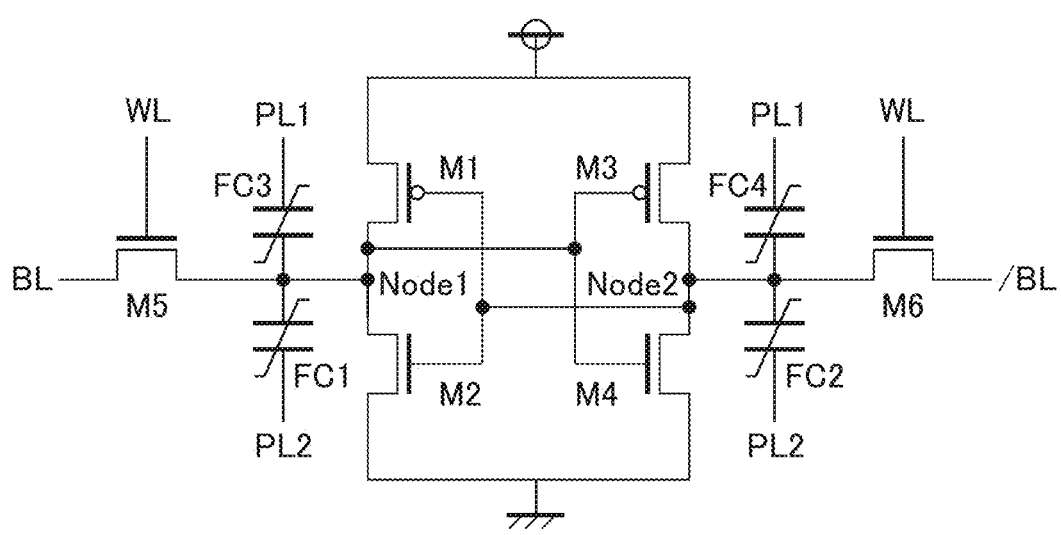
FIG. 40 is a circuit diagram of the (6T4C-type) non-volatile SRAM of Example 6.

FIG. 39 and FIG. 40 show modified examples of FIG. 38, as a non-volatile SRAM composed of four transistors and two ferroelectric capacitors in a 6T-type transistor SRAM, and a non-volatile SRAM of a type in which four ferroelectric capacitors are directly connected to a 6T-type SRAM without select transistors. In FIG. 39, the number of transistors is increased to further improve the reliability. In FIG. 40, no select transistor is used and therefore the number of transistors is decreased, allowing the memory cell area to be reduced.

With a non-volatile ferroelectric element to be used in the non-volatile SRAM of this Example, oxygen defects formed in the ferroelectric layer or at the electrode interface are supplied with oxygen ions through the buffer layer by electric field stress during write/erase cycle, controlling the number of oxygen defects in the ferroelectric layer or at the interface and thus improving the leakage current and film quality, and as a result the number of write/erase cycle is vastly increased.

In addition, by inserting an interface layer of a yttrium silicate film (YSiO), hafnium silicate film (HfSiO), yttrium-hafnium silicate film (YHfSiO), $Y_2O_3$ or the like with relatively higher dielectric constant than a silicon oxide film between the ferroelectric layer, it is possible to apply a polarization-reversed electric field to the ferroelectric layer with lower voltage, and as a result a characteristic effect is exhibited in which the write/erase endurance can be improved with low power consumption.

Figure 41:
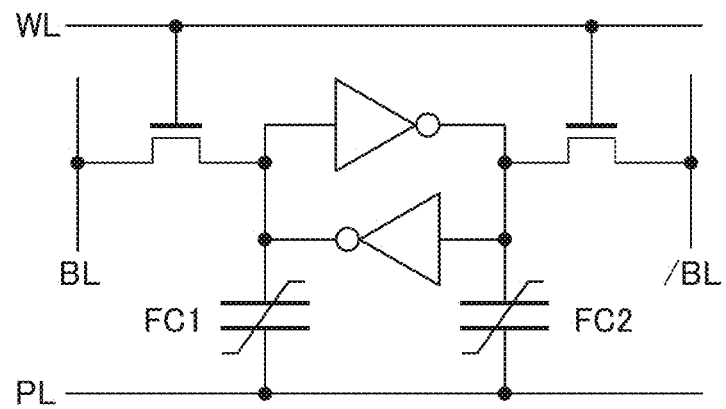
FIG. 41 is a circuit diagram of the (6T2C-type) non-volatile SRAM of Example 6.

An example of the ferroelectric capacitors shown in Examples 1 and 2 applied in a non-volatile latch circuit will now be explained as a non-volatile logic device. The high-speed operatable data storage circuit in FIG. 41 is a latch circuit with cross-connection of the input/output of a pair of inverters. The latch circuit is used as an element circuit composing a flip-flop, or in a memory cell of an SRAM. The latch circuit itself is a volatile data storage circuit, which loses its data when the electric power supply is cut off. A non-volatile data storage circuit has therefore been proposed.

For the non-volatile data storage circuit it has been proposed to connect ferroelectric elements, such as capacitors, as variable capacitors, to the memory nodes of the latch circuit forming the SRAM memory cell. FIG. 41 is a circuit diagram of such a memory cell. In this method the select transistors of the latch circuit section and ferroelectric element section are not used. The memory cell is composed of a latch circuit with the input/output terminals of the CMOS inverter cross-connected, a transfer gate with the gate connected to the word line WL and one source/drain connected to the bit lines BL, BLX, and ferroelectric capacitors FC1, FC2 connected to a pair of memory nodes of the latch circuit. The electrodes on the opposite sides of the ferroelectric capacitors FC1, FC2 are connected to the plate wire PL. The latch circuit comprising the pair of inverters loses data when the power source is cut off. However, by connecting the ferroelectric capacitors FC1, FC2 to the pair of storage nodes, it is possible to control the polarization direction of the ferroelectric film of the ferroelectric capacitor in response to the voltage level of the storage nodes, maintaining the polarization direction as remanent polarization even after power source cutoff.

For this Example, the ferroelectric capacitors shown in Examples 1 and 2 are preferably applied to a ferroelectric capacitor in a non-volatile logic device. In this non-volatile logic device, therefore, oxygen defects formed in the ferroelectric layer or at the electrode interface by electric field stress during data transfer are supplied with oxygen ions through the buffer layer, controlling the number of oxygen defects in the ferroelectric layer or at the interface and thus improving the leakage current and film quality, and as a result the number of write/erase cycle is vastly improved.

In addition, by inserting an interface layer of a yttrium silicate film (YSiO), hafnium silicate film (HfSiO), yttrium-hafnium silicate film (YHfSiO), $Y_2O_3$ or the like with relatively higher dielectric constant than a silicon oxide film between the ferroelectric layer, it is possible to apply a polarization-reversed electric field to the ferroelectric layer with lower voltage, and as a result a characteristic effect is exhibited in which the write/erase endurance can be improved with low power consumption. In the non-volatile logic application of this Example a ferroelectric capacitor or FTJ element was used as the ferroelectric element, but needless to mention the invention is also useful when a FeFET having the buffer layer structure disclosed by the present invention, as an advanced buffer layer structure, is used as the ferroelectric element for a non-volatile logic application.

The following is a simple explanation of examples of application to a non-volatile microcontroller employing a low-power-consumption ferroelectric memory and non-volatile logic technique using a low-power-consumption ferroelectric memory element.

The semiconductor device of this example will be explained with reference to the attached drawings. For this Example, ultra-low power consumption is achieved by application of an ultra-low power consumption ferroelectric memory, as well as power management technology based on non-volatile power gating technology and normally-off technology for the logic section.

Figure 42:
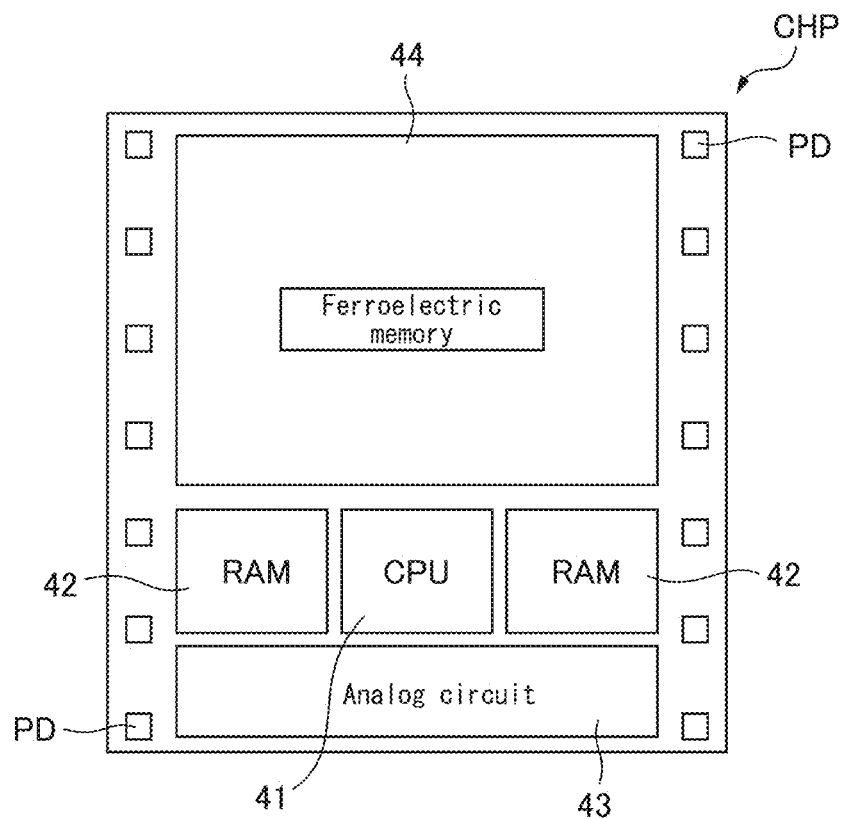
FIG. 42 is a conceptual drawing of the non-volatile microcontroller of Example 6.

FIG. 42 is a diagram showing the structural concept of the semiconductor chip of this embodiment. FIG. 42 is a plan view showing a semiconductor chip having a microcontroller formed on it, with the layout configuration of each element formed on the semiconductor chip. In FIG. 42, the semiconductor chip has a CPU (Central Processing Unit) 41 and RAM (Random Access Memory) 42, an analog circuit 43 and a ferroelectric memory 44. The semiconductor chip also has a plurality of pad electrodes (external connecting terminals) PD as external input/output terminals.

The CPU (circuit) 41, or Central Processing Unit, is the heart of the computer. The CPU 41 reads and interprets commands from a memory device, carrying out various computations and control on that basis, and it must therefore be capable of rapid processing. Consequently, the MOS transistors forming the CPU 41 must have relatively high-speed operation and low power consumption among the elements formed in the semiconductor chip. The MOS transistor circuit forming the CPU has low power consumption by the non-volatile power gating (PG) demonstrated in the Examples.

The RAM (circuit) 42 is a memory that can randomly, i.e. non-sequentially, read out stored data and newly write stored data, making it a randomly accessible memory. While it is common to use an SRAM employing a static circuit, for this Example a non-volatile SRAM is applied, the basic operation being the same as an SRAM but with lower power consumption.

The analog circuit 43 is a circuit that handles voltage or current signals that continuously change with time, i.e. analog signals, and it is composed of an amplification circuit, conversion circuit, modulation circuit, oscillating circuit or power source circuit, for example. The analog circuit 43 is formed of high voltage resistant MOS transistors. The ferroelectric memory 44 is shown in Examples 1 and 2, and it is an ultra-low power consumption, non-volatile memory composed of a 1T1C FeRAM array or FeFET array with a buffer layer structure or advanced buffer layer structure.

Figure 43A:
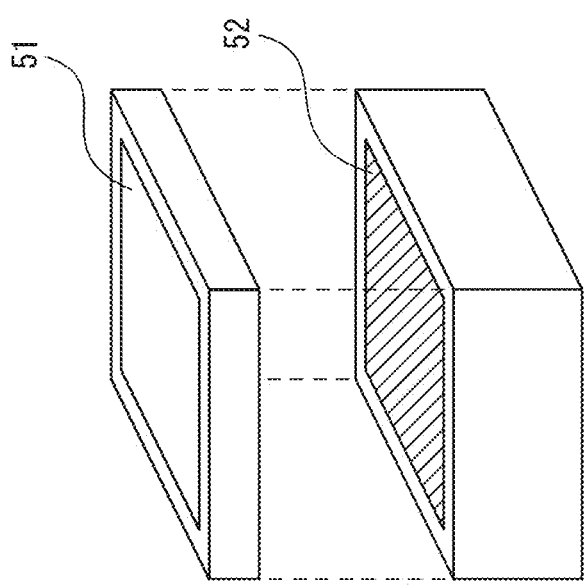
Figure 43B:
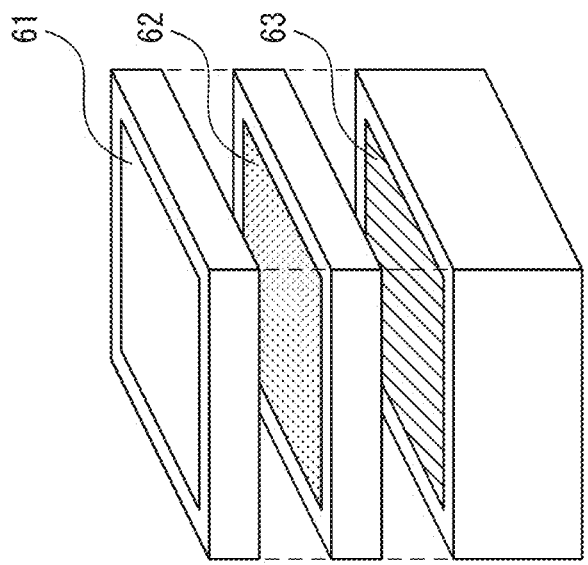

FIGS. 43A and 43B show a conceptual drawing of a laminated-type low-power-consumption non-volatile LSI chip, as an example of an IoT/AI edge device for the purpose of image-recognition processing (comprising AI processing). FIG. 43A shows a two-layer laminated-type comprising an image sensor array 61 and a low-power-consumption ferroelectric memory mixed device 52, and FIG. 43B shows a 3-layer laminated-type comprising an image sensor array 61, an ultra-low-power-consumption non-volatile ferroelectric memory 62 and an ultra-low-power-consumption logic element 63. Connection of the two-layer structure and three-layer structure in the vertical direction may be accomplished by a through-silicon via (TSV) electrode connection technique or connection between Cu pads. Connection between Cu pads is a technique in which electrical conduction is established by connecting together the Cu pads of an upper layer chip and lower layer chip when the upper chip and lower chip are layered.

The low-power-consumption dielectric material memory described in the Examples is used for the layered LSI memory section, and a non-volatile logic memory technique employing non-volatile power gating is used for the logic section. As a result it is possible to carry out AI processing with an IoT/edge device in the edge region which requires ultra-low power consumption.

In this non-volatile logic device, oxygen defects formed in the ferroelectric layer or at the electrode interface by electric field stress during data transfer are supplied with oxygen ions through the buffer layer, controlling the number of oxygen defects in the ferroelectric layer or at the interface and thus improving the leakage current and film quality, and as a result the number of write/erase cycle is vastly increased with low power consumption.

In addition, by inserting an interface layer of a yttrium silicate film (YSiO), hafnium silicate film (HfSiO), yttrium-hafnium silicate film (YHfSiO), $Y_2O_3$ or the like with relatively higher dielectric constant than a silicon oxide film between the ferroelectric layer, it is possible to apply a polarization-reversed electric field to the ferroelectric layer with lower voltage, and as a result a characteristic effect is exhibited in which electric field stress is reduced during write/erase cycle and the write/erase endurance can be improved with low power consumption.

The interface layer is preferably in direct contact with the first conductive layer (lower electrode). Since a very thin surface oxidation film tends to form on the surface of the first conductive layer (lower electrode), the surface oxidation film may be considered part of the interface layer, and it is sufficient if the composite film as a whole has higher dielectric constant than silicon oxide. The interface layer itself apart from the surface oxidation film may also be a multilayer film. The interface layer preferably has a function of inhibiting movement of oxygen from the ferroelectric layer to the first conductive layer side.

This Example has been described based on a ferroelectric memory element applied in a logic element as non-volatile logic, with the logic circuit being non-volatile for low power consumption. However, for low power consumption in a system LSI (SoC) such as a microcontroller it is effective to lower the power source voltage and operating voltage for the logic transistor, for which purpose it is effective to use a Silicon on Insulator (SOI) substrate process instead of a bulk Si substrate.

Therefore, although bulk Si substrates were illustrated for the present invention in the device structure diagrams of FIG. 22, FIG. 23 and FIG. 24, the applicability of the invention is the same even with ferroelectric memory elements or devices using SOI substrates, in which case a synergistic effect is obtained by low power consumption of the logic transistors in addition to low power consumption by non-volatile ferroelectric memory elements, while also providing low power consumption for the system LSI.

The essence of the invention can also be applied for Silicon On Thin Buried Oxide (SOTB) processes where the SOI process and bulk Si process can be realized and fabricated on the same Si substrate.

Advances in development are also expected not only for scaling of advanced CMOS transistors but also for logic transistors that have two-dimensional flat structures to three-dimensional configurations, and specifically Fin-type transistors, as well as nanowire transistors, and the present invention may of course also be applied to such advanced CMOS transistor processes.

REFERENCE SIGNS LIST

1 Ferroelectric layer
2 First conductive layer
2s Semiconductor layer
2b Lower electrode
3 Second conductive layer
3u Upper electrode
3g Gate electrode
4 Buffer layer
5 Interface layer
6 Source region
7 Drain region
11 Semiconductor layer
12 Device isolation film
13 Interlayer insulation film
21 Substrate
22 Conductive layer
23 Semiconductor layer
24 Gate insulating film
31, 32 Contact
41 CPU
42 RAM
43 Analog circuit
44 Ferroelectric memory
51 Image sensor array
52 Low-power-consumption ferroelectric memory mixed device
61 Image sensor array
62 Ultra-low power consumption non-volatile ferroelectric memory
63 Ultra-low power consumption logic ST, STD, STS Select transistor
SGD, SGS Select gate line
FC Ferroelectric capacitor
WL Word line
BL,/BL Bit line
PL Plate wire (earth)
SL Source line
MBi Memory cell array
MC Memory cell
MF Memory finger
MU Memory string
PC Peripheral circuit
CPM Cross-point memory

The invention claimed is:

1. A non-volatile storage element comprising at least:
a first conductive layer, and
a second conductive layer,
with a ferroelectric layer composed of a metal oxide between the first conductive layer and the second conductive layer,
wherein the non-volatile storage element has between the ferroelectric layer and the first conductive layer and/or second conductive layer a buffer layer of a metal oxide having oxygen ion conductivity and containing a metal with a multiple valency, and
wherein the non-volatile storage element has an interface layer composed of a single-layer film or a multilayer film between the first conductive layer and the ferroelectric layer, the interface layer as a whole having a higher dielectric constant than silicon oxide, and when the buffer layer is present between the first conductive layer and the ferroelectric layer, the interface layer is present between the first conductive layer and the buffer layer, and
wherein the non-volatile storage element satisfies at least one of the group consisting of the following A to C:
A) the buffer layer is present between the second conductive layer and the ferroelectric layer and the buffer layer comprises cerium oxide $CeO_x$ wherein x is 1.5-2.0, and/or
B) the oxygen vacancy defect density of the buffer layer is lower than the oxygen vacancy defect density of the ferroelectric layer, and
C) the second conductive layer has a two-layer structure of a barrier metal and a metal nitride, particularly W and TiN, that contacts the buffer layer.

2. The non-volatile storage element according to claim 1, wherein the thickness of the buffer layer is 0.1 nm or greater and preferably 10 nm or smaller.

3. The non-volatile storage element according to claim 1, wherein the interface layer comprises an oxide, metal oxide or silicate, especially yttrium oxide or yttrium silicate, having higher dielectric constant than the dielectric constant of silicon nitride.

4. The non-volatile storage element according to claim 1, wherein the metal of the metal oxide composing the ferroelectric layer, either comprises hafnium (Hf) or zirconium (Zr) or both metals, or comprises hafnium (Hf) or zirconium (Zr) or both metals and one or more metal elements selected from the group consisting of aluminum (Al), silicon (Si), strontium (Sr), barium (Ba) and rare earth elements (Sc, Y, La, Ce, Pr, Nd, Sm, Eu, Gd, Tb, Dy, Ho, Er, Tm, Yb and Lu).

5. The non-volatile storage element according to claim 1, wherein the first conductive layer is a metal silicide or metal disilicide having a fluorite structure, or a metal nitride, or impurity-containing Si or Ge, or an SOI (Silicon on Insulator).

6. The non-volatile storage element according to claim 1, wherein the ferroelectric layer is formed over the first conductive layer at a temperature of 400° C. or lower, and the ferroelectric layer exhibits ferroelectricity before the second conductive layer is formed over the ferroelectric layer.

7. A non-volatile storage device provided with at least:
i) an array in which non-volatile ferroelectric transistor storage elements each comprising at least a first conductive layer, a second conductive layer and a ferroelectric layer composed of a metal oxide between the first conductive layer and the second conductive layer, are arranged in a two-dimensional or three-dimensional manner, and
ii) a control circuit,
wherein the non-volatile ferroelectric transistor storage elements have between the ferroelectric layer and the first conductive layer and/or second conductive layer a buffer layer of a metal oxide having oxygen ion conductivity and containing a metal with a multiple valency, and
wherein the non-volatile ferroelectric transistor storage elements have an interface layer composed of a single-layer film or a multilayer film between the first conductive layer and the ferroelectric layer, the interface layer as a whole having a higher dielectric constant than silicon oxide, and when the buffer layer is present between the first conductive layer and the ferroelectric layer, the interface layer is present between the first conductive layer and the buffer layer,
wherein the non-volatile storage element satisfies at least one of the group consisting of the following A to C:
A) the buffer layer is present between the second conductive layer and the ferroelectric layer and the buffer layer comprises cerium oxide $CeO_x$ wherein x is 1.5-2.0,
B) the oxygen vacancy defect density of the buffer layer is lower than the oxygen vacancy defect density of the ferroelectric layer, and
C) the second conductive layer has a two-layer structure of a barrier metal and a metal nitride, particularly W and TiN, that contacts the buffer layer, and
wherein the first conductive layer comprises a doped semiconductor layer in contact with the interface layer, the doped semiconductor layer comprising a highly doped source region, a highly doped drain region and a doped channel forming region between the highly doped source and drain regions in contact with the interface layer, by which the non-volatile ferroelectric transistor storage element constitutes a one transistor ferroelectric memory cell whose gate insulating layer comprises the ferroelectric layer.

8. The non-volatile storage device according to claim 7, wherein the non-volatile storage element is configured as a ferroelectric element unit or array in a backend wiring region situated above a logic circuit, and is connected to part of the logic circuit.

9. The non-volatile storage device according to claim 7, wherein the ferroelectric layer of the non-volatile storage element is formed over the first conductive layer at a temperature of 400° C. or lower, and the ferroelectric layer exhibits ferroelectricity before the second conductive layer is formed over the ferroelectric layer.

10. The non-volatile storage device according to claim 7, wherein the non-volatile storage device further comprises select elements and/or logic circuits electrically connected to the non-volatile ferroelectric transistor storage elements, by which the non-volatile storage device constitutes non-volatile logic devices, preferably non-volatile SRAM, non-volatile flip-flop devices or non-volatile power gating devices.

11. A non-volatile storage device provided with at least:
   i) an array in which non-volatile ferroelectric capacitor storage elements each comprising at least a first conductive layer, a second conductive layer and a ferroelectric layer composed of a metal oxide between the first conductive layer and the second conductive layer, are arranged in a two-dimensional or three-dimensional manner, and
   ii) a control circuit,
   wherein the non-volatile ferroelectric capacitor storage elements have between the ferroelectric layer and the first conductive layer and/or second conductive layer a buffer layer of a metal oxide having oxygen ion conductivity and containing a metal with a multiple valency,
   wherein the non-volatile ferroelectric capacitor storage element has an interface layer composed of a single-layer film or a multilayer film between the first conductive layer and the ferroelectric layer, the interface layer as a whole having a higher dielectric constant than silicon oxide, and when the buffer layer is present between the first conductive layer and the ferroelectric layer, the interface layer is present between the first conductive layer and the buffer layer,
   wherein the non-volatile storage element satisfies at least one of the group consisting of the following A to C;
   A) the buffer layer is present between the second conductive layer and the ferroelectric layer and the buffer layer comprises cerium oxide $CeO_x$ wherein x is 1.5-2.0, and/or
   B) the oxygen vacancy defect density of the buffer layer is lower than the oxygen vacancy defect density of the ferroelectric layer, and
   C) the second conductive layer has a two-layer structure of a barrier metal and a metal nitride, particularly W and TiN, that contacts the buffer layer, and
   wherein the non-volatile storage device further comprises select elements, preferably select transistors, and/or logic circuits, by which the non-volatile storage device constitutes non-volatile ferroelectric capacitor/transistor memory cells and/or nonvolatile logic devices.

12. The non-volatile storage device according to claim 11, wherein the array is composed of ferroelectric capacitor storage cells comprising at least the non-volatile ferroelectric capacitor storage elements, the ferroelectric capacitor storage cells comprising a 1-transistor 1-capacitor type, 2-transistor 2-capacitor type, 2-transistor 1-capacitor type, 1-transistor 2-capacitor type or ferroelectric tunnel junction (FTJ) type structure.

13. The non-volatile storage device according to claim 11, wherein the non-volatile ferroelectric capacitor storage elements are configured as ferroelectric element units or arrays in a backend wiring region situated above logic circuits and/or SRAM volatile memory arrays, and the ferroelectric element units or arrays are connected to part of the logic circuits or SRAM volatile memory arrays.

14. The non-volatile storage device according to claim 11, wherein the select elements are situated between the non-volatile capacitor storage elements and the logic circuits, where the non-volatile capacitor storage elements are connected to part of the logic circuits through the select elements, by which the non-volatile storage device constitutes non-volatile logic devices, preferably non-volatile flip-flop devices or non-volatile power gating devices.

15. The non-volatile storage device according to claim 11, wherein the ferroelectric layer of the non-volatile storage element is formed over the first conductive layer at a temperature of 400° C. or lower, and the ferroelectric layer exhibits ferroelectricity before the second conductive layer is formed over the ferroelectric layer.

* * * * *